(12) United States Patent
Nagaosa et al.

(10) Patent No.: US 10,141,068 B2
(45) Date of Patent: Nov. 27, 2018

(54) MAGNETIC ELEMENT, SKYRMION MEMORY, SKYRMION MEMORY-DEVICE, SOLID-STATE ELECTRONIC DEVICE, DATA-STORAGE DEVICE, DATA PROCESSING AND COMMUNICATION DEVICE

(71) Applicant: RIKEN, Saitama (JP)

(72) Inventors: Naoto Nagaosa, Tokyo (JP); Wataru Koshibae, Saitama (JP); Junichi Iwasaki, Tokyo (JP); Masashi Kawasaki, Tokyo (JP); Yoshinori Tokura, Tokyo (JP); Yoshio Kaneko, Tokyo (JP)

(73) Assignee: RIKEN, Saitama (JP)

(*) Notice: Subject to any disclaimer, the term of this patent is extended or adjusted under 35 U.S.C. 154(b) by 0 days.

(21) Appl. No.: 15/447,096

(22) Filed: Mar. 1, 2017

(65) Prior Publication Data

US 2017/0178748 A1     Jun. 22, 2017

Related U.S. Application Data

(63) Continuation of application No. PCT/JP2015/073562, filed on Aug. 21, 2015.

(30) Foreign Application Priority Data

Sep. 2, 2014  (JP) ................. 2014-178589

(51) Int. Cl.
| G11C 19/08 | (2006.01) |
| H01L 27/105 | (2006.01) |
| H01L 29/82 | (2006.01) |
| H01L 41/08 | (2006.01) |
| G11C 11/16 | (2006.01) |

(52) U.S. Cl.
CPC ...... G11C 19/0866 (2013.01); G11C 11/1659 (2013.01); G11C 11/1673 (2013.01);
(Continued)

(58) Field of Classification Search
CPC .............. G11C 19/0841; G11C 19/085; G11C 19/0866; G11C 19/0808; G11C 19/08
See application file for complete search history.

(56) References Cited

U.S. PATENT DOCUMENTS

| 6,834,005 B1 | 12/2004 | Parkin |
| 2007/0087454 A1* | 4/2007 | Chen ................. G11C 11/14 438/3 |

(Continued)

FOREIGN PATENT DOCUMENTS

JP     2014-86470 A     5/2014

OTHER PUBLICATIONS

Zhang et al., "Skyrmion-skyrmion and skyrmion-edge repulsions in skrymion-based racetrack memory", Scientific Reports, Jan. 6, 2015.*

(Continued)

*Primary Examiner* — Huan Hoang
*Assistant Examiner* — Jay Radke

(57) ABSTRACT

A magnetic element capable of generating and erasing a skyrmion, including a magnet shaped as a thin layer and including a structure surrounded by a nonmagnetic material; a current path provided surrounding an end region including an end portion of the magnet, on one surface of the magnet; and a skyrmion sensor that detects the generation and erasing of the skyrmion. With Wm being width of the magnet and hm being height of the magnet, a size of the magnet, with the skyrmion of a diameter $\lambda$ being generated, is such that $2\lambda > Wm > \lambda/2$ and $2\lambda > hm > \lambda/2$. With W being width of the end region in a direction parallel to the end portion of the magnet and h being height of the end region in a direction perpendicular to the end portion of the magnet, the end region is such that $\lambda \geq W > \lambda/4$ and $2\lambda > h > \lambda/2$.

19 Claims, 69 Drawing Sheets

(52) U.S. Cl.
CPC .......... *G11C 11/1675* (2013.01); *G11C 19/08* (2013.01); *G11C 19/085* (2013.01); *G11C 19/0808* (2013.01); *G11C 19/0841* (2013.01); *H01L 27/105* (2013.01); *H01L 29/82* (2013.01); *H01L 41/08* (2013.01)

(56) References Cited

U.S. PATENT DOCUMENTS

| | | | |
|---|---|---|---|
| 2015/0185247 A1* | 7/2015 | Eid | G01P 1/04 73/514.31 |
| 2017/0169898 A1 | 6/2017 | Nagaosa et al. | |

OTHER PUBLICATIONS

Yizhou Liu, "Skyrmion Dynamics for Spintronic Devices: A Thesis submitted in partial satisfaction of the requirements for the degree of Master of Science in Electrical Engineering", Jan. 1, 2013, UC Riverside Electronic Theses and Dissertations, pp. 1-27.*

Nagaosa Naoto, Tokura Yoshinori, "Topological properties and dynamics of magnetic skyrmions," Nature Nanotechnology, US, Nature Publishing Group, Dec. 4, 2013, vol. 8, pp. 899-911.

Extended European Search Report issued for counterpart European Patent Application No. 15 837 815.8, issued by the European Patent Office dated Apr. 4, 2018.

N. Romming et al: "Writing and eleting Single Magnetic Skymions", Science, vol. 341, No. 6146, Aug. 9, 2013 (Aug. 9, 2013), pp. 636-639, XP055118966, ISSN: 0036-8075, DOI: 10. 1126 / science. 1240573 * p. 637, middle column, paragraph 1 *.

Youngbin Tchoe et al: "Skyrmion generation by current", Physical Review B, vol. 85, No. 17, May 14, 2012 (May 14, 2012), XP55119150, ISSN: 1098-0121, DOI: 10.1103 / physRevB. 85. 174416 * p. 1, left-hand column, paragraph 1-right-hand column, paragraph 2 *.

* cited by examiner

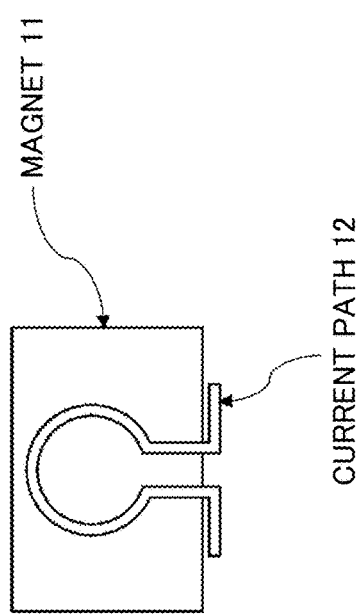

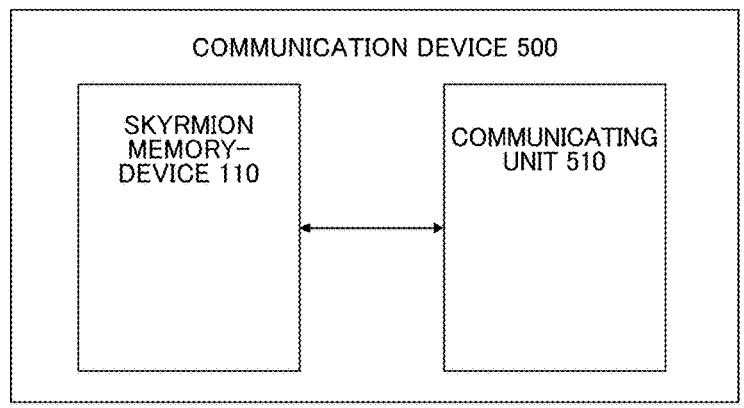
F I G . 56

MAGNETIC ELEMENT, SKYRMION MEMORY, SKYRMION MEMORY-DEVICE, SOLID-STATE ELECTRONIC DEVICE, DATA-STORAGE DEVICE, DATA PROCESSING AND COMMUNICATION DEVICE

The contents of the following Japanese patent applications are incorporated herein by reference:
NO. 2014-178589 filed in JP on Sep. 2, 2014 and
PCT/JP2015/073562 filed on Aug. 21, 2015.

BACKGROUND

Technical Field

The present invention relates to a magnetic element capable of generating, erasing, and detecting skyrmions, a skyrmion memory, a skyrmion memory-device, a solid-state electronic device, a data-storage device, a data processing device, and a data communication device.

Related Art

A magnetic element is known that uses the magnetic moment of a magnet as digital information. This magnetic element includes a nanoscale magnetic structure that functions as an element of a nonvolatile memory that does not require power when holding information. Based on advantages such as ultra-high density resulting from the nanoscale magnetic structure, this magnetic element is expected to be used as a high-capacity information storage medium, and the importance thereof increases when used as a memory device of an electronic device.

Magnetic shift registers have been proposed, mainly by IBM in the US, as other candidates for next-generation magnetic memory devices. A magnetic shift register drives a magnetic domain wall to transfer the magnetic moment arrangement thereof through a current, and reads stored information (see Patent Document 1).

FIG. 57 is a schematic view of the principles of driving a magnetic domain wall with current. The domain wall is a boundary of a magnetic region where the orientations of magnetic moments are phase-inverted. In FIG. 57, the domain walls in a magnetic shift register 1 are shown by solid lines. The magnetic domain walls are driven by causing current with the orientation indicated by the arrows to flow in the magnetic shift register 1. By driving the domain walls, the magnetism caused by the orientation of the magnetic moment positioned above the magnetic sensor 2 changes. This magnetic change is sensed by the magnetic sensor 2, and magnetic information is derived.

However, this type of magnetic shift register 1 requires a large current when moving the magnetic domain walls, and there is a disadvantage that the transfer velocity of the magnetic domain walls is low.

Therefore, the inventors of the present application proposed a skyrmion magnetic element that uses skyrmions generated in the magnet as a storage unit (see Patent Document 2). In this proposal, the inventors of the present application showed that it is possible to drive skyrmions with current.

PRIOR ART DOCUMENTS

Patent Document 1: U.S. Pat. No. 6,834,005
Patent Document 2: Japanese Patent Application Publication No. 2014-86470
Non-Patent Document 1: Nagaosa Naoto, Tokura Yoshinori, "Topological properties and dynamics of magnetic skyrmions," Nature Nanotechnology, US, Nature Publishing Group, Dec. 4, 2013, Vol. 8, pp. 899-911

SUMMARY OF THE INVENTION

Problem to be Solved by the Invention

A skyrmion has an extremely small magnetic structure with a diameter from 1 nm to 500 nm, and since this structure can be held for a long time, there has been increasing expectation of skyrmions being used in memory elements. However, the details of the mechanism for generating, erasing, and detecting skyrmions is not clear.

Therefore, the inventor of the present invention has an objective to clarify the details of the relationship between the generation and erasing states of skyrmions and, based on this, invent a magnetic element and a skyrmion memory that can generate and erase skyrmions with magnetic fields and detect skyrmions, and to provide a skyrmion-memory embedded solid-state electronic device, a data-storage device, a data processing device, and a communication device.

Means for Solving the Problem

According to a first aspect of the present invention, provided is a magnetic element capable of generating and erasing a skyrmion, including a magnet shaped as a thin layer and including a structure surrounded by a nonmagnetic material; a current path provided surrounding an end region including an end portion of the magnet, on one surface of the magnet; and a skyrmion sensor that detects the generation and erasing of the skyrmion. With Wm being a width of the magnet and hm being a height of the magnet, a size of the magnet, with the skyrmion of a diameter $\lambda$ being generated, is such that $2\lambda > Wm > \lambda/2$ and $2\lambda > hm > \lambda/2$. With W being a width of the end region in a direction parallel to the end portion of the magnet and h being a height of the end region in a direction perpendicular to the end portion of the magnet, the end region is such that $\lambda \geq W > \lambda/4$ and $2\lambda > h > \lambda/2$.

According to a second aspect of the present invention, provided is the magnetic element according to the first aspect, wherein the magnetic element has a multilayered structure layered in a thickness direction.

According to a third aspect of the present invention, provided is a skyrmion memory comprising the magnetic element according to the first aspect; a generating unit of the magnetic field that is provided facing the one surface of the magnet and applies a first magnetic field to the magnet from a first direction; a first power supply capable of generating a second magnetic field in the first end region by applying a current to the current path of the magnetic element; and a unit for measuring that is connected to the skyrmion sensor and measures generation and erasing of the skyrmion as change in a resistance value.

According to a fourth aspect of the present invention, provided is a skyrmion memory-device comprising a plurality of the skyrmion memories according to the third aspect configured as a single storage unit memory; an electric line to generate a skyrmion connected to the plurality of skyrmion memories to generate skyrmions of the plurality of skyrmion memories; an electric line to erase a skyrmion connected to the plurality of skyrmion memories to erase skyrmions of the plurality of skyrmion memories; a word line that detects the presence or lack of skyrmions; a field effect transistor that selects a skyrmion memory for the electric line to generate a skyrmion, the electric line to erase a skyrmion, and the word line; and a detection circuit that amplifies a voltage or the current flowing through the word line and detects the presence or lack of skyrmions.

According to a fifth aspect of the present invention, provided is a data processing device comprising a substrate; a field effect transistor formed on the substrate; and a skyrmion memory-device formed above the substrate, wherein the skyrmion memory-device has at least one of the skyrmion memories according to the third aspect mounted thereon.

According to a sixth aspect of the present invention, provided is a skyrmion-memory embedded solid-state electronic device having a skyrmion memory-device, which includes at least one of the skyrmion memories according to the third aspect, and a solid-state electronic device formed in the same chip.

According to a seventh aspect of the present invention, provided is a data-storage device, a data processing device, and a data communication device having a skyrmion memory-device, which includes at least one of the skyrmion memories according to the third aspect, mounted thereon.

BRIEF DESCRIPTION OF THE DRAWINGS

FIG. 39F shows an exemplary shape of the current path 12.

FIG. 56 shows an exemplary configuration of the data communication device 500.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

A chiral magnet is one example of a magnet that can form skyrmions. A chiral magnet is a magnet in which the magnetic moment arrangement when an external magnetic field is not applied has a magnetically ordered phase (spiral magnetic phase) that rotates in a spiral relative to a progression direction of the magnetic moment. By applying an external magnetic field, the spiral magnetic phase transitions through a skyrmion crystal phase in which the skyrmions arranged in a densest crystal lattice are stabilized to a ferromagnetic phase.

Figure 1:
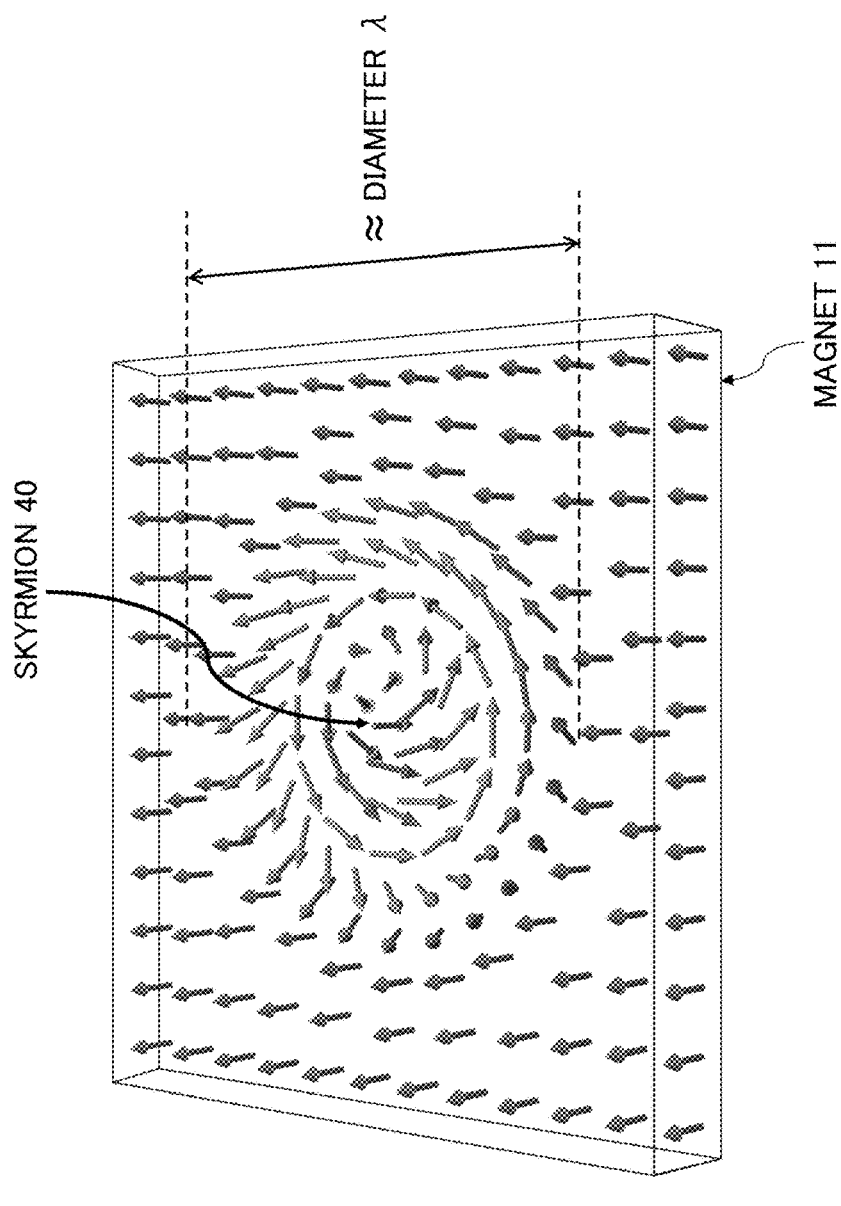
FIG. 1 is a schematic view of an exemplary skyrmion that is a nanoscale magnetic structure formed in a magnet.

FIG. 1 is a schematic view of an exemplary skyrmion 40 that is a nanoscale magnetic structure formed in a magnet 11. In FIG. 1, each arrow indicates the orientation of the magnetic moment in the skyrmion 40. The x axis and the y axis are orthogonal to each other, and the z axis is orthogonal to the xy plane.

The magnet 11 has a plane that is parallel to the xy plane. The magnetic moment having an orientation in every direction arranged in the magnet 11 forms the skyrmion 40. In the present example, the orientation of the magnetic field applied to the magnet 11 is the z direction. In this case, the magnetic moment of the outermost circumference of the skyrmion 40 in the present example is oriented in the +z direction.

The magnetic moment in the skyrmion 40 is arranged in a manner to rotate in a spiral from the outermost circumference toward the inside. Furthermore, the orientation of the magnetic moment changes gradually towards the center of the spiral, from the +z direction to the −z direction, in accordance with the rotation in this spiral.

Between the center and the outermost circumference of the skyrmion 40, the orientation of the magnetic moment spirals continuously. In other words, the skyrmion 40 has a nanoscale magnetic structure in which the magnetic moment has a spiral structure. In a case where the magnet 11 in which the skyrmion 40 is present is a thin board-shaped solid material, each magnetic moment forming the skyrmion 40 is a magnetic moment with the same orientation in the thickness direction of the magnet 11. In other words, the magnetic moment has the same orientation from a front surface to a back surface in a depth direction (z direction) of the board. In the present example, the outermost circumference refers to the circumference of the magnetic moment oriented in the same direction as the external magnetic field shown in FIG. 1.

A skyrmion number Nsk characterizes the skyrmion 40, which is the nanoscale magnetic structure having the spiral structure. The skyrmion number Nsk is expressed by Expression 1 and Expression 2 shown below. In Expression 2, the polar angle Θ (r) between the magnetic moment and the z axis is a continuous function of the distance r from the center of the skyrmion 40. When r is changed from 0 to ∞, Θ(r) is changed from π to 0 or from 0 to π.

$$Nsk = \frac{1}{4\pi} \int\int d^2 rn(r) \cdot \left[\left(\frac{\partial n(r)}{\partial x}\right) \times \left(\frac{\partial n(r)}{\partial y}\right)\right] \quad \text{Expression 1}$$

$$n(r) = (\cos\Phi(\varphi)\sin\Theta(r), \sin\Phi(\varphi)\sin\Theta(r), \cos\Theta(r)) \Phi(\varphi) = m\varphi + \gamma \quad \text{Expression 2}$$

The vector amount n(r) represents the orientation of the magnetic moment of the skyrmion 40 at the position r.

In Expression 2, m is the vorticity and γ is the helicity. From Expression 1 and Expression 2, when r is changed from 0 to ∞ and Θ(r) changes from π to 0, Nsk=−m.

Figure 2:
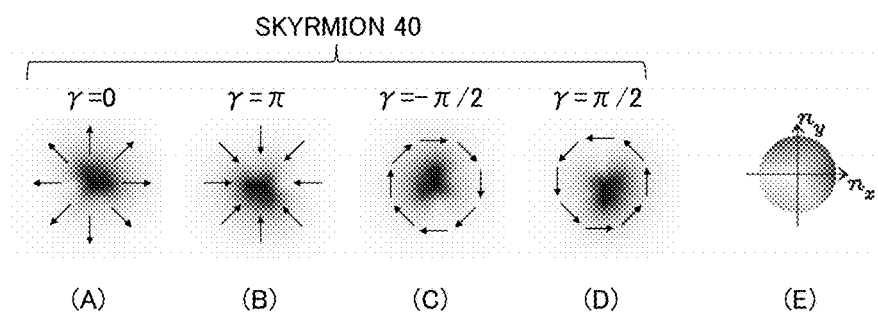
FIG. 2 is a schematic view of skyrmions 40 in which the helicity γ is different.

FIG. 2 is a schematic view of skyrmions 40 in which the helicity γ is different. In particular, FIG. 2 shows an example in a case where the skyrmion number Nsk=−1.

In FIG. 2, (E) shows the coordinates adopted by the magnetic moment n (right-handed system). Since a right-handed system is used, the $n_z$ axis adopts an orientation from behind to in front of the plane of the drawing, relative to the $n_x$ axis and the $n_y$ axis. The relationship between the shading and the orientation of the magnetic moment is shown in (E) of FIG. 2.

In (A) to (D) of FIG. 2, the shading indicates the orientation of the magnetic moment. Each arrow in (A) to (D) of FIG. 2 indicates the magnetic moment at a prescribed distance from the center of the skyrmion 40. The magnetic structures shown in (A) to (D) of FIG. 2 are each in a state defining a skyrmion 40. The region having the lightest shading, such as the outermost circumference in (A) to (D) of FIG. 2, indicates a magnetic moment in a direction from behind to in front of the plane of the drawing. In the drawings, this magnetic moment is expressed with a white color. The region having the darkest shading, such as the center in (A) to (D) of FIG. 2, indicates a magnetic moment in a direction from in front of to behind the plane of the drawing. In the drawings, this magnetic moment is expressed with a black color.

Compared to each magnetic moment in (A) of FIG. 2 ($\gamma=0$), the orientation of each magnetic moment in (B) of FIG. 2 ($\gamma=\pi$) is an orientation obtained by rotating each magnetic moment in (A) of FIG. 2 by 180°. Compared to each magnetic moment in (A) of FIG. 2 ($\gamma=0$), the orientation of each magnetic moment in (C) of FIG. 2 ($\gamma=-\pi/2$) is an orientation obtained by rotating each magnetic moment in (A) of FIG. 2 by −90° (rotating 90° to the right).

Compared to each magnetic moment in (A) of FIG. 2 ($\gamma=0$), the orientation of each magnetic moment in (D) of FIG. 2 ($\gamma=\pi/2$) is an orientation obtained by rotating each magnetic moment in (A) of FIG. 2 by 90° (rotating 90° to the left). The skyrmion 40 with a helicity $\gamma=\pi/2$ shown in (D) of FIG. 2 corresponds to the skyrmion 40 shown in FIG. 1.

Although it appears that the magnetic structures of the four examples shown in (A) to (D) of FIG. 2 are different, these magnetic structures are topologically the same. The skyrmions 40 having the structures shown in (A) to (D) of FIG. 2 exist stably once generated, and work as carriers that serve to transfer information in the magnet 11 to which an external magnetic field has been applied.

Figure 3:
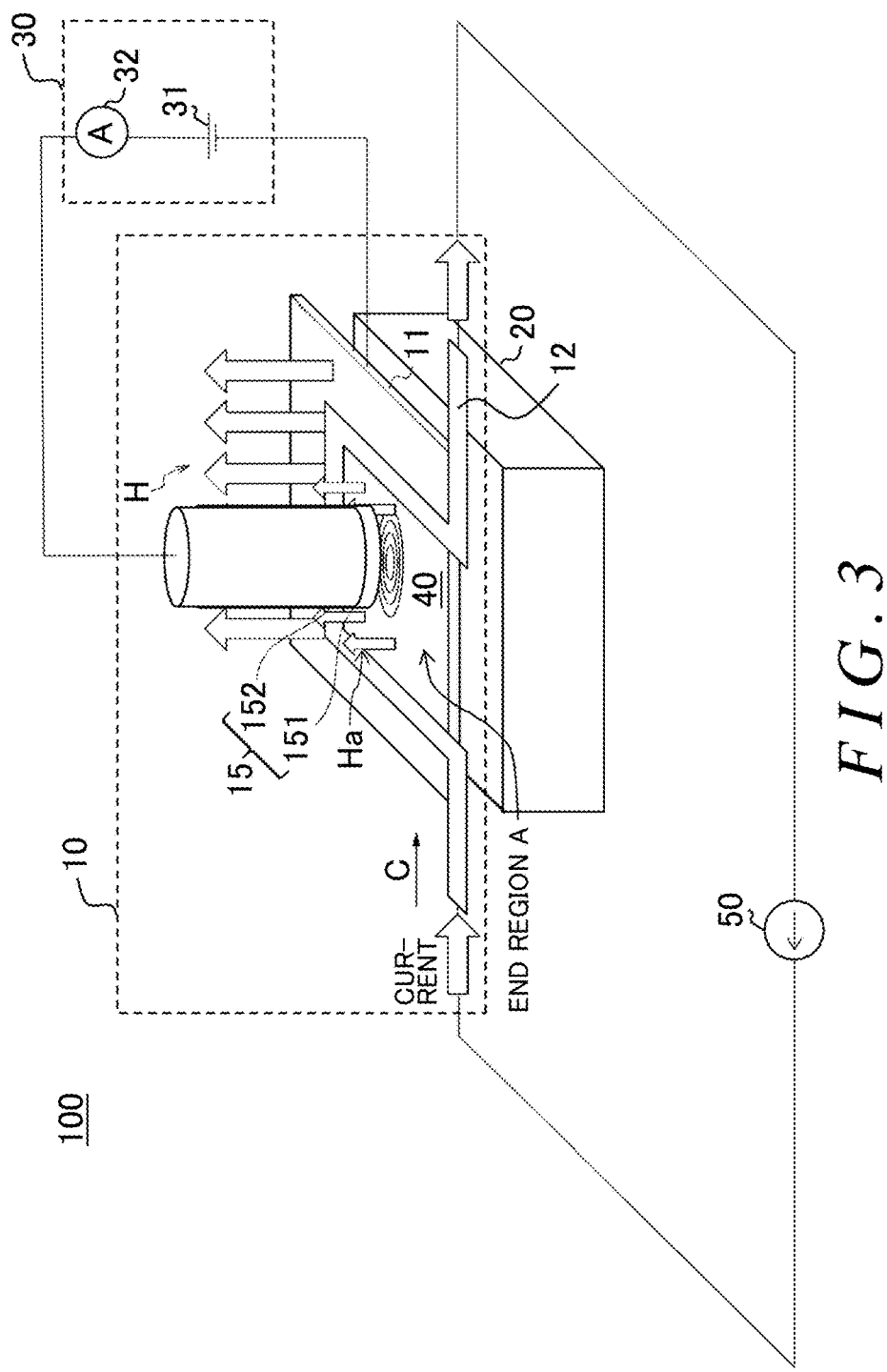
FIG. 3 is a schematic view of a magnetic element that is capable of detecting, generating and erasing skyrmions.

FIG. 3 is a schematic view of a magnetic element 10 that is capable of generating skyrmions 40. The skyrmion memory 100 stores bit information using the skyrmions 40. For example, the presence or lack of a skyrmion 40 in the magnet 11 corresponds to one bit of information. The skyrmion memory 100 in the present example includes the magnetic element 10, a generating unit 20 of the magnetic fields, a unit for measuring 30, and a power supply for coil current 50.

The magnetic element 10 is capable of generating and erasing skyrmions 40. The magnetic element 10 in the present example is an element formed with a thin layer shape and a thickness less than or equal to 500 nm. For example, the magnetic element 10 is formed using a technique such as MBE (Molecular Beam Epitaxy) or sputtering. The magnetic element 10 includes the magnet 11, a current path 12, and a skyrmion sensor 15.

The magnet 11 exhibits at least a skyrmion crystal phase and a ferromagnetic phase, according to an applied magnetic field. The skyrmion crystal phase refers to a material that can generate the skyrmions 40 in the magnet 11. For example, the magnet 11 is a chiral magnet, and is formed by FeGe, MnSi, or the like.

The magnet 11 has a structure surrounded by a nonmagnetic material. The structure surrounded by the nonmagnetic material refers to a structure in which the magnet 11 is surrounded by the nonmagnetic material in all directions. The magnet 11 may be formed with a thin layer shape. The magnet 11 has a thickness that is approximately less than or equal to 10 times the diameter of the skyrmion 40, for example. The diameter of the skyrmion 40 refers to the diameter of the outermost circumference of the skyrmion.

The current path 12 surrounds a region including the end portions of the magnet 11 on one surface of the magnet 11. The current path 12 may be electrically isolated from the magnet 11 using an insulating material or the like. The current path 12 in the present example is a coil current circuit formed with a U shape. The U shape is not limited to having rounded corners, and may be a shape with right-angle corners such as shown in FIG. 3. The current path 12 does not need to form a closed region in the xy plane. The combination of the current path 12 and the end portions need only form a closed region in the front surface of the magnet 11. The current path 12 is connected to the power supply for coil current 50, and a coil current flows therethrough. Due to the coil current flowing through the current path 12, the magnet 11 is made to generate a magnetic field. The current path 12 is formed by a non-magnetic metal material such as Cu, W, Ti, Al, Pt, Au, TiN, or AlSi. In this Specification, the region surrounded by the current path 12 is referred to as a coil region $A_C$. Furthermore, the coil region $A_C$, in a case where the region surrounded by the current path 12 includes an end portion of the magnet 11, is referred to in particular as the end region A. The current path 12 in the present example has a continuous conducting path that, in the xy plane, transects an end portion of the magnet 11 from the nonmagnetic material side to the magnet 11 side at least once and transects the end portion of the magnet 11 from the magnet 11 side to the nonmagnetic material side at least once. In this way, the current path 12 surrounds a region including an end portion of the magnet 11. The magnetic field strength in the end region A is Ha.

The skyrmion sensor 15 functions as a magnetic sensor for detecting skyrmions. The skyrmion sensor 15 detects the generation and erasing of skyrmions 40. For example, the skyrmion sensor 15 is a resistance element with a resistance value that changes according to the presence or lack of a skyrmion 40. The skyrmion sensor 15 in the present example is a tunnel magnetoresistance element (TMR element). The skyrmion sensor 15 has a layered structure formed by the nonmagnetic thin film 151 and the magnetic thin film 152 contacting the front surface of the magnet 11 on one surface of the magnet 11.

The magnetic thin film 152 enters a ferromagnetic phase with a magnetic moment oriented upward, due to the magnetic field with the upward orientation from the magnet 11. The unit for measuring 30 is connected between the magnet 11 and the end portion of the magnetic thin film 152 that is opposite the magnet 11 side. In this way, the resistance value of the skyrmion sensor 15 can be sensed. The skyrmion sensor 15 exhibits the minimum value for the resistance value when there are not any skyrmions 40 in the magnet 11, and this resistance value increases when the skyrmions 40 are present. The resistance value of the skyrmion sensor 15 is determined according to the dependence of the probability of the electron tunnel current of the nonmagnetic thin film 151 on the orientation of the magnetic moment between the magnet 11 and the magnetic thin film 152 that has entered the ferromagnetic state. The high resistance (H) and the low resistance (L) of the skyrmion sensor 15 correspond to the presence or lack of a skyrmion 40, and correspond to information of "1" or "0" stored in an information memory cell.

The generating unit 20 of the magnetic fields generates a magnetic field H and applies this magnetic field H perpendicularly to the magnet 11, in a direction from the back surface to the front surface of the magnet 11. The back surface of the magnet 11 refers to the surface of the magnet 11 on the generating unit 20 of the magnetic fields side. In the present embodiment, only one generating unit 20 of the magnetic fields is used. However, as long as the generating unit 20 of the magnetic fields is able to apply a magnetic field perpendicular to the magnet 11, a plurality of generating units 20 of the magnetic fields may be used. The number and the arrangement of these generating units 20 of the magnetic fields is not limited to this.

The unit for measuring 30 includes a power supply for measurement 31 and an ammeter 32. The power supply for measurement 31 is provided between the magnet 11 and the skyrmion sensor 15. The ammeter 32 measures the current for measurement that flows from the power supply for measurement 31. For example, the ammeter 32 is provided between the power supply for measurement 31 and the skyrmion sensor 15. The unit for measuring 30 can detect the presence or lack of a skyrmion 40 with a small amount of power, by using a skyrmion sensor 15 with high sensitivity.

The power supply for coil current 50 is connected to the current path 12 and causes current to flow in the direction indicated by the arrow C. The current flowing through the current path 12 causes a magnetic field oriented from the front surface to the back surface of the magnet 11 to be generated in the region surrounded by the current path 12. The orientation of the magnetic field induced by the current flowing through the current path 12 is opposite the orientation of the uniform magnetic field H from the generating unit 20 of the magnetic fields, and therefore a weakened magnetic field Ha with an orientation from the back surface to the front surface of the magnet 11 is generated in the coil region $A_C$. As a result, it is possible to generate the skyrmion 40 in the coil region $A_C$. When erasing a skyrmion 40, the power supply for coil current 50 may cause the coil current to flow in a direction opposite the direction used when generating the skyrmion 40. Furthermore, in a case where a plurality of current paths 12 are provided, a plurality of the power supplies for coil current 50 may be provided according to the number of current paths 12. Next, the generation of a skyrmion 40 in a chiral magnet is demonstrated in detail with an embodiment example.

First Embodiment Example

In the first embodiment example, simulation experiment results of the generation of a skyrmion 40 are shown. Expression 3 and Expression 4 below describe the motion of the magnetic moment of the skyrmion 40.

$$dM_r/dt = -\gamma M_r \times B_r^{eff} + (\alpha/M) M_r \times dM_r/dt \qquad \text{Expression 3:}$$

$$H = -J\Sigma M_r \cdot (M_{r+ex} + M_{r+ey}) - D\Sigma(M_r \times M_{r+ex} \cdot e_x + M_r \times M_{r+ey} \cdot e_y) - \Sigma H r \cdot M_r \qquad \text{Expression 4:}$$

Here, as a result of $B_r^{eff} = -(1/(h\Gamma))(\partial H/\partial M_r)$, Expression 3 and Expression 4 are associated with each other. Furthermore, J is the exchange interaction energy, and is a constant that is unique to the material. Yet further, $\Gamma = g\mu B/h$ (>0) is the magnetic rotation ratio, h is the Planck constant, $M_r$ indicates the magnetic moment with a magnitude M, $M_r = M \cdot n(r)$, n(r) is as shown in Expression 2, and × indicates the cross product in Expression 3 and Expression 4 above.

Here, the Hamiltonian H shown in Expression 4 is that of a chiral magnet. Concerning a dipole magnet, a frustrated magnet, and a magnet formed from a layered structure of a magnetic material and a nonmagnetic material, this H expression need only be replaced with a term describing the corresponding magnet.

A dipole magnet is a magnet in which the magnetic dipole interaction is important. A frustrated magnet is a magnet that includes a spatial structure of a magnetic interaction that prefers to be in a magnetically disordered state. A magnet formed from a layered structure of a magnetic material and a nonmagnetic material is a magnet in which the magnetic moment where the magnetic material contacts the nonmagnetic material is modulated by the spin trajectory interaction with the nonmagnetic material.

Figure 4:
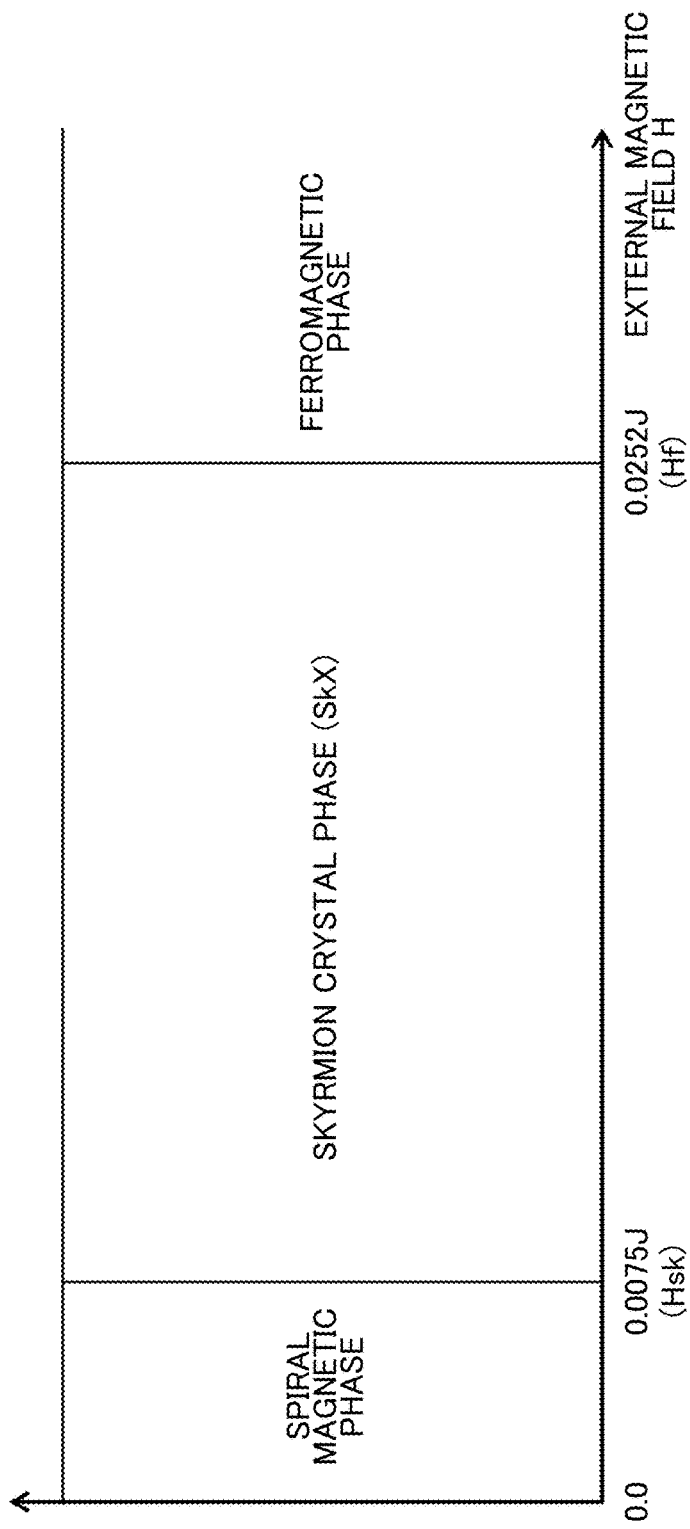
FIG. 4 is a magnetic phase diagram of a chiral magnet.

FIG. 4 is a schematic view of the magnetic field dependency of a chiral magnet magnetic phase. In the present embodiment example, a simulation experiment was performed with the conditions of Hsk and Hf shown in FIG. 4. The chiral magnet has a spiral magnetic phase in a ground state where the magnetic field is zero. When the magnetic field is stronger than the magnetic field strength Hsk, the chiral magnet transitions from the spiral magnetic phase to the skyrmion crystal phase (SkX). Furthermore, the chiral magnet enters the ferromagnetic phase from the skyrmion crystal phase (SkX) at a magnetic field strength greater than or equal to the larger magnetic field strength Hf.

Next, with J indicating the magnitude of the magnetic exchange interaction of this magnet, various physical quantities are described using values standardized by this amount. In this case, the magnet enters the skyrmion crystal phase at a magnetic field strength Hsk=0.0075 J, from the chiral phase having a magnetic structure with a spiral magnetic moment at a low magnetic field. Using J and D, the diameter λ of the skyrmion 40 is shown by Expression 5 below.

$$\lambda = 2\pi\sqrt{2} \cdot \pi J \cdot a/D \qquad \text{Expression 5:}$$

Here, "a" is the lattice constant of the magnet 11, and D is the magnitude of the Dzyaloshinskii-Moriya interaction and is a physical constant that is specific to the substance. Accordingly, the skyrmion diameter λ becomes a substance-specific constant. As shown in Non-Patent Document 1, the skyrmion diameter λ is 70 nm for FeGe and 18 nm for MnSi, for example.

In the chiral magnet used in the present embodiment example, D=0.18 J, the magnetic moment M=1, and the Gilbert damping coefficient α=0.04. In the present example, since D=0.18 J, λ=50a. In a case where the magnet 11 lattice constant a=0.5 nm, the size is such that λ=25 nm. Furthermore, with the chiral magnet used in the present embodiment example, the magnet enters the ferromagnetic phase from the skyrmion crystal at a magnetic field strength of Hf=0.0252 J.

Figure 5:
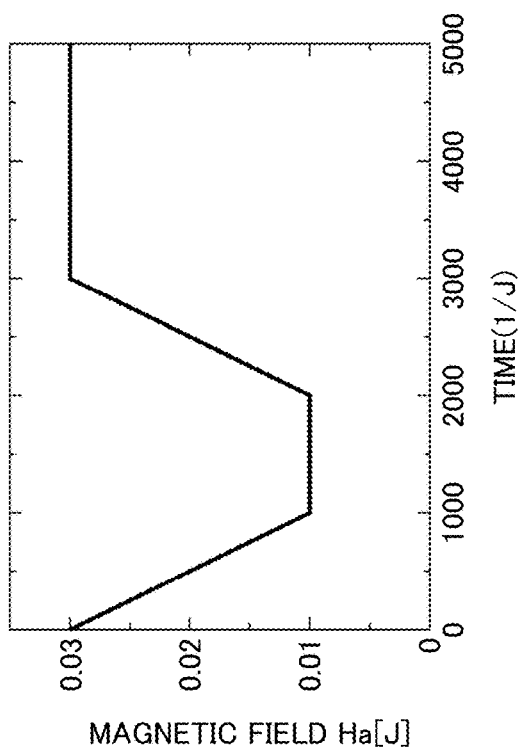
FIG. 5 shows time dependency of a magnetic field in the coil region $A_C$.

FIG. 5 shows the change over time of the magnetic field Ha of the coil region $A_C$ in the simulation experiment. First, the simulation experiment begins from a state where the magnet is in the ferromagnetic phase due to the magnetic field Ha of the coil region $A_C$ having a magnetic field strength greater than Hf. Specifically, the magnetic field generated from the generating unit 20 of the magnetic fields is applied with a magnetic field strength H=0.03 J and an orientation from bottom to top. In this case, the chiral magnet is in the ferromagnetic phase where skyrmions 40 are not present. When the coil current does not flow through the current path 12, a magnetic field strength of H=0.03 J is constantly applied.

Next, the coil current begins to flow through the current path 12 from the power supply for coil current 50. At this time, the magnetic field Ha of the coil region $A_C$ is the sum of the magnetic field generated from the generating unit 20 of the magnetic fields and the magnetic field generated by the coil current. The coil current applies a magnetic field strength of −0.02 J at the time t=1000(1/J), such that the magnetic field Ha of the coil region $A_C$ is larger than 0.01 J. After this, until the time t=2000(1/J), a constant magnetic field strength of Ha=0.01 J is maintained. When the application of the coil current is stopped at the time t=3000(1/J), the magnet returns to the initial state and Ha=0.03 J.

FIGS. 6 to 22 show the simulation results relating to the generation of the skyrmion 40. The simulation in the present example is performed using the conditions and equations used in the description of FIGS. 4 and 5. The size of the magnet 11 in FIGS. 6 to 16 is such that the width Wm=150a and the height hm=100a. The diameter λ of the skyrmion is 50a. Accordingly, the size of the magnet is such that the width Wm=3λ and the height hm=2λ.

Figure 6:
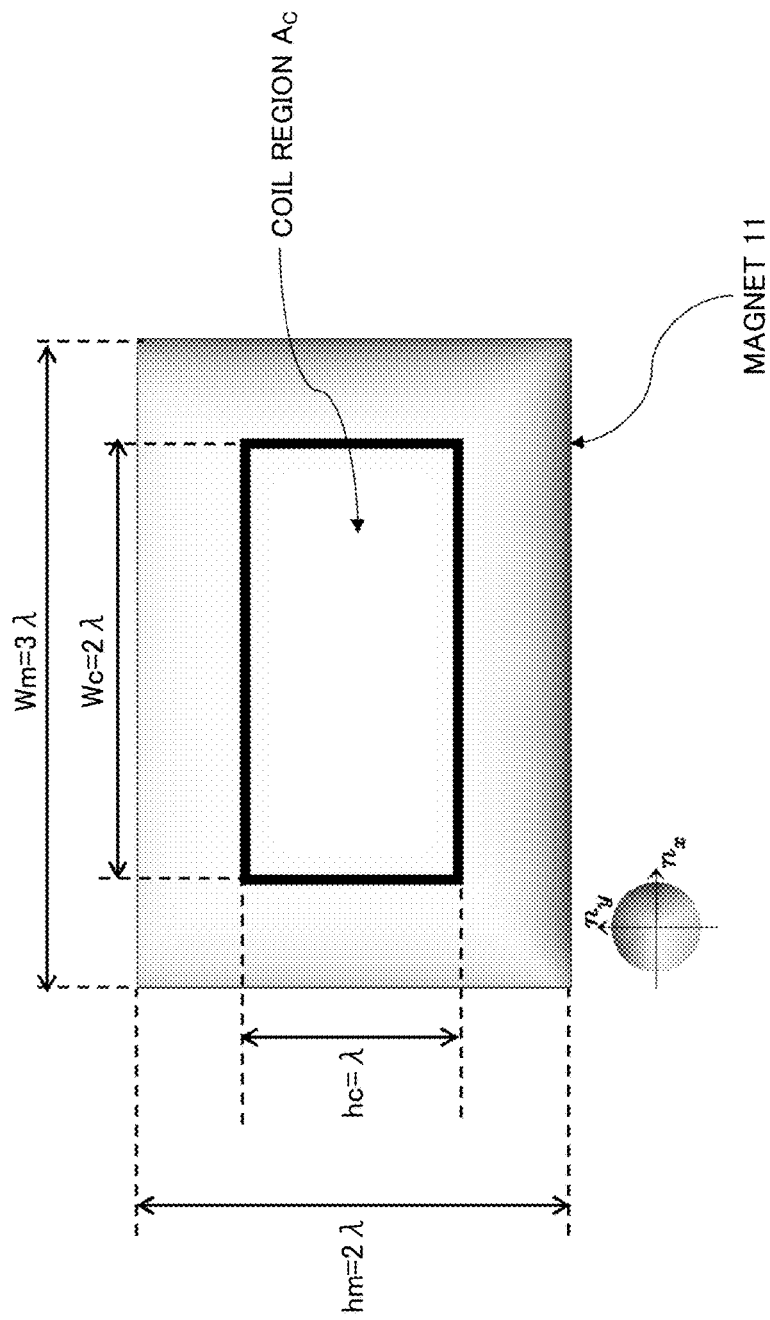
FIG. 6 shows a simulation result of skyrmion generation in a case where the coil region $A_C$ has a rectangular shape.

FIG. 6 shows a simulation result of skyrmion generation in a case where the coil region $A_C$ has a rectangular shape. The sensors such as the skyrmion sensor 15 are not shown in the drawing. The shape of the coil region $A_C$ is formed corresponding to the shape of the current path 12. In the case of FIG. 6, by forming the current path 12 with a rectangular shape, the shape of the coil region $A_C$ formed corresponding to the shape of the current path 12 is also a rectangular shape. The width of the coil region $A_C$ in a direction parallel to the width Wm of the magnet 11 is $W_C$, and the height of the coil region $A_C$ in a direction perpendicular to the width Wm of the magnet 11 is $h_C$. The width $W_C$ of the coil region $A_C$ in the present example is such that $W_C$=100a=2λ, and the height $h_C$ is such that $h_C$=50a=λ. FIG. 6 shows a state of the magnet 11 when the magnetic field Ha of the coil region $A_C$ is reduced from 0.03 J to 0.01 J due to the magnetic field generated by the current path 12. In a case where the coil region $A_C$ surrounded by a rectangle is not in contact with the end portion of the magnet 11, the skyrmions 40 are not generated. This is due to the stable state in which the magnetic moment is uniformly oriented in the z-axis direction in the coil region $A_C$ that does not include the end portion of the magnet 11. Therefore, even when the magnetic field Ha of the coil region $A_C$ is reduced such that Ha is less than or equal to Hsk to enter the skyrmion crystal phase, the skyrmions 40 are not generated. The magnetic element 10 in the present example remains in the ferromagnetic phase.

Figure 7:
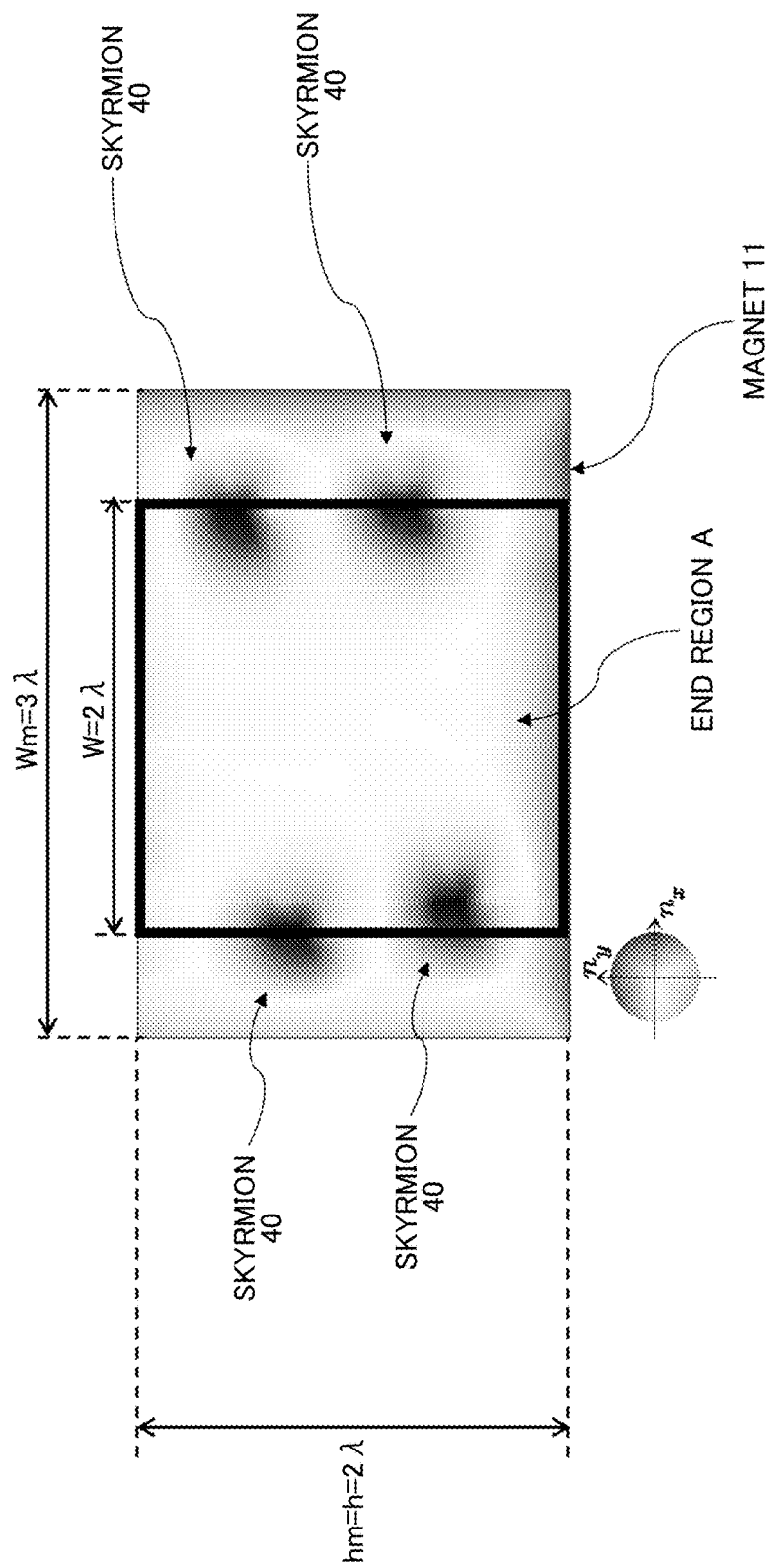
FIG. 7 shows a simulation result in a case where the coil region $A_C$ has the same height as the magnet.

FIG. 7 shows a simulation result in a case where the height of the coil region $A_C$ is the same as the height of the magnet. In the magnet 11 of the present example, the coil region $A_C$ forms the end region A including the end portion of the magnet 11. In this Specification, the width of the end region A in a direction parallel to the end portion of the magnet 11 is W, and the height of the end region A in a direction perpendicular to the end portion of the magnet 11 is h. The width W and height h of the end region A may be formed to be substantially parallel or substantially perpendicular to the end portion of the magnet 11. The width W of the end region A in the present example is such that W=100a=2λ, and the height h is such that h=100a=2λ.

In the end region A, the skyrmion 40 is generated by applying the magnetic field from the current path 12. In this way, it is understood that including the end portion of the magnet 11 is a condition essential for the generation of skyrmions. With reference to FIG. 6, the magnetic moment in the end portion of the magnet 11 is oriented in a different direction than the z-axis direction. The end portion of the magnet forms a dark portion. In this way, compared to the coil region $A_C$ that does not include the end portion, it is easier to generate the skyrmions 40 due to the magnetic field in the z-axis direction applied to the end region A from the current path 12. As a result, as shown in FIG. 7, the skyrmion 40 is generated in a manner to flow from a location at which the end portion of the magnet and the current path 12 intersect.

On the other hand, once a skyrmion 40 is formed with a uniform magnetic moment state, the skyrmion 40 remains stable. There is a large energy wall that exists between the ferromagnetic state with a uniform magnetic moment and a topological state with the skyrmion 40. This is an important characteristic for ensuring the stability of a skyrmion 40 as a carrier for information.

From FIG. 7, it is understood that a plurality of skyrmions 40 are generated when the width W that is the length in the extension direction of the end portion of the end region A includes the top and bottom of the end portion of the magnet 11. When the magnetic element 10 is used as a memory, it is desired that only one skyrmion 40 be generated in a prescribed region.

Figure 8:
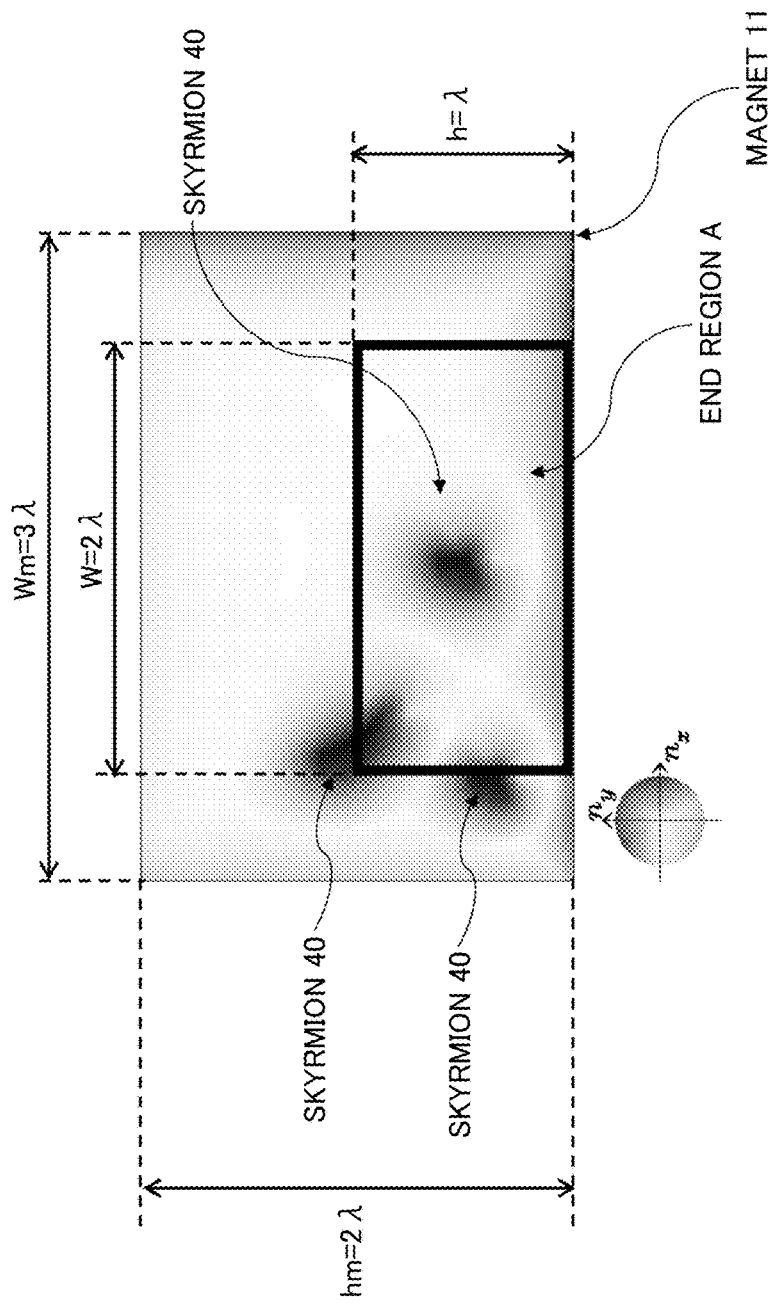
FIG. 8 shows a simulation result in a case where the coil region $A_C$ has half the height of the magnet.

FIG. 8 shows a simulation result of skyrmion generation. The end region A in the present example includes only the bottom side of the end portion of the magnet 11, has a width W=2λ, and has a height h that is half of the height of the magnet 11 (h=hm/2=λ). In this way, one skyrmion 40 is generated in the center of the magnet 11 and two skyrmions 40 are generated in the left end of the magnet 11. Only one side of the end portion of the magnet 11 needs to be included to generate a skyrmion 40.

FIGS. 9 to 13 show simulation results of the generation of skyrmions 40 in cases where the width of the end region A is changed. The dependency of skyrmion generation on the width W was investigated by fixing the height h of the end region A at λ, which is half the height of the magnet 11, and changing the width W. FIGS. 9 to 13 show cases where the width of the end region A becomes smaller, in the stated order.

Figure 9:
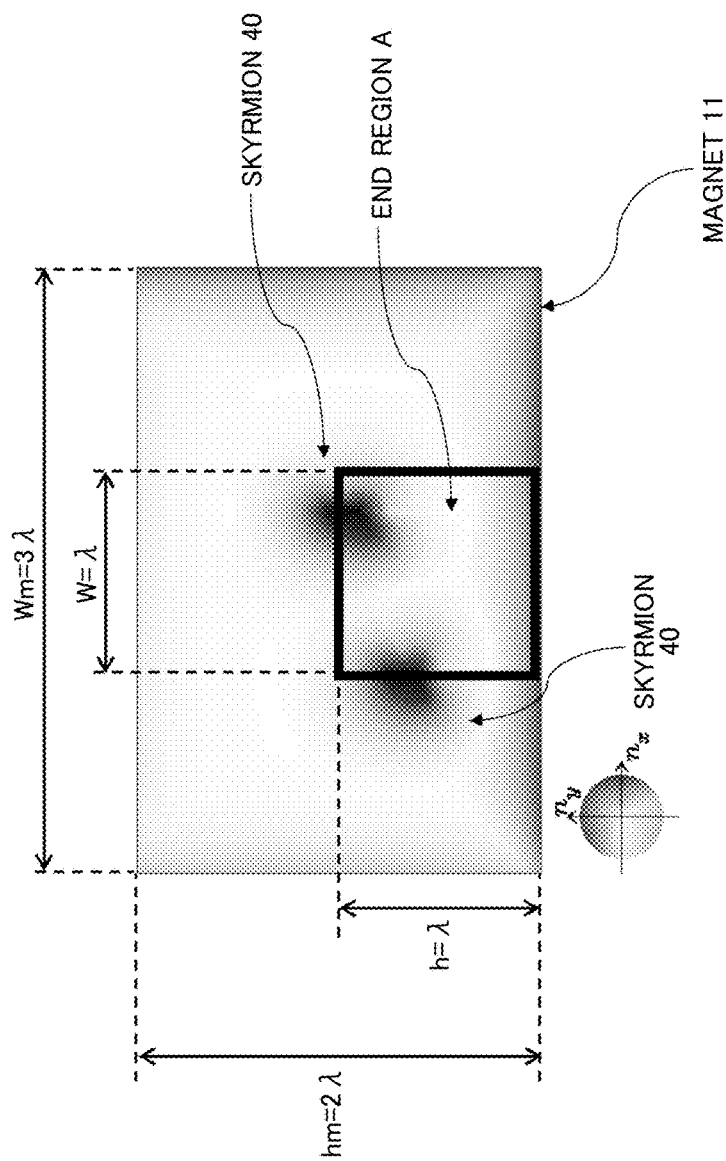
FIG. 9 shows a simulation result of skyrmion generation in a case where the width of the end region is changed.
Figure 10:
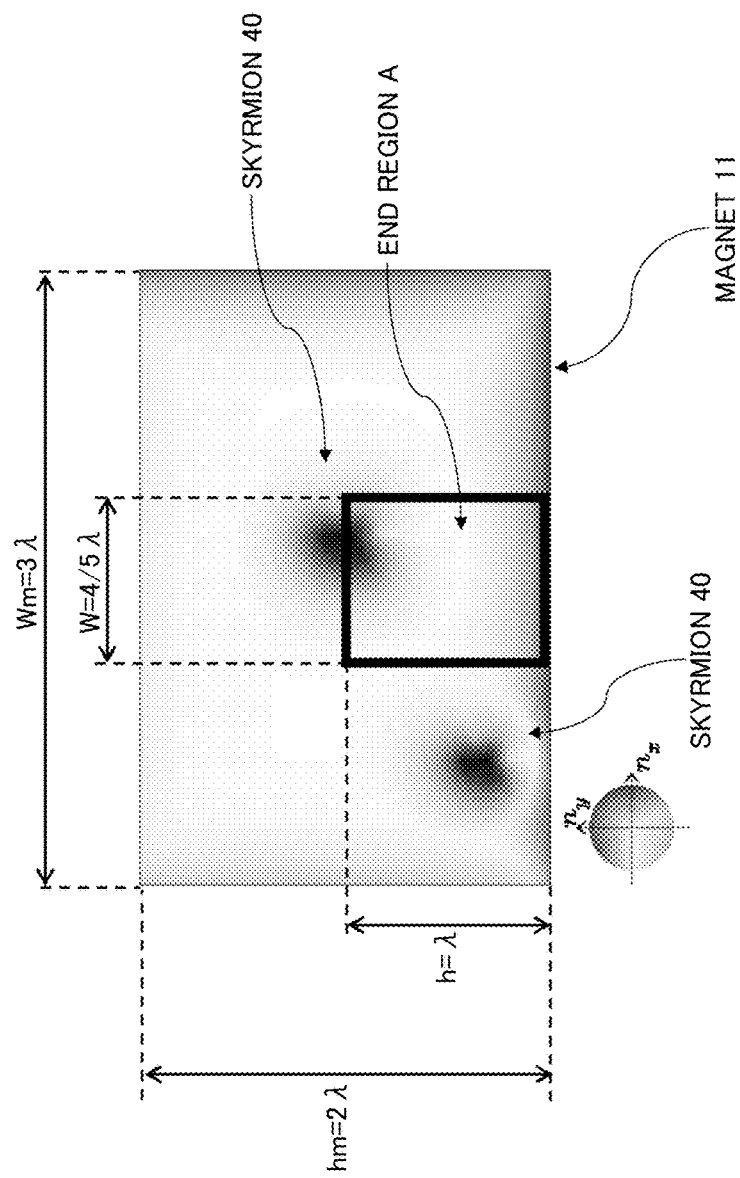
FIG. 10 shows a simulation result of skyrmion generation in a case where the width of the end region is changed.
Figure 11:
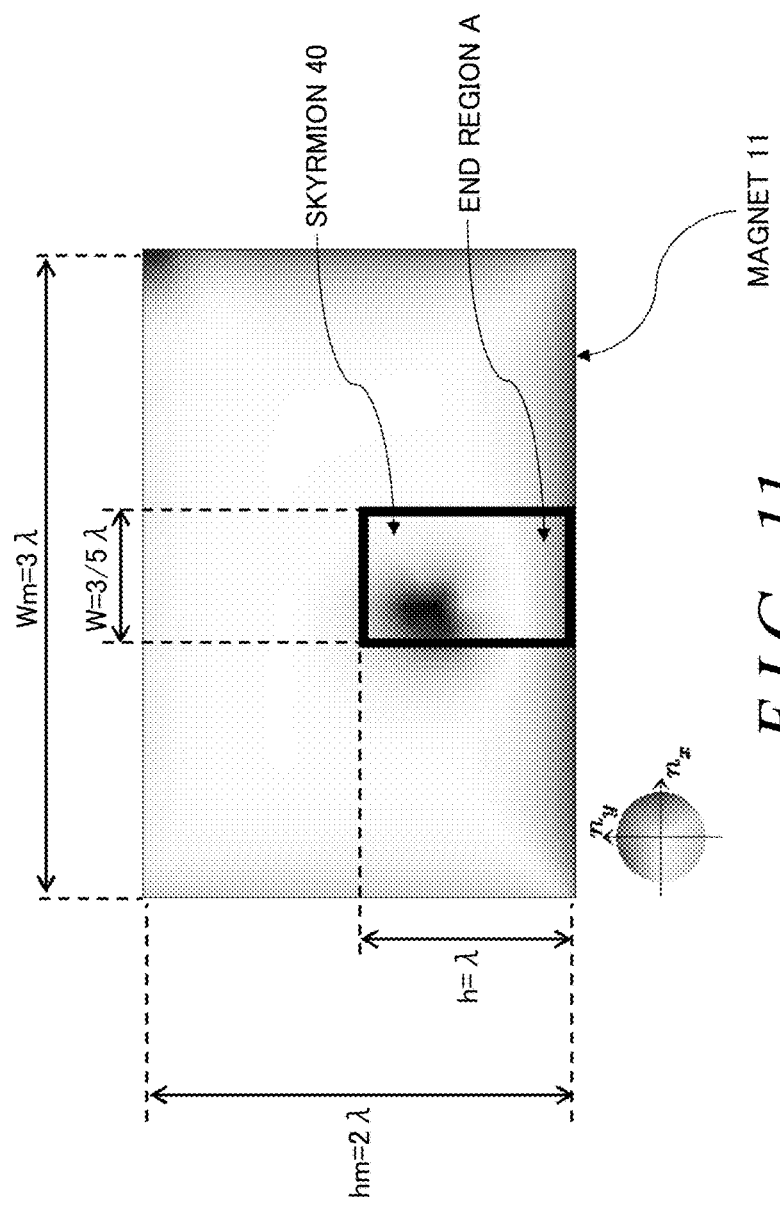
FIG. 11 shows a simulation result of skyrmion generation in a case where the width of the end region is changed.
Figure 12:
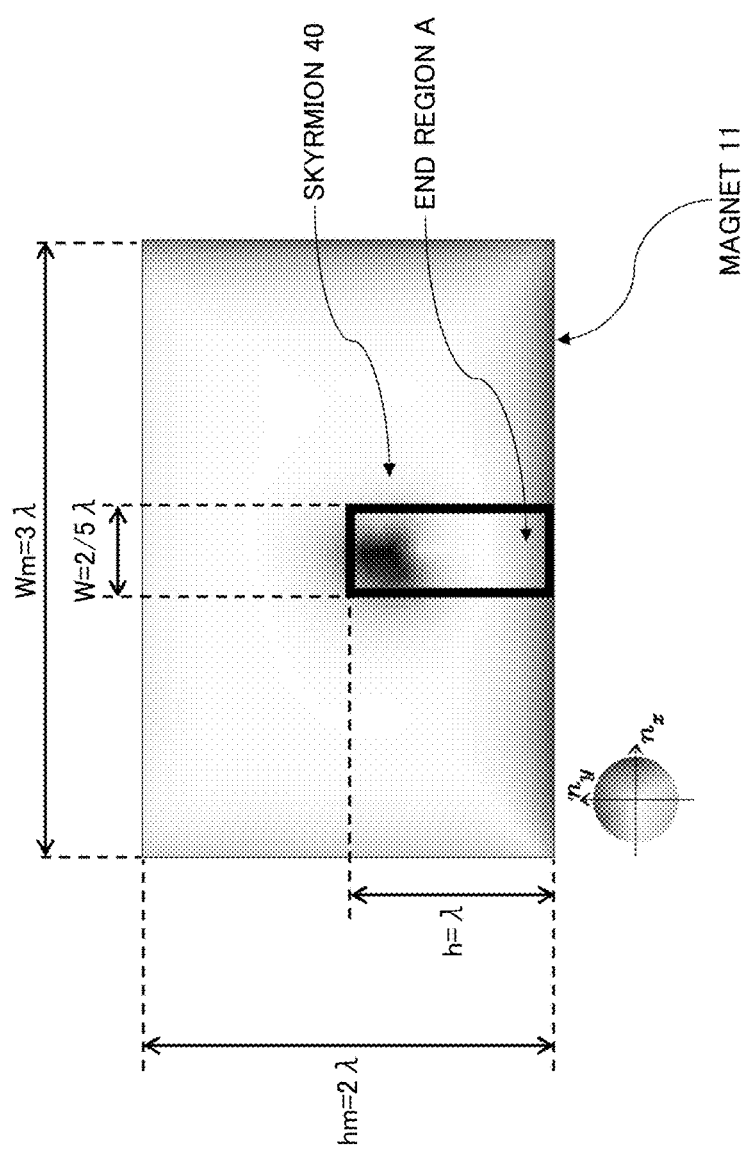
FIG. 12 shows a simulation result of skyrmion generation in a case where the width of the end region is changed.

FIG. 9 shows a simulation result in a case where the width W of the end region A is W=50a=λ. FIG. 10 shows a simulation result in a case where the width W of the end region A is W=40a=⅘λ. FIG. 11 shows a simulation result in a case where the width W of the end region A is W=30a=⅗λ. FIG. 12 shows a simulation result in a case where the width W of the end region A is W=20a=⅖λ. As a result of the simulations in FIGS. 9 and 10, two skyrmions 40 are generated. In FIGS. 11 and 12, there is only one skyrmion 40 present. A condition where the width W=⅗λ to ⅖λ enables generation of one skyrmion.

Figure 13:
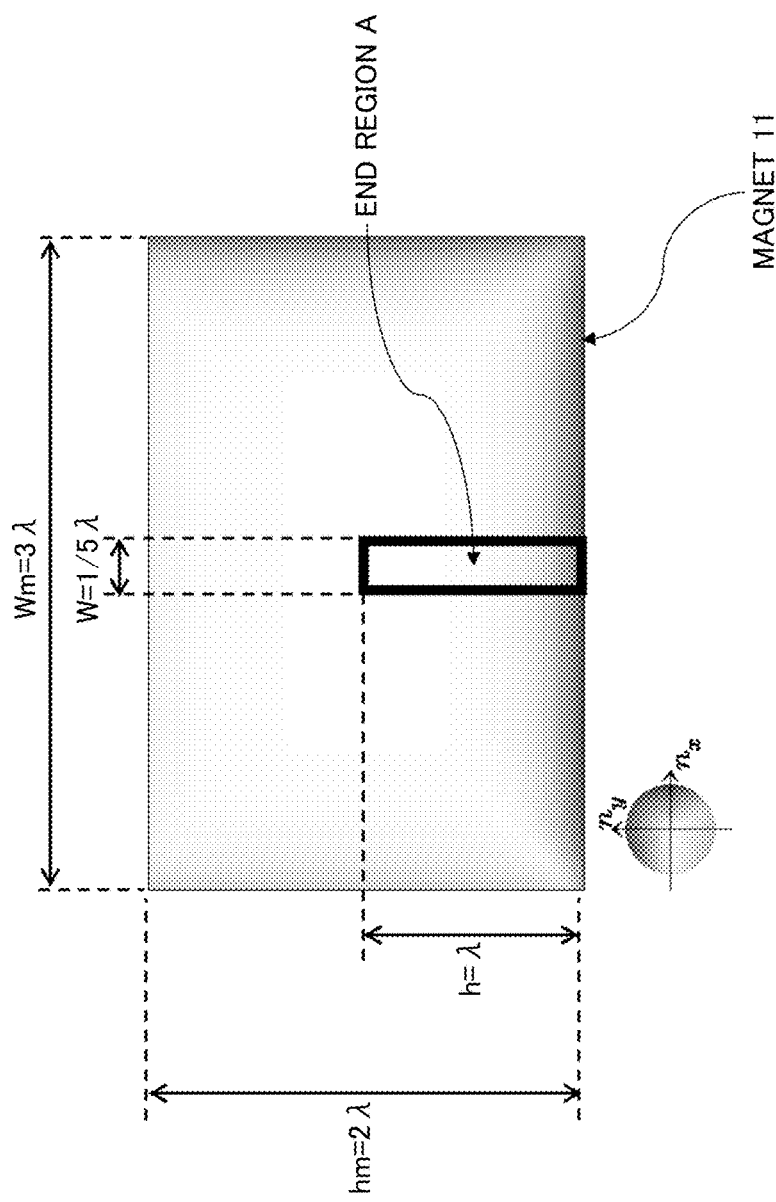
FIG. 13 shows a simulation result in a case where the there is no position with a notch structure and the end region has a width W=λ/5.

FIG. 13 shows a case in which the height h of the end region A is half the height of the magnet 11 (h=hm/2) and the width is further reduced to W=λ/5, and as expected in this case, the skyrmion 40 is not generated.

Figure 14:
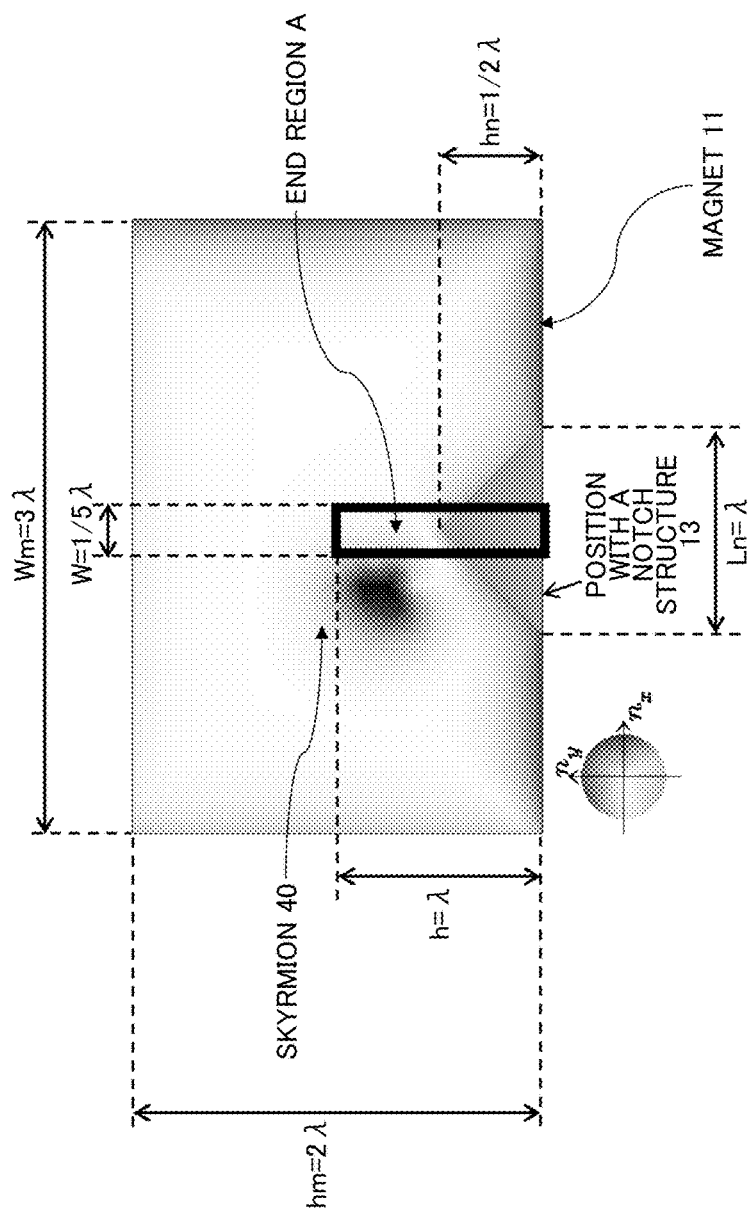
FIG. 14 shows a simulation result in a case where the there is a position with a notch structure and the end region has a width W=λ/5.

FIG. 14 shows a simulation result in a case where a position with a notch structure 13, which is a nonmagnetic material, is included. In this way, it is possible to generate the skyrmion 40. Specifically, by including the position with a notch structure 13 in the end portion of the magnet 11, it is possible to generate the skyrmion 40 even when the height h of the end region A is half the height of the magnet 11 (h=hm/2=λ) and the width W=λ/5. The length Ln of the bottom side of the position with a notch structure 13 is Ln=50a=λ, and the height hn=25a=λ/2. In other words, the position with a notch structure 13 of the magnet 11 effectively acts to generate the skyrmion 40.

Figure 15:
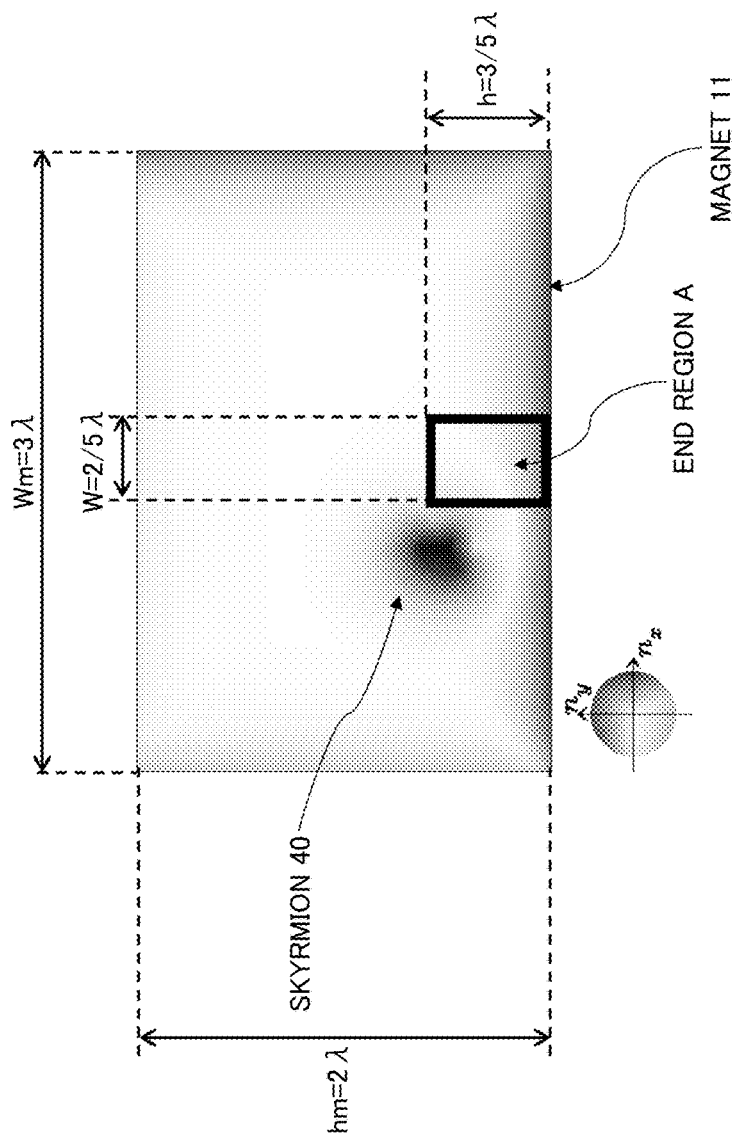
FIG. 15 shows a simulation result in a case where the height of the end region is such that 2λ>h>λ/2.
Figure 16:
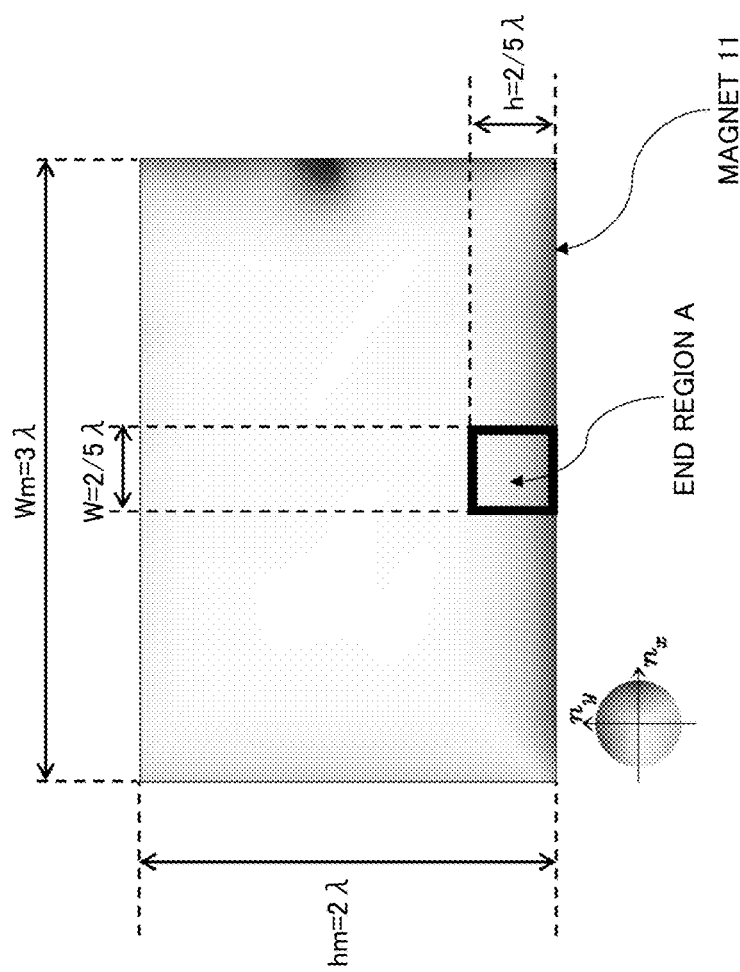
FIG. 16 shows a simulation result in a case where the height of the end region is such that h<λ/2.

FIGS. 15 and 16 are drawings for comparing the height of the end region A to the effect exerted on the generation of the skyrmion 40. FIGS. 15 and 16 are both simulation results in a case where the end region A has a width W=20a=λ·⅖.

FIG. 15 shows the simulation result for a height h=30a=λ·⅗, in a case where the height of the end region A is such that 2λ>h>λ/2. As shown in FIG. 15, one skyrmion 40 is generated if the height of the end region A is in a range of 2λ>h>λ/2.

FIG. 16 shows a simulation result for a height h=20a=λ·⅖, in a case where the height of the end region A is such that h<λ/2. In the present example, the height h of the end region A is even less than in the embodiment example of FIG. 15. As shown in FIG. 16, the skyrmion 40 cannot be generated if the height of the end region A is in a range of h<λ/2.

FIGS. 17 to 22 show simulation results in a case of generating a skyrmion 40. In the present example, the magnet 11 has a square shape with a width and height such that Wm=hm=50a=$\lambda$. The end region A has a width W=20a=$\lambda \cdot 2/5$ and a height h=30a=$\lambda \cdot 3/5$.

Figure 17:
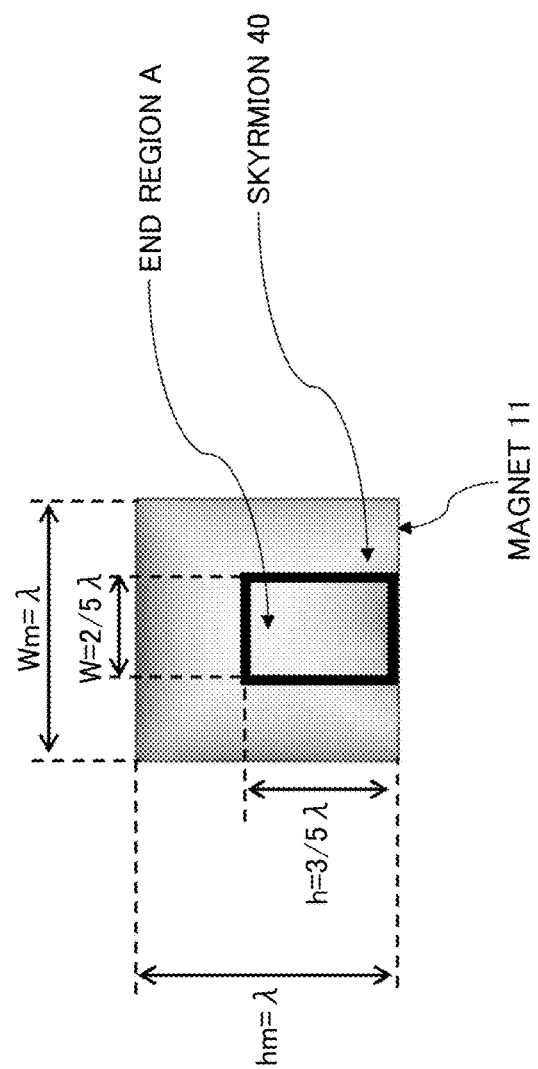
FIG. 17 shows a simulation result in a state where generation of the skyrmion 40 has started at the time t=950(1/J).

FIG. 17 shows a simulation result at the time t=950(1/J). At the time t=950(1/J), an attempt is made to generate the skyrmion 40 from the end portion of the magnet 11. The magnetic moment of the end portion of the magnet 11 is inclined relative to a direction perpendicular to the magnet 11. Accordingly, the end portion of the magnet 11 is an origin point for the generation of the skyrmion 40.

Figure 18:
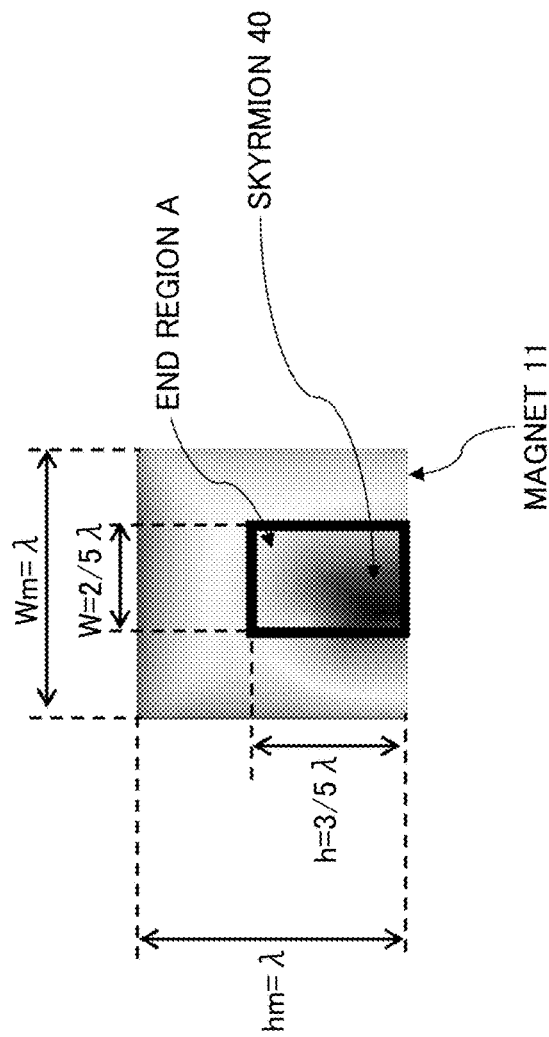
FIG. 18 shows a simulation result in a state where the skyrmion 40 is generated at the time t=1220(1/J).

FIG. 18 shows a simulation result at the time t=1220(1/J). At the time t=1220(1/J), the skyrmion 40 is generated from nearby the location where the end portion of the magnet 11 and the current path intersect.

Figure 19:
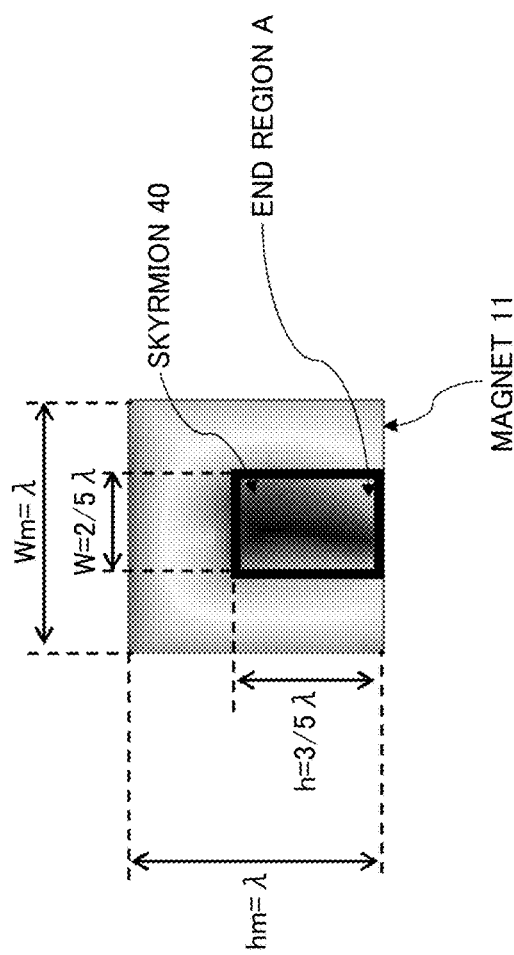
FIG. 19 shows a simulation result in a state where the skyrmion 40 is generated at the time t=1480(1/J).

FIG. 19 shows a simulation result at the time t=1480(1/J). At the time t=1480(1/J), the skyrmion 40 moves to flow toward the central portion of the magnet 11.

Figure 20:
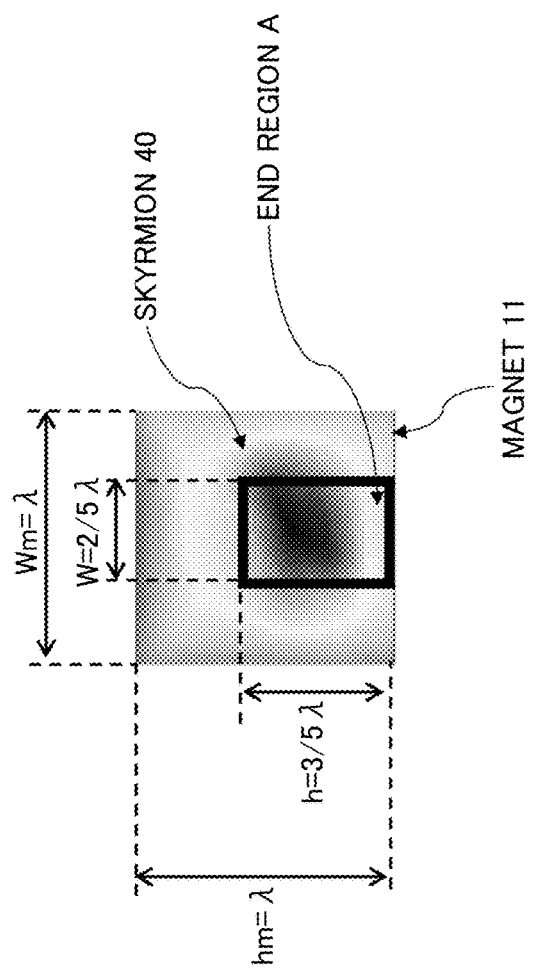
FIG. 20 shows a simulation result in a state where the skyrmion 40 is generated at the time t=2020(1/J).

FIG. 20 shows a simulation result at the time t=2020(1/J). At the time t=2020(1/J), the skyrmion 40 attempts to stabilize in the central portion of the magnet 11. In the present example, the shape of the skyrmion 40 when attempting to stabilize is an ellipse. The ellipse may have a substantially elliptical shape, and is an example of a transient shape until the skyrmion 40 stabilizes.

Figure 21:
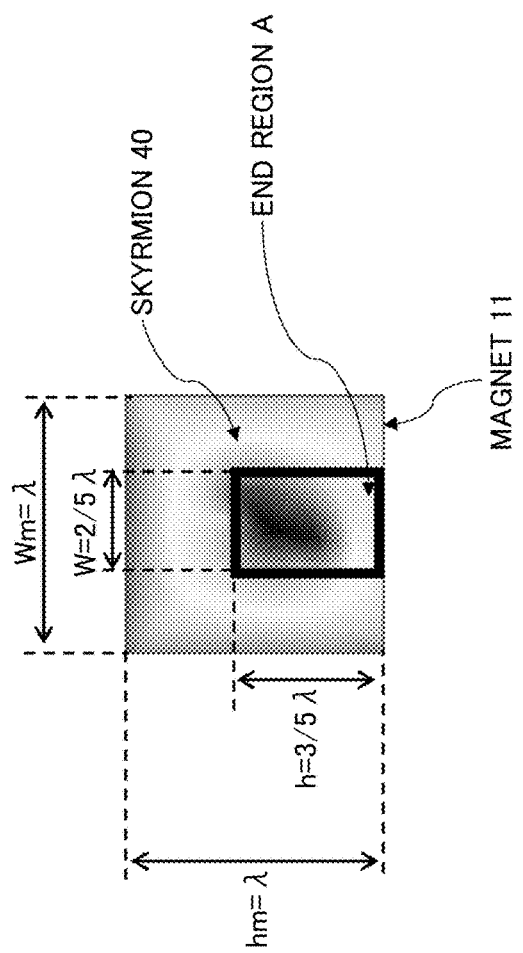
FIG. 21 shows a simulation result in a state where the skyrmion 40 is generated at the time t=2520(1/J).

FIG. 21 shows a simulation result at the time t=2520(1/J). At the time t=2520(1/J) as well, the skyrmion 40 attempts to stabilize in the central portion of the magnet 11. In this example as well, the shape of the skyrmion 40 when attempting to stabilize is an ellipse.

Figure 22:
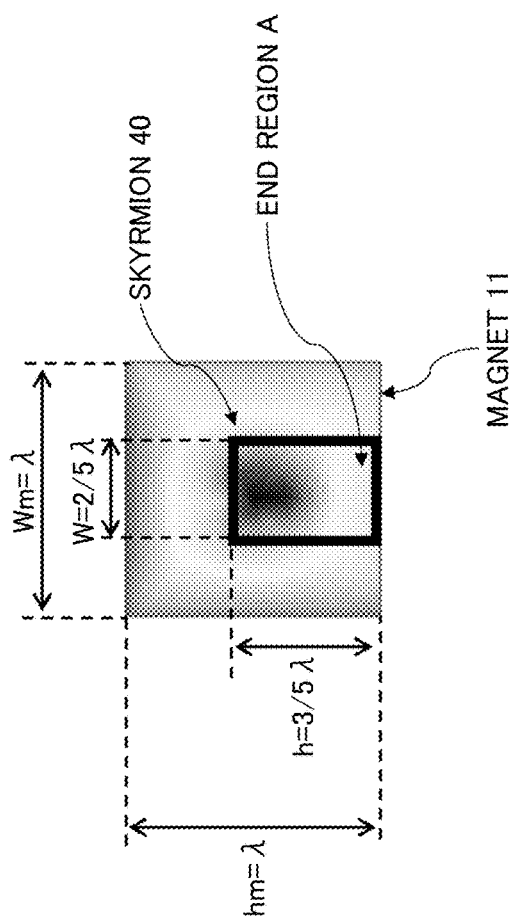
FIG. 22 shows a simulation result in a state where the generation of the skyrmion 40 is completed at the time t=3260(1/J).

FIG. 22 shows a simulation result at the time t=3260(1/J). At the time t=3260(1/J), the skyrmion 40 becomes stable in the central portion of the magnet 11. If the applied time width (pulse width) T of the local magnetic field is greater than or equal to 3000(1/J), a skyrmion 40 is formed.

The following points were discovered from the simulation results of the first embodiment example.

(1) The optimal range of the left-right width W of the end region A is as shown below.

$$\lambda \geq W > \lambda/4$$

(2) The optimal range of the height h of the end region A is as shown below.

$$2\lambda > h > \lambda/2$$

(3) When the position with a notch structure 13 formed from a nonmagnetic material is arranged in the end region A, it is possible to generate the skyrmion even in a range of W≤$\lambda$/4.

(4) The magnetic field Ha of the end region A needed to generate a single skyrmion 40 is Ha<0.015 J.

(5) If the applied time width (pulse width) T of the local magnetic field is greater than or equal to 3000(1/J), a skyrmion 40 can be formed. It is possible to maintain a state in which a single skyrmion 40 is generated for a longer time, without generating a plurality of skyrmions 40.

Second Embodiment Example

In the second embodiment example, simulation results of the erasing of a skyrmion 40 are shown. The erasing of the skyrmion 40 can be understood using basically the same thinking as when generating the skyrmion 40. For example, the motion of the skyrmion 40 when erasing is performed can be described in the same manner as when generating the skyrmion 40, using the equations shown in Expression 3 and Expression 4. The magnet 11 in the present embodiment example is a chiral magnet, in the same manner as in the first embodiment example. FIG. 4 provides a magnetic phase diagram of a chiral magnet. In the present example, the magnet 11 has a square shape with a width and height such that Wm=hm=50a=$\lambda$. The end region A has a width W=20a=$\lambda \cdot 2/5$ and a height h=30a=$\lambda \cdot 3/5$.

Figure 23:
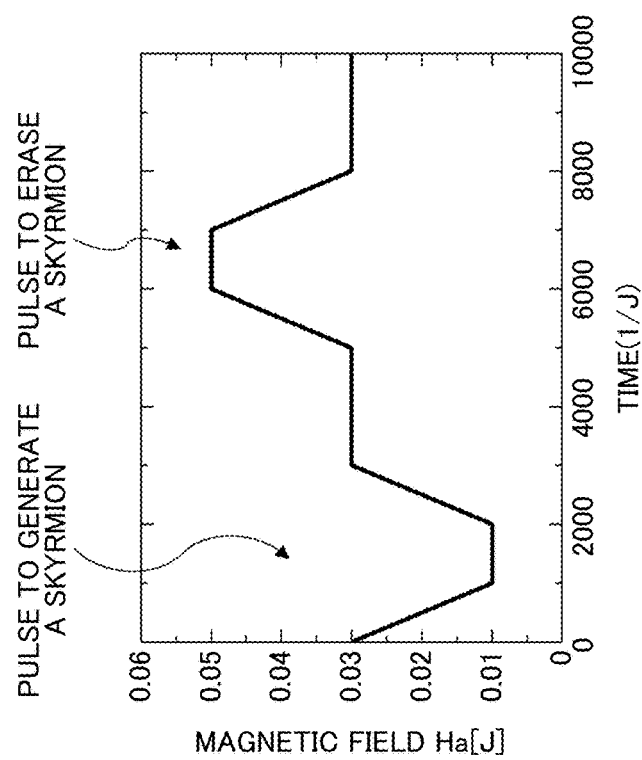
FIG. 23 shows the relationship between time and change of the magnetic field of the end region when performing generation and erasing of a skyrmion in the second embodiment example.
Figure 24:
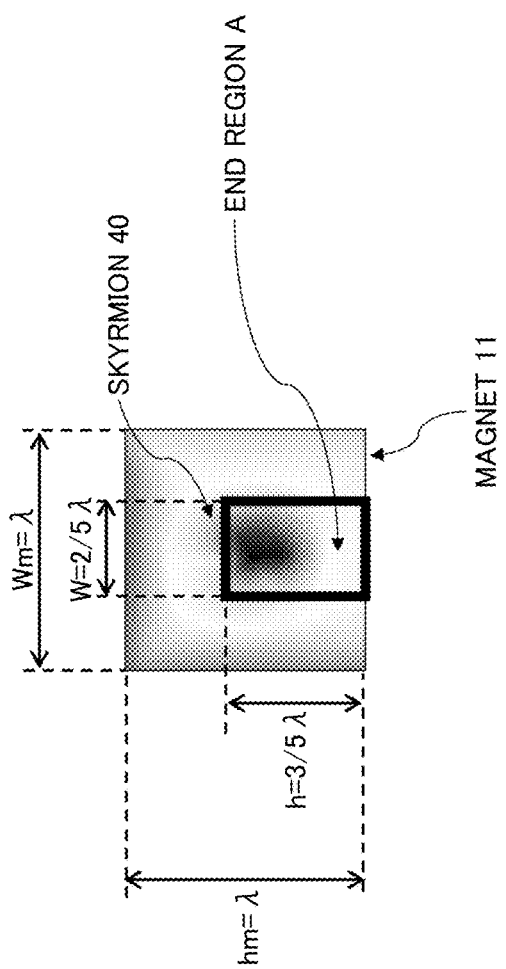
FIG. 24 shows a simulation result in a state where the skyrmion 40 has been generated.
Figure 25:
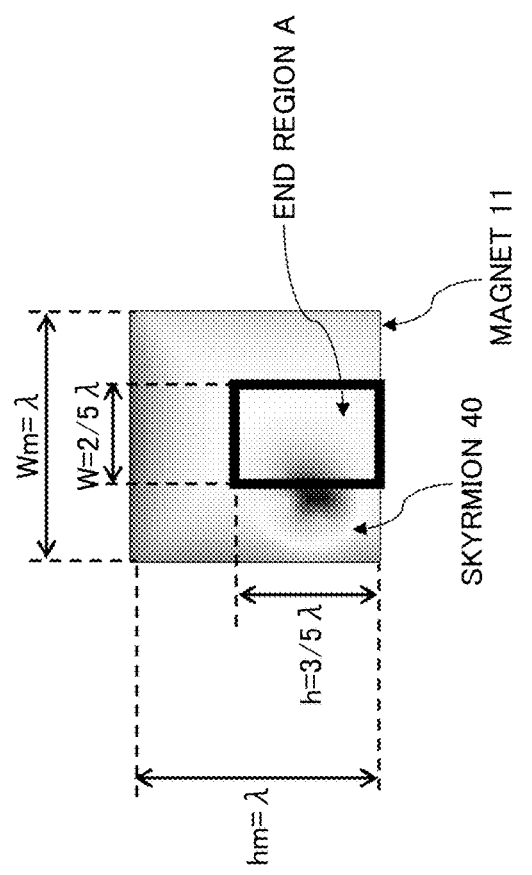
FIG. 25 shows a simulation result in a state where erasing of the skyrmion 40 has been started.
Figure 26:
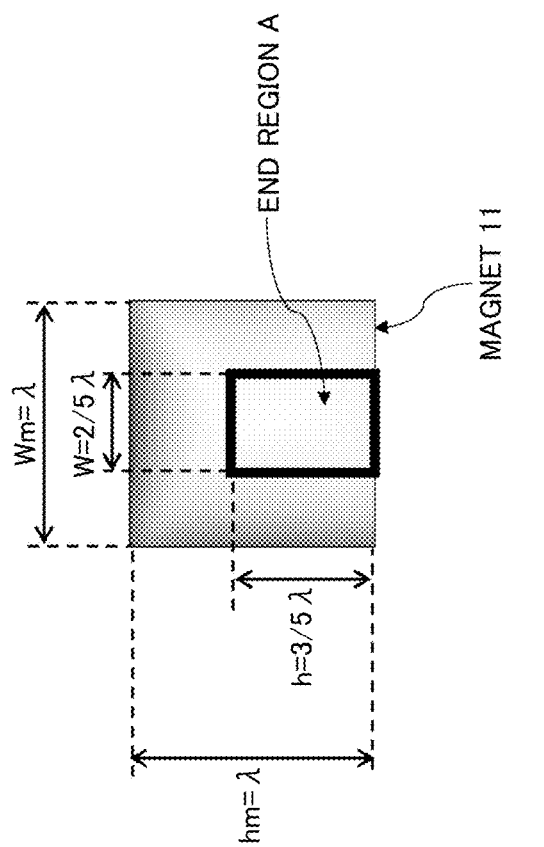
FIG. 26 shows a simulation result in a state where the skyrmion 40 has been erased.

FIG. 23 shows a state of the magnetic field Ha of the end region A when erasing a skyrmion 40. FIGS. 24 to 26 show a state of erasing a skyrmion 40 that has been generated in the magnet 11. FIG. 24 is a simulation result of the state in which the skyrmion 40 has been generated. FIG. 25 is a simulation result of the state in which the skyrmion 40 is in the process of being erased. FIG. 26 is a simulation result of the state in which the skyrmion 40 has been erased.

At the time t=0, the chiral magnet is in the ferromagnetic phase with a magnetic field H=0.03 J. A skyrmion 40 is generated by the magnetic field Ha occurring in the end region A due to the pulse to generate a skyrmion up to the time t=3000(1/J). At this time, as shown in FIG. 24, one skyrmion 40 is generated. The generation conditions in the present example are the same as the conditions described in the first embodiment example.

Next, the magnetic field Ha of the end region A is strengthened in order to erase the skyrmion 40. During the interval from the time t=5000(1/J) to the time t=8000(1/J), the magnetic field strength in the end region A becomes a magnetic field strength of Ha=0.05 J due to the coil current pulse. During this interval, the skyrmion 40 in the left end of the end region A moves as shown in FIG. 25, and moves further toward the bottom portion of the magnet 11.

After this, Ha=0.03 J, the magnet returns to the initial state shown in FIG. 26, and the erasing of the skyrmion 40 is completed. The applied time of the magnetic field pulse for erasing is 3000(1/J). The additional magnetic field strength at this time is +0.02 J. The additional magnetic field strength is the difference of the magnetic field strength relative to the magnetic field Ha=0.03 J in the initial state. In this Specification, the additional magnetic field strength for generation is referred to as a pulse Ha1 to generate a skyrmion and the additional magnetic field strength for erasing is referred to as a pulse Ha2 to erase a skyrmion. The pulse Ha1 to generate a skyrmion and the pulse Ha2 to erase a skyrmion in the present example are amounts having inverted positive/negative signs. In other words, the magnetic element 10 can generate and erase a skyrmion 40 by changing the orientation with which coil currents having the same current strengths flow through the current path 12.

As described above, it is possible to erase a skyrmion 40 that has been generated once by increasing the magnetic field Ha of the end region A. The conditions necessary for erasing at this time are as shown below.

(6) The width Wm of the magnet 11, with the skyrmion 40 of a diameter $\lambda$ being generated, is in the range shown below.

$$2\lambda > Wm > \lambda/2$$

When Wm is too small, the skyrmion 40 cannot be generated.

When Wm is too large, the skyrmion cannot be erased.

Wm should be approximately equal to the diameter $\lambda$ of the skyrmion 40.

(7) The height hm of the magnet 11, with the skyrmion 40 of a diameter $\lambda$ being generated, is in the range shown below.

$$2\lambda > hm > \lambda/2$$

When the height hm of the magnet 11 is too large, the skyrmion 40 escapes from the current path 12 during the erasing of the skyrmion 40, and therefore cannot be erased.

(8) The width W of the end region A obeys (1). In other words, $\lambda \geq W > \lambda/4$ (9) The conditions for the height h of the end region A obey (2). In other words, $2\lambda > h > \lambda/2$. Here, the height is set to $\lambda \cdot 3/5$.

(10) The magnetic field Ha of the end region A needed for the erasing is $Ha \geq 0.04$ J.

Third Embodiment Example

In the third embodiment example, simulation results are shown in a case where a skyrmion 40 is erased. In the present embodiment example, the orientation of the magnetic field caused by the skyrmion pulse Ha2 to erase a skyrmion is the same as the orientation of the magnetic field caused by the skyrmion pulse to generate a skyrmion. The size of the magnet 11 is such that the width $Wm=hm=60a=\lambda \cdot 6/5$. The coil region $A_C$ is set to be the end region A including the end portion of the magnet 11. The width W of the end region A is $20a=\lambda \cdot 2/5$ and the height h is $25a=\lambda/2$. The diameter $\lambda$ of the skyrmion 40 is 50a.

The current path 12 is formed at a position shifted to the left side of the center on the bottom side of the magnet 11. The space d between the left end of the end region A and the magnet 11 is $10a=\lambda/5$. In the present embodiment, the current path 12 only needs to be formed at a position shifted to the left or to the right from the center on the bottom side of the magnet 11. The current path 12 may be at a position shifted to the right side of the magnet 11. The space d is defined as the width of the space between the end portion of the magnet 11 included in the end region A and another end portion that is closest thereto among the other adjacent end portions.

Figure 27:
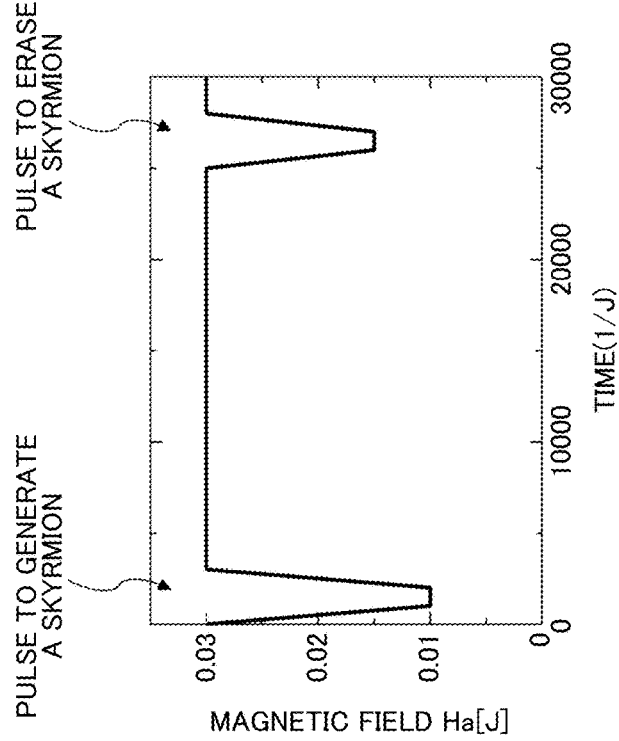
FIG. 27 shows the relationship between time and the magnetic field Ha of the end region when generating and erasing a skyrmion 40.

FIG. 27 shows the relationship between time and the magnetic field Ha of the end region A when performing the generation and erasing of a skyrmion 40. The coil current pulse for generation is applied to the current path 12, and then the coil current pulse for erasing is applied to the current path 12. The pulse Ha1 to generate a skyrmion and the pulse Ha2 to erase a skyrmion are each applied to the end region. During the interval from the time $t=0(1/J)$ to the time $t=30000(1/J)$, the pulse Ha1 to generate a skyrmion and the pulse Ha2 to erase a skyrmion are applied once each. In the present example, the end region A is shifted to the left side of the magnet 11 and the skyrmion 40 is erased. The pulse Ha2 to erase a skyrmion may have the same orientation as the pulse Ha1 to generate a skyrmion. When the pulse Ha2 to erase a skyrmion has a value of 0.015 J, which is less than the value of 0.03 J for the ferromagnetic phase, if the end region A is shifted to the left side of the magnet 11, it is possible to erase the generated skyrmion 40. It should be noted that when the end region A is shifted too far toward the left end of the magnet 11, the skyrmion 40 cannot be generated even when the pulse Ha1 to generate a skyrmion is applied first.

Figure 28:
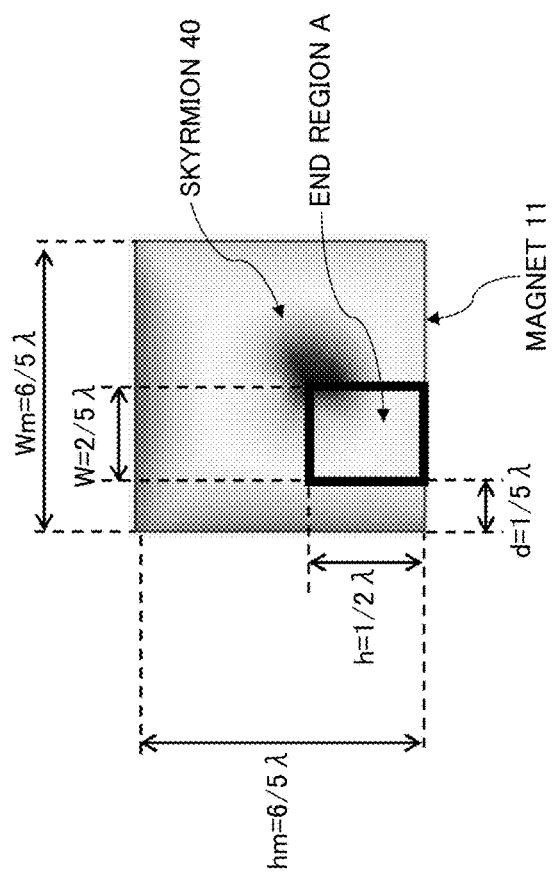
FIG. 28 shows a simulation result in a state where the skyrmion 40 has been generated at the time t=16000(1/J).

FIG. 28 shows the simulation result in a state where the skyrmion 40 has been generated at the time $t=16000(1/J)$. At the time $t=16000(1/J)$, the generated skyrmion 40 exists stably.

Figure 29:
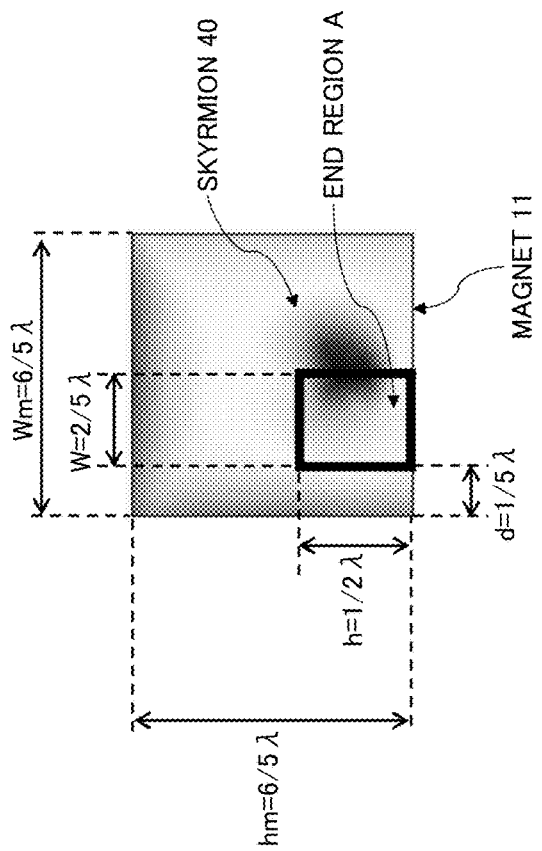
FIG. 29 shows a simulation result in a state where erasing of the skyrmion 40 has been started at the time t=26300(1/J).

FIG. 29 shows the simulation result in a state where erasing of the skyrmion 40 has started at the time $t=26300(1/J)$. At the time $t=26300(1/J)$, the pulse Ha2 to erase a skyrmion is applied to the end region A and a pulling force F acts on the skyrmion 40 from the current path 12, but due to the Magnus force, the skyrmion 40 moves perpendicular to the pulling force F. In this way, the skyrmion 40 moves along the right side of the end region A.

Figure 30:
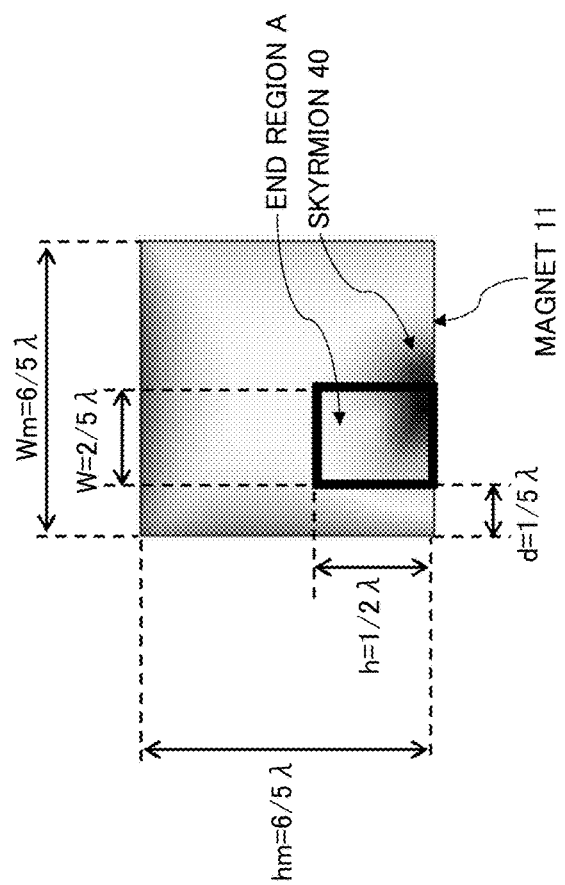
FIG. 30 shows a simulation result in a state where the skyrmion 40 is erased at the time t=26850(1/J).

FIG. 30 shows the simulation result in a state where the skyrmion 40 is erased at the time $t=26850(1/J)$. At the time $t=26850(1/J)$, the skyrmion 40 is absorbed at the end portion of the magnet 11.

The width Wm and the height hm of the magnet 11 in the third embodiment example must be greater than the diameter $\lambda$ of the skyrmion 40. In the present embodiment example, the width Wm and the height hm of the magnet 11 are each 60a. This is in order to ensure an empty space in which the generated skyrmion 40 moves in the center of the magnet 11. If the end region A is shifted to the right side of the magnet 11, the skyrmion 40 flows along the right side of the end region A from the top portion. The end portion on the right side of the magnet 11 absorbs and erases the skyrmion 40.

The conditions necessary for erasing of the skyrmion 40 in the third embodiment example are as shown below.

(11) In a case where the pulse Ha2 to erase a skyrmion of the skyrmion 40 has the same orientation as the pulse Ha1 to generate a skyrmion, the width Wm of the magnet 11, with the skyrmion 40 of a diameter $\lambda$ being generated, is such that $2\lambda > Wm > \lambda$. Similarly, the height hm of the magnet 11 is such that $2\lambda > hm > \lambda$.

(12) In a case where the skyrmion pulse Ha2 to erase a skyrmion has the same orientation as the pulse Ha1 to generate a skyrmion, the width of the end region A is $0.4\lambda$. The height h is $\lambda/2$. The space d between the left end of the end region A and the magnet 11 is such that $0.4 > d \geq \lambda/5$. When d is less than $0.2\lambda$, the skyrmion 40 cannot be generated with the pulse Ha1 to generate a skyrmion.

(13) The magnetic field strength Ha of the end region A for skyrmion generation obeys the generation condition (4) described above. In other words, $Ha < 0.015$ J.

(14) The magnetic field strength Ha of the end region A for the pulse Ha2 to erase a skyrmion is such that $Ha < 0.02$ J.

Fourth Embodiment Example

In the fourth embodiment example, simulation results are shown for skyrmion erasing in a case where the end region A includes two regions that are an end region for generation A1 and an end region for erasing A2. The size of the magnet 11 is such that the width $Wm=hm=50a=\lambda$. The width W1 of the end region for generation A1 is such that $W1=20a=\lambda \cdot 2/5$. The height h1 of the end region for generation A1 is such that $h1=30a=\lambda \cdot 3/5$. Furthermore, the width W2 of the end region for erasing A2 is such that $W2=20a=\lambda \cdot 2/5$. The height h2 of the end region for erasing A2 is equal to W2.

Figure 31:
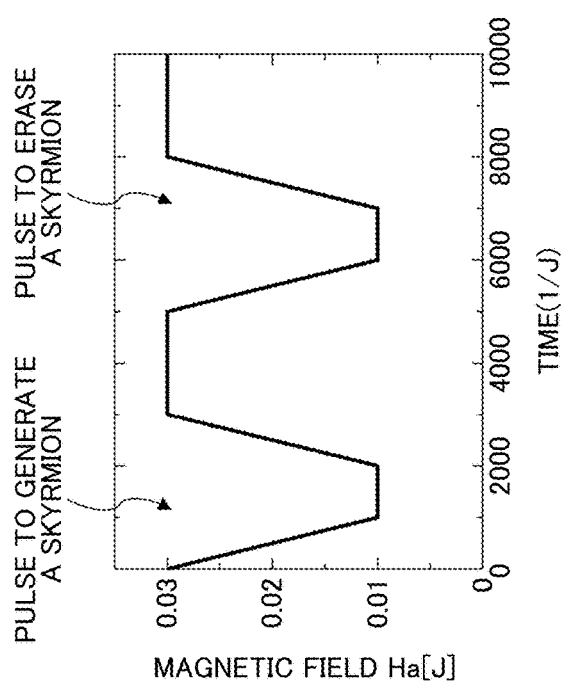
FIG. 31 shows the relationship between time and the magnetic field Ha of the end region when generating and erasing a skyrmion 40.

FIG. 31 shows the relationship between time and the magnetic fields Ha of the end region for generation A1 and the end region for erasing A2, when performing generation and erasing of a skyrmion 40. The coil current pulse for generation is applied to the current path 12 for generation, and then the coil current pulse for erasing is applied to the current path 12 for erasing. The pulse Ha1 to generate a skyrmion is applied to the end region for generation A1 and the pulse Ha2 to erase a skyrmion is applied to the end region for erasing A2. The pulse Ha1 to generate a skyrmion and the pulse Ha2 to erase a skyrmion in the present example have the same orientation and the same magnitude. The end region for generation A1 has a magnetic field Ha of 0.01 J due to the pulse Ha1 to generate a skyrmion. The end region for erasing A2 also has a magnetic field Ha of 0.01 J due to the pulse Ha2 to erase a skyrmion. In this way, the generation and erasing of the skyrmion 40 are possible. In the present example, the pulse Ha1 to generate a skyrmion and the pulse Ha2 to erase a skyrmion are each applied once during the interval from the time t=0(1/J) to the time t=10000(1/J).

Figure 32:
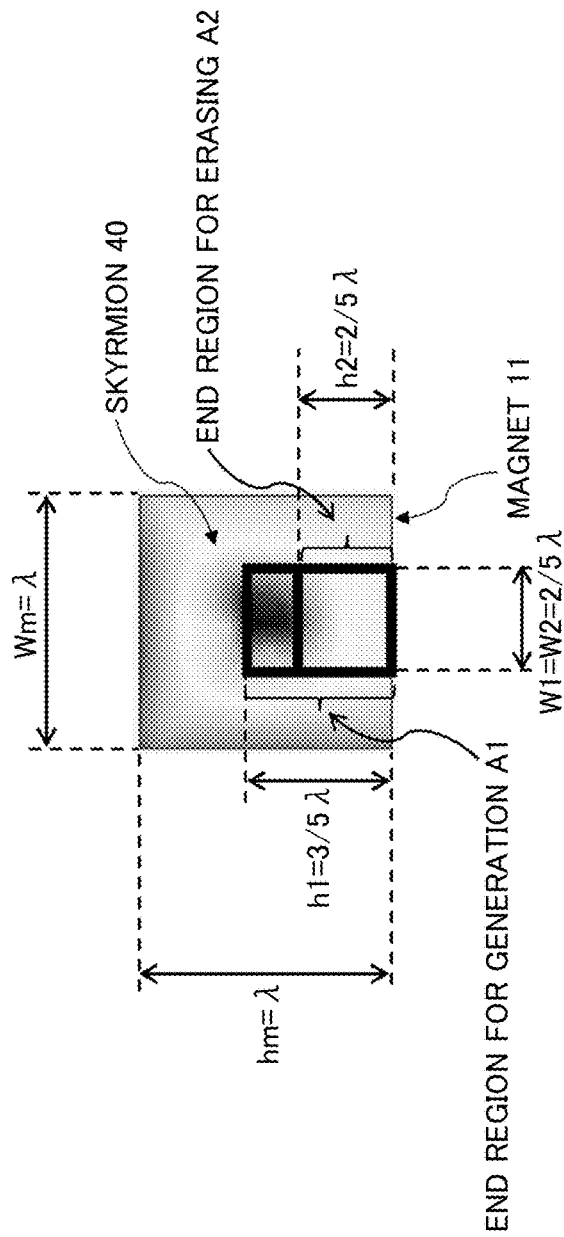
FIG. 32 shows a simulation result in a state where the skyrmion 40 has been generated at the time t=4380(1/J).
Figure 33:
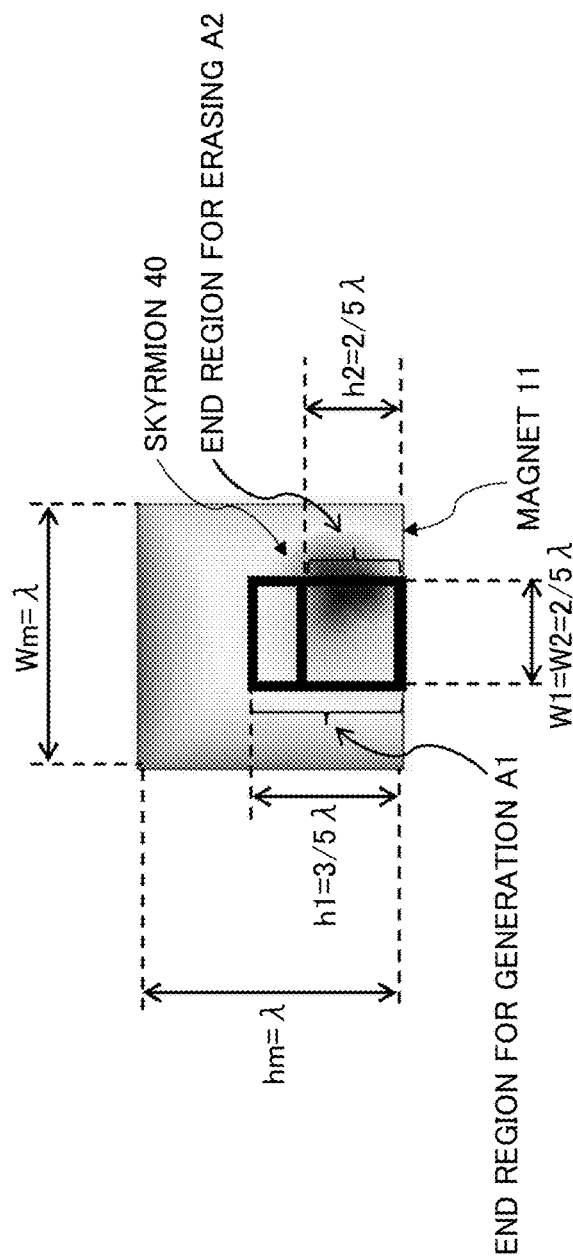
FIG. 33 shows a simulation result in a state where erasing of the skyrmion 40 has been started at the time t=6040(1/J).
Figure 34:
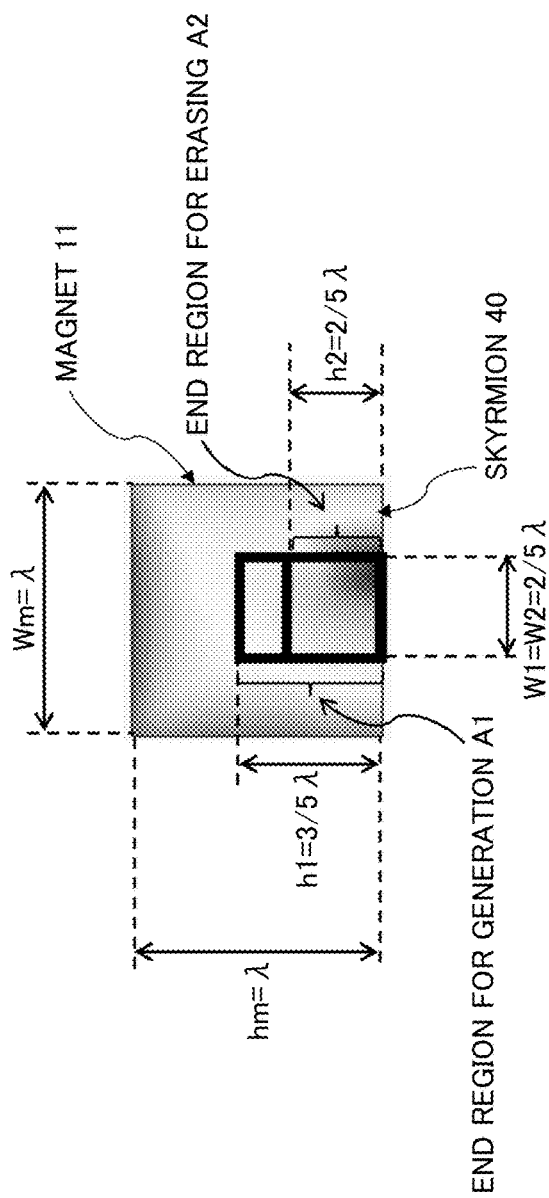
FIG. 34 shows a simulation result in a state where the skyrmion 40 is erased at the time t=6220(1/J).

FIGS. 32 to 34 show simulation results in a case where the end region for generation A1 and the end region for erasing A2 are included. FIG. 32 shows the simulation result in a state where the skyrmion 40 has been generated at the time t=4380(1/J). At the time t=4380(1/J), the generated skyrmion 40 exists stably.

FIG. 33 shows a simulation result in a state where the erasing of the skyrmion 40 is started at the time t=6040(1/J). At the time t=6040(1/J), the pulse Ha2 to erase a skyrmion is applied to the end region for erasing A2 and a pulling force F acts on the skyrmion 40 from the current path 12, but due to the Magnus force, the skyrmion 40 moves perpendicular to the pulling force F. In this way, the skyrmion 40 moves along the right side of the end region for erasing A2.

FIG. 34 shows a simulation result in a state where the skyrmion 40 is erased at the time t=6220(1/J). At the time t=6220(1/J), the end portion of the magnet 11 absorbs the skyrmion 40.

Figure 35:
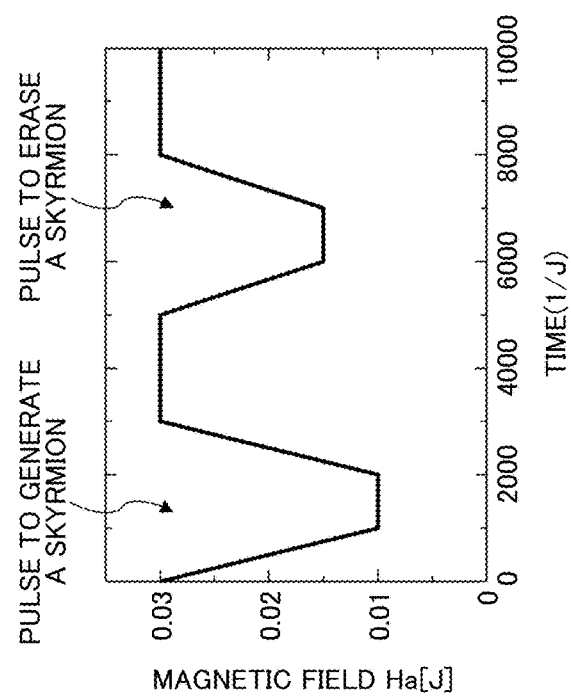
FIG. 35 shows the relationship between time and the magnetic field Ha of the end region when generating and erasing a skyrmion 40.

FIG. 35 shows the relationship between time and the magnetic fields Ha of the end regions when performing generation and erasing of the skyrmion 40. The pulse Ha1 to generate a skyrmion and the pulse Ha2 to erase a skyrmion in the present example have the same orientation but different magnitudes. The end region for generation A1 has a magnetic field Ha of 0.01 J due to the pulse Ha1 to generate a skyrmion. The end region for erasing A2 has a magnetic field Ha of 0.15 J due to the pulse Ha2 to erase a skyrmion. In other words, erasing is possible if the magnetic field Ha of the end region for erasing A2 is such that Ha<0.027.

Figure 36:
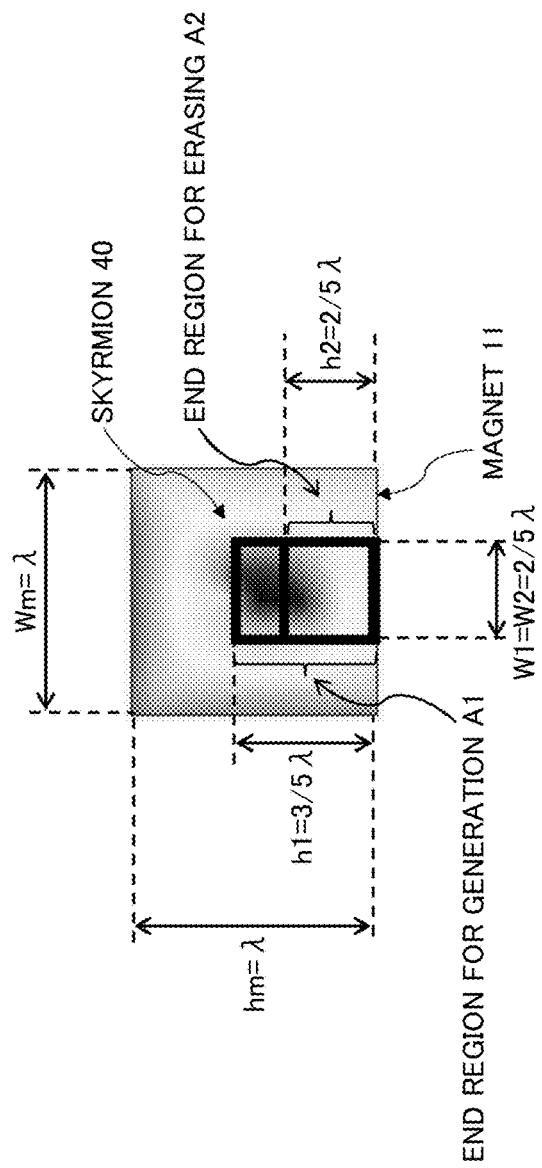
FIG. 36 shows a simulation result in a state where the skyrmion 40 has been generated at the time t=2880(1/J).

FIG. 36 shows a simulation result in a state where the skyrmion 40 has been generated at the time t=2880(1/J). At the time t=2880(1/J), the skyrmion 40 generated by the pulse to generate a skyrmion is in a state of existing stably.

Figure 37:
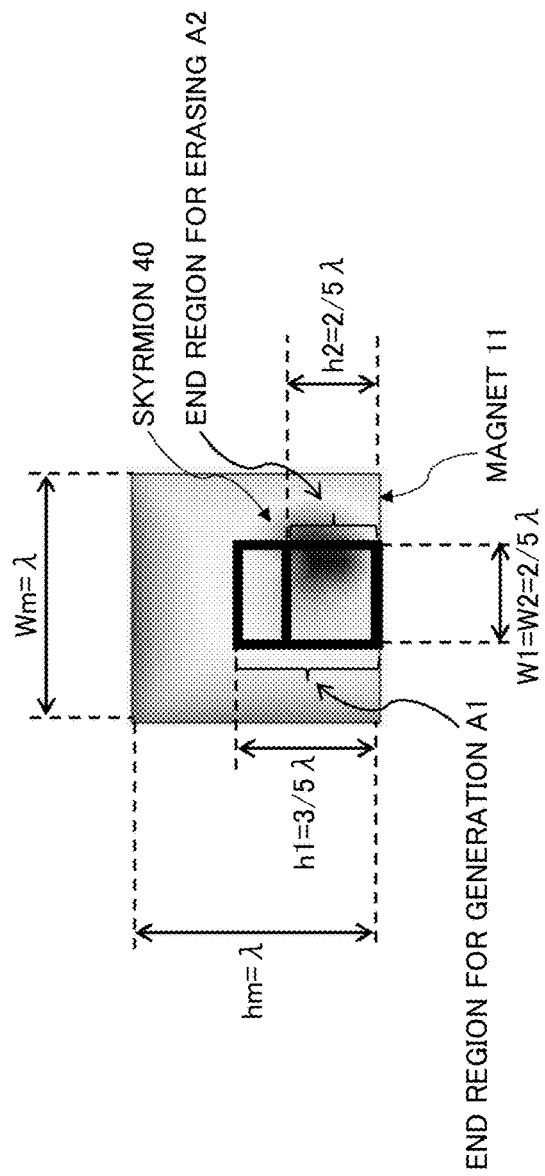
FIG. 37 shows a simulation result in a state where erasing of the skyrmion 40 has been started at the time t=6160(1/J).

FIG. 37 shows the simulation result in a state where erasing of the skyrmion 40 has started at the time t=6160 (1/J). At the time 6160(1/J), the pulse Ha2 to erase a skyrmion is applied to the end region for erasing A2 and a pulling force F acts on the skyrmion 40 from the current path 12, but due to the Magnus force, the skyrmion 40 moves perpendicular to the pulling force F. In this way, the skyrmion 40 moves along the right side of the end region for erasing A2.

Figure 38:
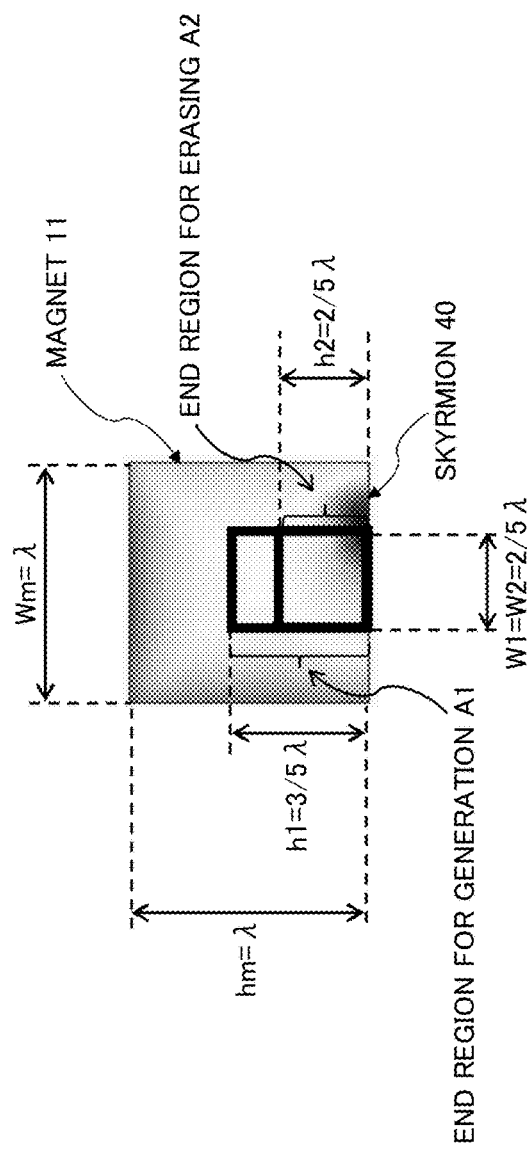
FIG. 38 shows a simulation result in a state where the skyrmion 40 is erased at the time t=6480(1/J).

FIG. 38 shows the simulation result in a state where the skyrmion 40 is erased at the time t=6480(1/J). At the time t=6480(1/J), the end portion of the magnet 11 absorbs the skyrmion 40.

As an example, when a skyrmion 40 is not generated by the pulse Ha1 to generate a skyrmion, a skyrmion 40 is not generated later by the pulse Ha2 to erase a skyrmion. This is because, since the height of the end region for erasing A2 is small, the skyrmion 40 cannot be generated.

The current path 12 may include two different current paths 12 that define the end region for generation A1 and the end region for erasing A2. In the present example, the end region for erasing A2 is provided inside the end region for generation A1. It should be noted that if the end region for erasing A2 is at a position enabling erasing of the generated skyrmion 40, the position is not limited to the inside of the end region for generation A1. Furthermore, the coil region $A_C$ for erasing that does not include the end portion of the magnet 11 erases the skyrmion 40.

The conditions necessary for erasing of the skyrmion 40 in the present embodiment example described above are shown below.

(15) In a case where the end region for generation A1 and the end region for erasing A2 are provided, even when the pulse Ha1 to generate a skyrmion and the pulse Ha2 to erase a skyrmion are the same, it is possible to generate and erase the skyrmion 40.

(16) The width Wm of the magnet 11, with the skyrmion 40 of a diameter λ being generated, is as shown below.

$$2\lambda > Wm > \lambda/2$$

(17) The height hm of the magnet 11, with the skyrmion 40 of a diameter λ being generated, is as shown below.

$$2\lambda > hm > \lambda/2$$

When the height hm of the magnet 11 is too large, the skyrmion 40 escapes from the current path 12 during erasing of the skyrmion 40, and therefore the skyrmion 40 cannot be erased.

As shown in FIG. 35, the pulse Ha2 to erase a skyrmion may be smaller than the pulse Ha1 to generate a skyrmion, and can be in a range of Ha2<0.02 J. It should be noted that the end region A2 for erasing is such that w=λ·2/5, and the skyrmion cannot be erased if w<λ·2/5.

In this way, with the present embodiment example, it is shown that it is also possible to generate and erase the skyrmion 40 when using two end regions A1 and A2 respectively for the generation and the erasing of the skyrmion 40, In the first to fourth embodiment examples described above, simulation experiments are shown for the generation and erasing of skyrmions 40 using magnetic field application. The design rules for this generation and erasing of the skyrmions 40 are made clear in the 17 items from (1) to (17).

The standards of these 17 items determine the basic rules for designing a skyrmion memory element, and are extremely important. The design rules described above are expressed as amounts defined by two quantities, which are the magnetic exchange interaction J characterizing the magnetism of the magnet 11 and the size λ of the generated skyrmions. Expression 5 relates the diameter λ of a skyrmion 40 to the Dzyaloshinskii-Moriya interaction D. Accordingly, these basic rules represent design rules capable of being applied to various chiral magnets, and the applicable range is broad.

Figure 39A:
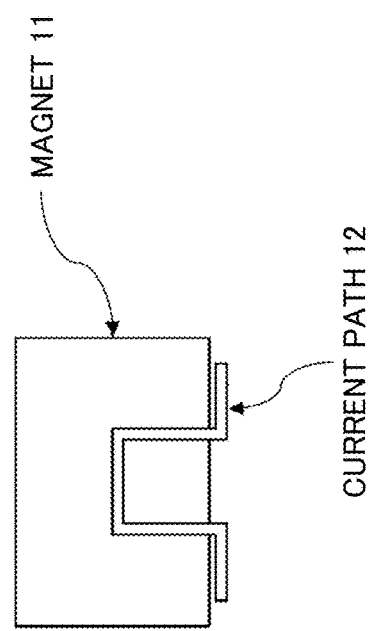
FIG. 39A shows an exemplary shape of the current path 12.
Figure 39B:
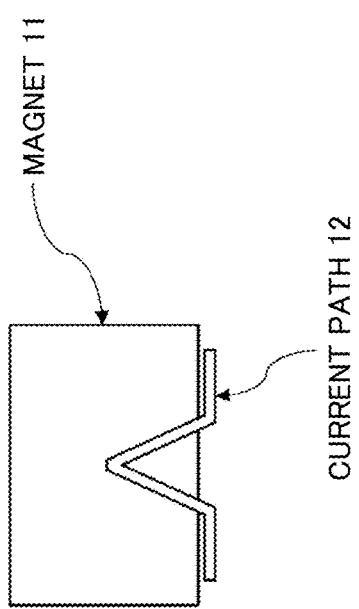
FIG. 39B shows an exemplary shape of the current path 12.
Figure 39C:
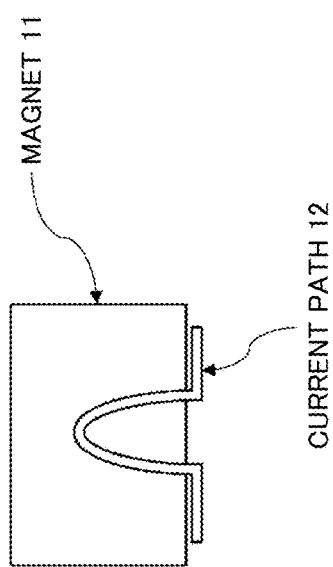
FIG. 39C shows an exemplary shape of the current path 12.
Figure 39D:
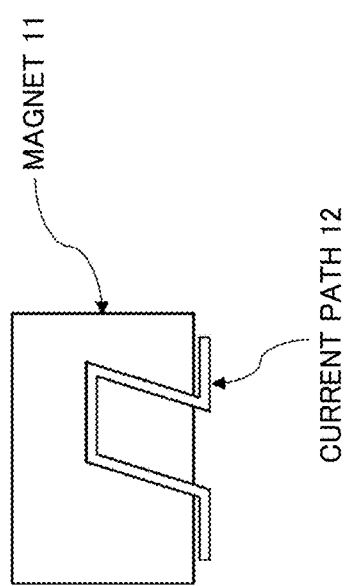
FIG. 39D shows an exemplary shape of the current path 12.
Figure 39E:
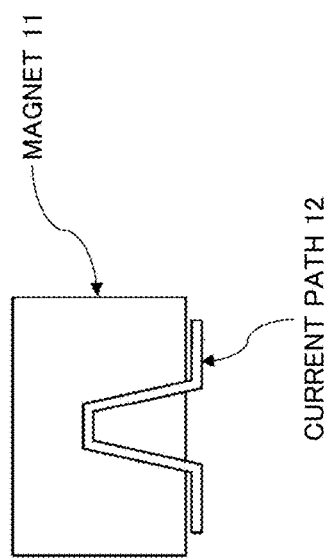
FIG. 39E shows an exemplary shape of the current path 12.

FIGS. 39A to 39F show exemplary shapes of the current path 12. FIG. 39A is the same as the example shown in FIG. 3 and the like. A shown in FIG. 39B, the current path 12 may surround an end region with a triangular shape. As shown in FIG. 39C, the current path 12 may surround an end region that is a portion of an ellipse, a circle, or an oval. As shown in FIG. 39D, the current path 12 may surround an end region that has a parallelogram shape. As shown in FIG. 39E, the current path 12 may surround an end region that has a trapezoidal shape. As shown in FIG. 39F, the current path 12 may surround an end region whose shape is a combination of a circle, a square, a triangle, or other shapes.

Figure 40:
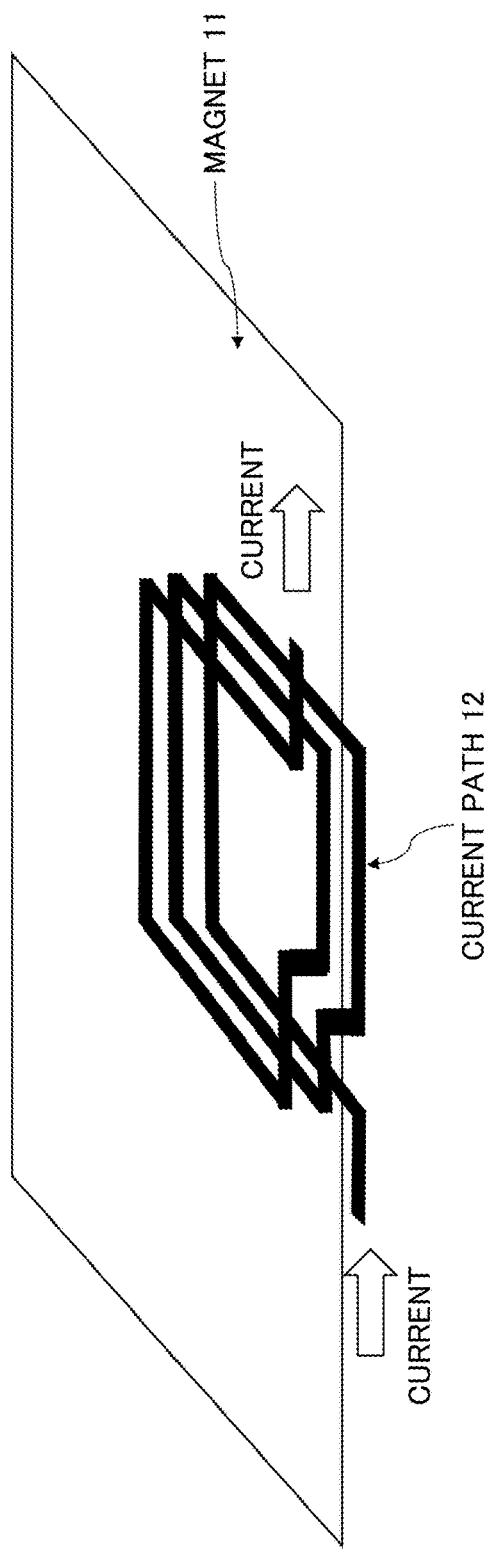
FIG. 40 is a schematic view of a multilayer coil shape of the current path 12.

FIG. 40 shows a case where the current path 12 is a multilayer wrapped coil. The current path 12 shaped as a multilayer wrapped coil is an effective method for increasing the magnetic field strength induced by the coil current. The shape of the current path 12 in the present invention is not limited to these shapes, and other similar shapes can be adopted for the current path 12. The conclusions reached in the embodiment examples of a chiral magnet described above do not qualitatively change when applied to dipole type magnets, frustrated magnets, or magnets with layered structures.

A skyrmion 40 is a super-fine structure with a nanoscale size and a diameter from 1 nm to 500 nm, and can be used as a high-capacity storage magnetic element that can miniaturize a huge amount of bit information. The skyrmion memory 100 can electrically perform writing and erasing. The time needed for the writing and the time needed for the erasing are each 3000(1/J). This required time is determined according to the magnitude of J, which is specific to the magnetic material. This magnitude is several meV in the case of a chiral magnet. In this case, 3000(1/J) corresponds to approximately 1 nanosecond. Being able to perform writing and erasing with extremely short pulses of approximately 1 nanosecond and also being a nonvolatile memory are amazing features. If the exchange interaction energy J is larger, the generation and erasing time of the skyrmions can be further reduced to achieve higher speed.

The skyrmion memory 100 also has many advantageous points over a flash memory that uses electricity for writing and erasing. A flash memory has a generation time of several milliseconds and a long erasing time of 20 microseconds. In contrast to this, the skyrmion memory 100 has a generation time and an erasing time that are each 1 nanosecond, which is at least from 6 to 3 orders of magnitude faster than a flash memory. This speed is amazing for a DRAM memory that requires approximately 10 nanoseconds as the generation time and erasing time of charge, and is a speed that is on par with an SRAM. Since the skyrmion memory 100 is a nonvolatile memory, the skyrmion memory 100 truly has the functions of the ultimate memory.

The skyrmion memory 100 is capable of performing writing and reading as many times as desired. In other words, there is no limit on the number of times writing and erasing are performed, and the endurance (durability) is infinite. Furthermore, the skyrmion 40 is generated as a magnetic moment having the same spiral structure not just on the front surface of the magnet 11 but also to the back surface. Therefore, a skyrmion 40 can exist stably as a structure that is not easily destroyed (erased) and remain static at a position without moving. In environments with a weak magnetic field such as found in daily life, the skyrmions 40 move easily and are not erased. In this way, since the skyrmions 40 exist stably, the skyrmion memory 100 can significantly improve the data retention (holding) performance.

Figure 41:
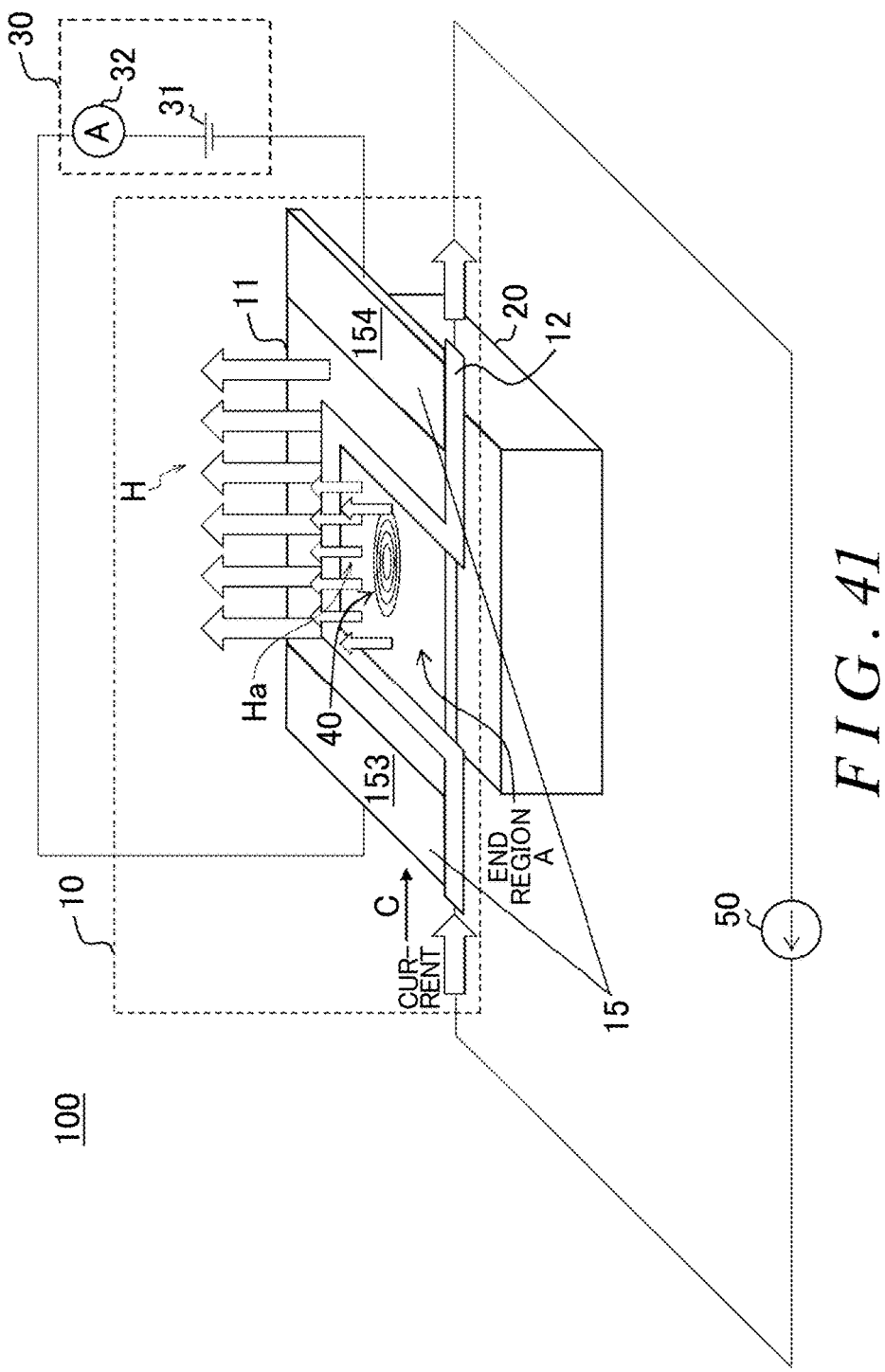
FIG. 41 shows an exemplary embodiment of the skyrmion memory 100.

FIG. 41 shows an exemplary embodiment of the skyrmion memory 100. The skyrmion memory 100 in the present example has the same configuration as the skyrmion memory 100 according to the embodiment of FIG. 3, except for the skyrmion sensor 15. The skyrmion sensor 15 in the present example includes a first electrode 153 and a second electrode 154 formed of a nonmagnetic metal. The first electrode 153 and the second electrode 154 may each be nonmagnetic metal made of the same material, or may be nonmagnetic metals made of different materials.

The first electrode 153 contacts the magnet 11 in the same layer at one end of the magnet 11. The one end of the magnet 11 may be any one of the top, bottom, left, or right end portion of the magnet 11, as long as it is an end portion. The first electrode 153 only needs to contact at least a portion of the one end of the magnet 11.

The second electrode 154 contacts the magnet 11 in the same layer at another end of the magnet 11. The other end of the magnet 11 may be any one of the top, bottom, left, or right end portion of the magnet 11, as long as it is an end portion. In other words, the first electrode 153 and the second electrode 154 may be arranged at arbitrary end portions regardless of the position where the end region A is formed. For example, the first electrode 153 and the second electrode 154 are arranged at opposite end portions in a manner to sandwich the magnet 11.

Contacting the magnet 11 in the same layer refers to the first electrode 153 and the second electrode 154 contacting the magnet 11 in a direction perpendicular to the magnetic field H. In a case where the first electrode 153 and the second electrode 154 are layered on the top portion of the magnet 11 without being formed in contact with the magnet 11 in the same layer, there is a possibility that the generated skyrmions will tunnel into the bottom portions of the first electrode 153 or the second electrode 154. As a result, problems occur such as the inability to erase the skyrmions that have tunneled. Accordingly, the first electrode 153 or the second electrode 154 must be formed in contact with an end portion of the magnet 11. Forming the first electrode 153 or the second electrode 154 in contact with an end portion of the magnet 11 results in forming the first electrode 153 or the second electrode 154 in the same plane, and this enables a reduction in the manufacturing cost.

The unit for measuring 30 is connected to the first electrode 153 and the second electrode 154. The unit for measuring 30 measures the resistance value of the magnet 11 between the first electrode 153 and the second electrode 154. The resistance value between the first electrode 153 and the second electrode 154 corresponds to the resistance value of the magnet 11, and changes according to the generation and erasing of the skyrmions 40. For example, when there skyrmions 40 are not present, the magnet 11 is ferromagnetic, and therefore the magnetic moments are aligned in the +z direction. In this case, the polarization of the spin of electrons flowing between the first electrode 153 and the second electrode 154 is in the +z direction, in the same manner as the magnet 11, and therefore does not experience spin scattering. As a result, the resistance value for the flow between the first electrode 153 and the second electrode 154 is low. On the other hand, when the skyrmions 40 are present, the spiral magnetic moments of the skyrmions are present in the magnet 11, and magnetic moments with many orientations other than in the z direction are present among these magnetic moments. In this case, the polarization of the spin of electrons flowing between the first electrode 153 and the second electrode 154 experiences spin scattering. As a result, the resistance value for the flow between the first electrode 153 and the second electrode 154 is high. In other words, the resistance value of the magnet 11 is higher when there are skyrmions 40 present than when the skyrmions 40 are not present. The unit for measuring 30 can detect the generation and erasing of a skyrmion 40 by measuring the change in the resistance value of the magnet 11.

Figure 42:
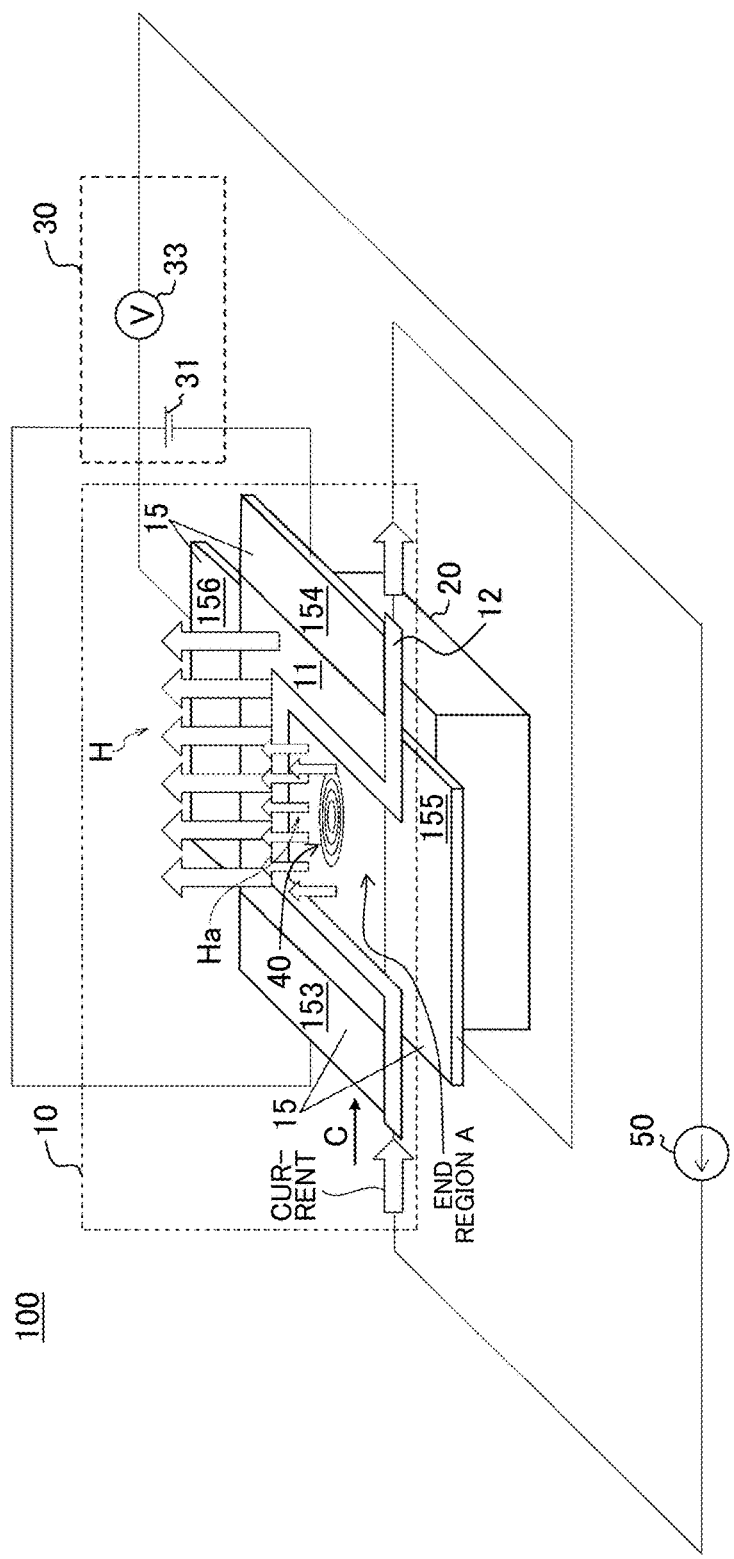
FIG. 42 shows an exemplary embodiment of the skyrmion memory 100.

FIG. 42 shows an exemplary embodiment of the skyrmion memory 100. The skyrmion memory 100 in the present example detects the presence or lack of skyrmions 40 by detecting a Hall voltage. The skyrmion memory 100 in the present example has the same configuration as the skyrmion memory 100 according to the embodiment shown in FIG. 41, except for the skyrmion sensor 15. The skyrmion sensor 15 further includes a third electrode 155 and a fourth electrode 156 formed by nonmagnetic metal. The third electrode 155 and the fourth electrode 156 may each be nonmagnetic metal made of the same material, or may be nonmagnetic metals made of different materials.

The third electrode 155 is arranged to be perpendicular to the arrangement formed by the first electrode 153 and the second electrode 154, and is made from a third nonmagnetic metal that contacts an end portion of the magnet 11. The third electrode 155 contacts the magnet 11 in the same layer at the one end of the magnet 11. The third electrode 155 only needs to contact at least a portion of the one end of the magnet 11. For example, in a case where the first electrode 153 and the second electrode 154 are arranged on the left and right of the magnet 11, the third electrode 155 is arranged on the bottom side of the magnet 11.

The fourth electrode 156 is made from a fourth nonmagnetic metal that is distanced from the third electrode 155, faces the third electrode 155, and contacts an end portion of the magnet 11. The fourth electrode 156 contacts the magnet 11 in the same layer at one end of the magnet 11. The fourth electrode 156 only needs to contact at least a portion of the one end of the magnet 11. For example, in a case where the first electrode 153 and the second electrode 154 are arranged on the left and right of the magnet 11, the fourth electrode 156 is arranged on the top side of the magnet 11.

As described above, the third electrode 155 and the fourth electrode 156 are arranged in a manner to measure the voltage value in a direction perpendicular to the current flowing through the magnet 11 due to the first electrode 153 and the second electrode 154. If the third electrode 155 and the fourth electrode 156 are formed using the same process as for the first electrode 153 and the second electrode 154, it is possible to reduce the manufacturing cost.

The unit for measuring 30 further includes a voltmeter 33 that is connected to the third electrode 155 and the fourth electrode 156. If a skyrmion 40 is present, when current flows between the first electrode 153 and the second electrode 154, the Hall voltage is generated in a direction perpendicular to the flow of the current. On the other hand, when a skyrmion 40 is not present, the Hall voltage is a minimum value. In other words, the unit for measuring 30 directly reads a "1" or "0" signal by detecting the presence or lack of a skyrmion 40 as a difference in the Hall voltage. The detection method of a skyrmion 40 according to the present embodiment has high sensitivity, since one of the Hall voltages used in the comparison is small.

One of the third electrode 155 and the fourth electrode 156 may also function as the first electrode 153 or the second electrode 154. It is only necessary that one of the wires among the two wires connected to the voltmeter 33 be connected to the first electrode 153 or the second electrode 154. If the difference between the voltage values obtained by the voltmeter are detected, it is possible to detect a skyrmion 40. In this case, the sensitivity is reduced but, because the electrode area is also reduced, it is possible to improve the degree of integration.

Figure 43:
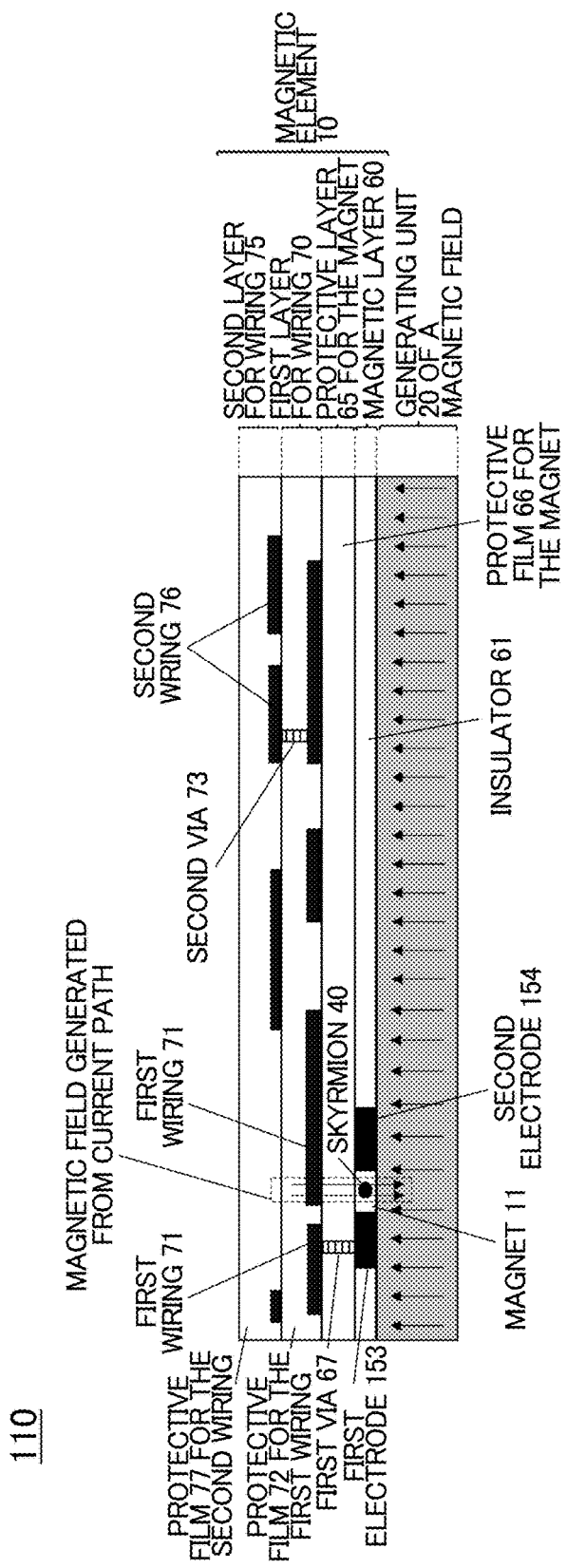
FIG. 43 is a schematic view of the skyrmion memory in a device cross section of the skyrmion memory.

FIG. 43 shows a cross-sectional structure of a skyrmion memory-device 110. The skyrmion memory-device 110 is a device including at least the skyrmion memory 100. The skyrmion memory-device 110 includes a generating unit 20 of the magnetic fields that is a ferromagnetic layer and a magnetic element 10 formed above the generating unit 20 of the magnetic fields. A nonmagnetic layer is provided between the magnetic element 10 and the generating unit 20 of the magnetic fields. The magnetic element 10 in the present example includes the first electrode 153 and the second electrode 154 corresponding to the magnetic element 10 shown in FIG. 41. Instead, the magnetic element 10 in the present example corresponds to the magnetic element 10 shown in FIG. 42, and includes the first electrode 153, the second electrode 154, the third electrode 155, and the fourth electrode 156. The cross-sectional view of the unit for measuring 30 is not shown in the drawing. The magnetic element 10 includes a layered structure in which an insulation layer 60, a protective layer 65 for the magnet, a first layer for wiring 70, and a second layer for wiring 75 are layered in the stated order.

The insulation layer 60 includes the magnet 11, an insulator 61, the first electrode 153, and the second electrode 154. Skyrmions 40 are generated and erased in the magnet 11. The insulator 61 surrounds the magnet 11, the first electrode 153, and the second electrode 154. The first electrode 153 and the second electrode 154 are formed by a nonmagnetic metal. The magnet 11, the first electrode 153, and the second electrode 154 have a structure in which nonmagnetic metal, magnetic material, and nonmagnetic metal are joined, and this is the basic structure of a skyrmion magnetic medium. This structure is abbreviated as an NMN structure. The magnetic layer 60 may include a plurality of NMN structures in the same layer.

The protective layer 65 for the magnet includes a protective film 66 for the magnet and a first via 67. The protective film 66 for the magnet protects the magnetic layer 60. The first via 67 supplies a current for skyrmion detection to the first electrode 153 and the second electrode 154.

The first layer for wiring 70 includes a first wiring 71, a protective film 72 for the first wiring, and a second via 73. The first wiring 71 forms the current paths for magnetic field generation and for skyrmion detection. The protective film 72 for the first wiring functions as an interlayer insulating film for forming the first wiring 71 and the second via 73. It is difficult to lead the two types of current paths, which are for magnetic field generation and for skyrmion detection, in the same layer without having these wires intersect. Therefore, the second layer for wiring 75 may be formed on the first layer for wiring 70.

The second layer for wiring 75 includes a second wiring 76 and a protective film 77 for the second wiring. The second wiring 76 is connected to the second via 73. The protective film 77 for the second wiring functions as an interlayer insulating film for insulating the second wiring 76. For example, the second via 73 is connected to at least one of the two types of current paths, which are for magnetic field generation and for skyrmion detection, in the same layer without having these wires intersect.

In the magnet 11, the skyrmion 40 is shown in the drawing by a black circle. The magnetic field generated from the current path by the first wiring 71 is shown in the drawing by a downward-oriented arrow. A skyrmion 40 can be generated in the magnet 11 due to the magnetic field generated by the coil current path due to the first wiring 71.

Figure 44:
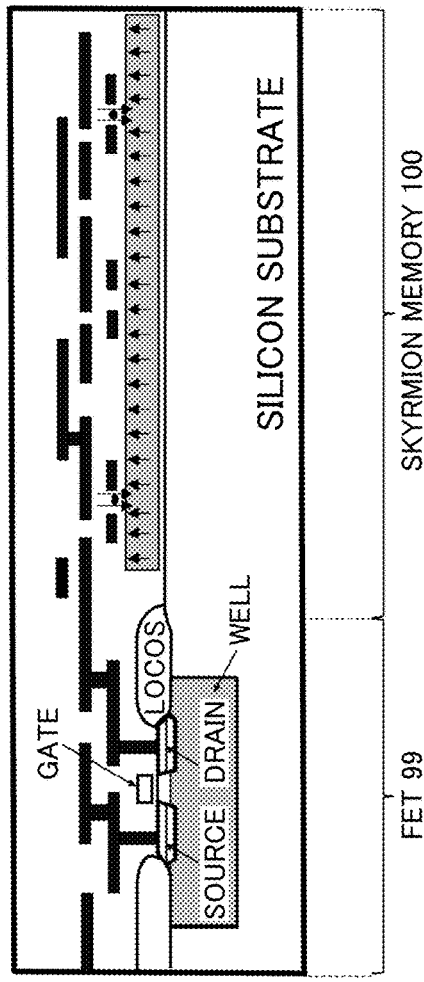
FIG. 44 is a cross-sectional view of the skyrmion memory-device 110.

FIG. 44 shows an example of a cross-sectional structure of the skyrmion memory-device 110. The skyrmion memory-device 110 includes the skyrmion memory 100 and a FET (Field Effect Transistor) 99. The skyrmion memory 100 is formed on a silicon substrate in which the FET 99 is not present. The FET 99 is a general FET that is formed through a general silicon process. The FET 99 in the present example includes two Cu wiring layers.

Figure 45A:
FIG. 45A shows a process of forming the generating unit 20 of the magnetic fields and the nonmagnetic metal 157.

FIGS. 45A to 45H show a manufacturing process of the skyrmion memory-device 110 shown in FIG. 43. Here, the manufacturing process of the FET 99 is not shown. FIG. 45A shows the formation process of the generating unit 20 of the magnetic fields and the nonmagnetic metal 157. In the present example, the generating unit 20 of the magnetic fields is formed on the substrate 80 that is formed of silicon. The generating unit 20 of the magnetic fields forms a ferromagnetic film, and generates a uniform perpendicular magnetic field from the substrate 80 side to the insulation layer 60 side. As an example, the generating unit 20 of the magnetic fields is formed with a thickness of 3000 Å by a stopper device. The material and film thickness of the generating unit 20 of the magnetic fields are selected such that the generating unit 20 of the magnetic fields has a holding characteristic capable of applying a magnetic field strength of H=0.03 J to the magnet 11. The generating unit 20 of the magnetic fields is formed by a rare earth metal magnet or a ferrite magnet made from iron oxide. An insulating film made of a silicon oxide film or the like may be present between the generating unit 20 of the magnetic fields and the substrate 80.

A resist 85 is patterned on the generating unit 20 of the magnetic fields to have the shape of the magnet 11. For example, the resist 85 is formed with a thickness of several thousand Angstroms using spin coating. The resist 85 undergoes EUV exposure in the region where the magnet 11 is formed. The regions outside the region where the EUV exposure was performed are removed due to development. The material of the resist 85 may be a general material used in the manufacturing process of semiconductors.

The nonmagnetic metal 157 is formed on the generating unit 20 of the magnetic fields and the resist 85. The nonmagnetic metal 157 becomes the first electrode 153 and the second electrode 154 of the skyrmion sensor 15 by performing patterning later. For example, the nonmagnetic metal 157 is formed with a thickness of 500 Å by a sputtering device. The nonmagnetic metal 157 is formed with a nonmagnetic metal such as copper Cu or aluminum Al.

Figure 45B:
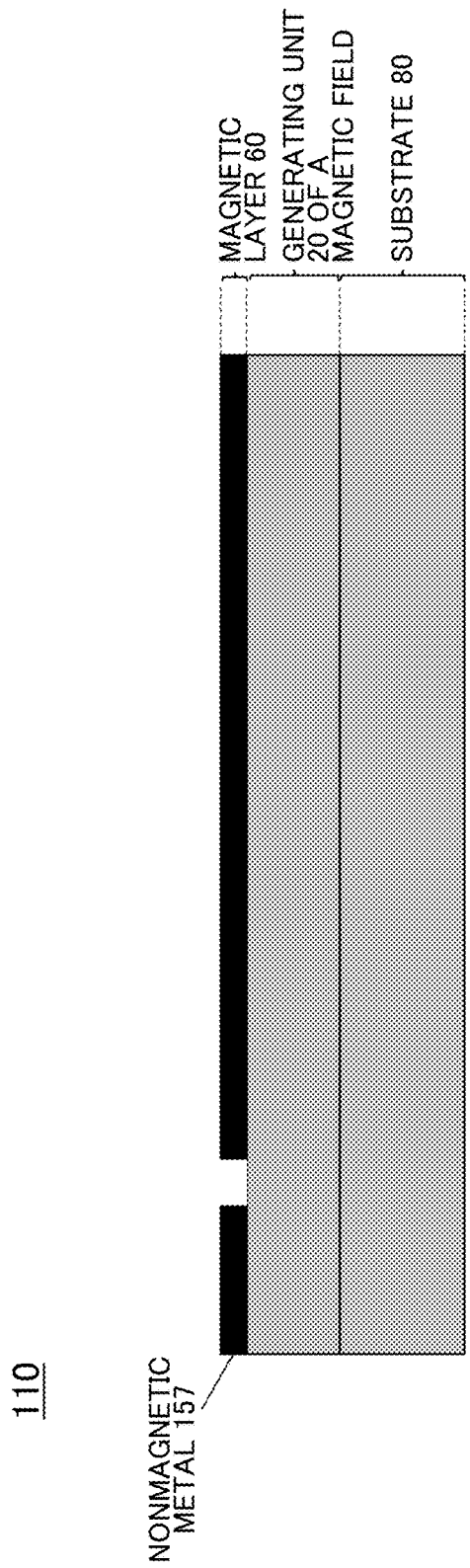
FIG. 45B shows a process of peeling off the resist 85.

FIG. 45B shows the step of peeling off the resist 85. The resist 85 is removed using a dry process or a wet process. For example, in the case of a dry process, the resist 85 is peeled off using oxygen gas ashing. When peeling off the resist 85, a recessed portion of the nonmagnetic metal 157 is formed at a position where the magnet 11 is to be formed. The nonmagnetic metal 157 in the present example is formed by a lithography process, but may instead be formed by an etching process.

Figure 45C:
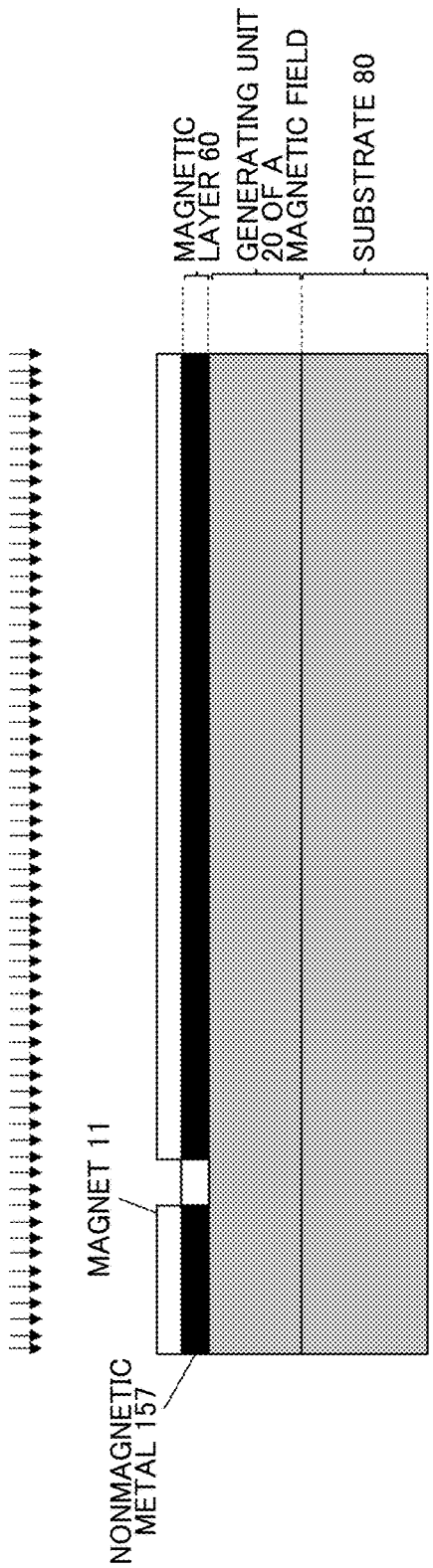
FIG. 45C shows a process of forming the magnet 11.

FIG. 45C shows the process for forming the magnet 11. In the present example, the magnet 11 is formed with a thickness of 500 Å by an MBE device. The magnet 11 is formed in the recessed portion of the nonmagnetic metal 157 and on the entire surface of the insulation layer 60. The magnet 11 in the present example has the same film thickness as the nonmagnetic metal 157. However, the film thickness of the magnet 11 deposited in the present process may be greater than the film thickness of the nonmagnetic metal 157 or may be less than the film thickness of the nonmagnetic metal 157.

Figure 45D:
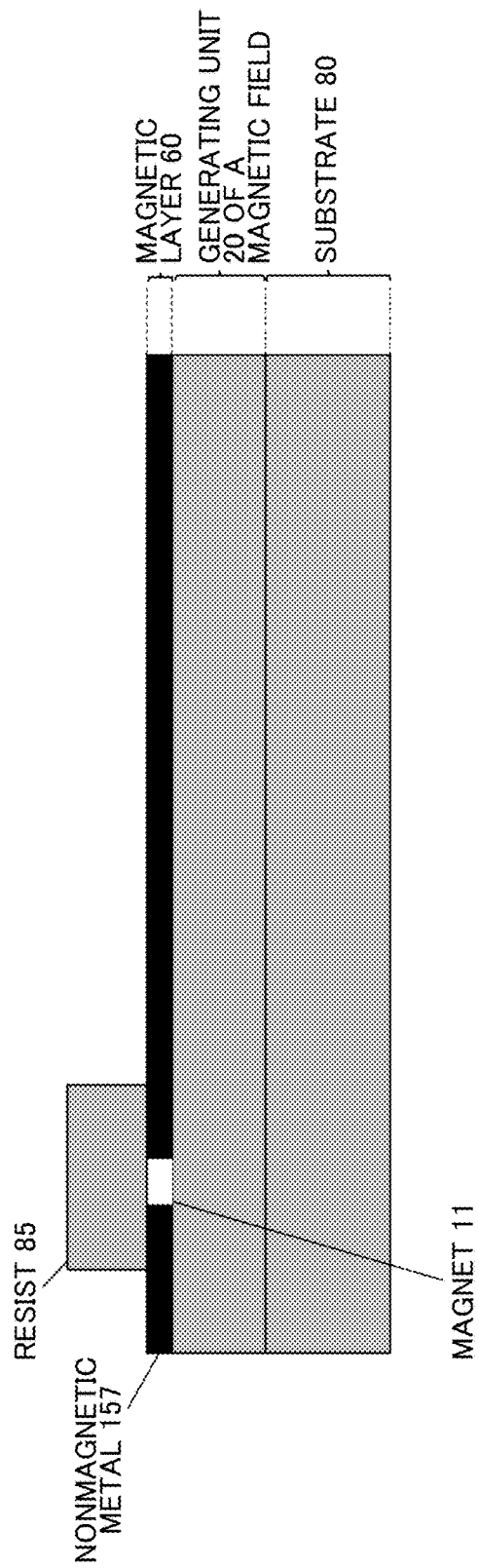
FIG. 45D shows a process of removing the magnet 11 and a process of applying the resist 85.

FIG. 45D shows a process of removing the magnet 11 and a process of applying the resist 85. The magnet 11 formed on the top portion of the nonmagnetic metal 157 is removed using a CMP (Chemical Mechanical Process). After this, the resist 85 is applied to form the first electrode 153 and the second electrode 154. The resist 85 is patterned according to the shapes of the magnet 11, the first electrode 153, and the second electrode 154, through a process of EUV exposure and development. The third electrode 155 and the fourth electrode 156 may be patterned at the same time as the first electrode 153 and the second electrode 154. In this way, the skyrmion memory 100 including the third electrode 155 and the fourth electrode 156 shown in FIG. 42 can be formed without adding a new process.

Figure 45E:
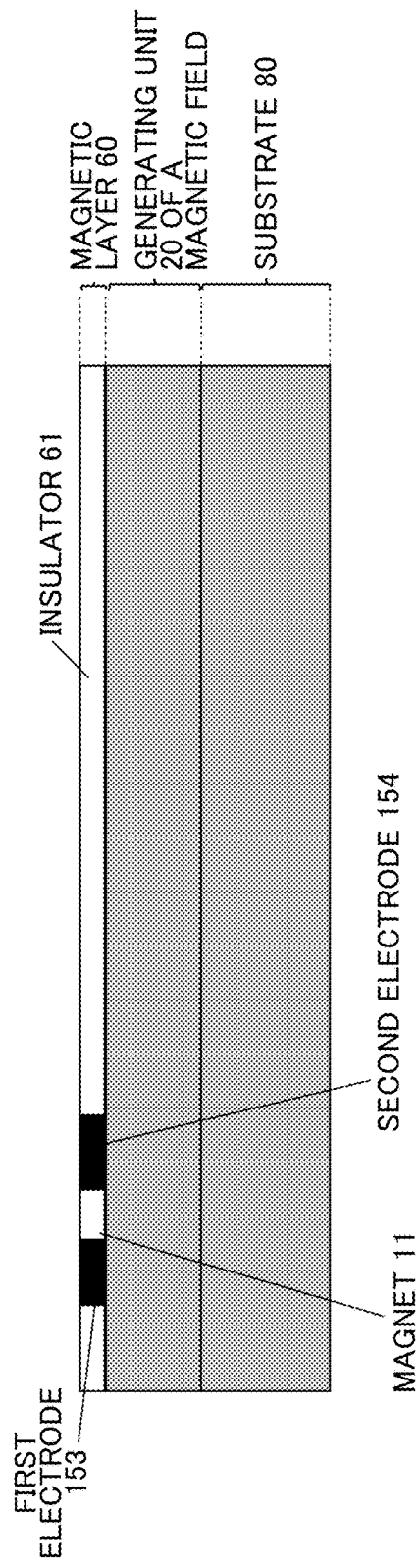
FIG. 45E shows a process of etching the electrodes and a process of forming the insulator 61.

FIG. 45E shows a process of etching the electrodes and a process of forming the insulator 61. The first electrode 153 and the second electrode 154 are formed using dry etching. As a result of the present process, the NMN structure, which is the basic structure of the skyrmion memory 100, is completed. The following processes are the same as the wiring processes of a normal LSI. In the insulation layer 60, the insulator 61 is formed around the NMN structure.

Figure 45F:
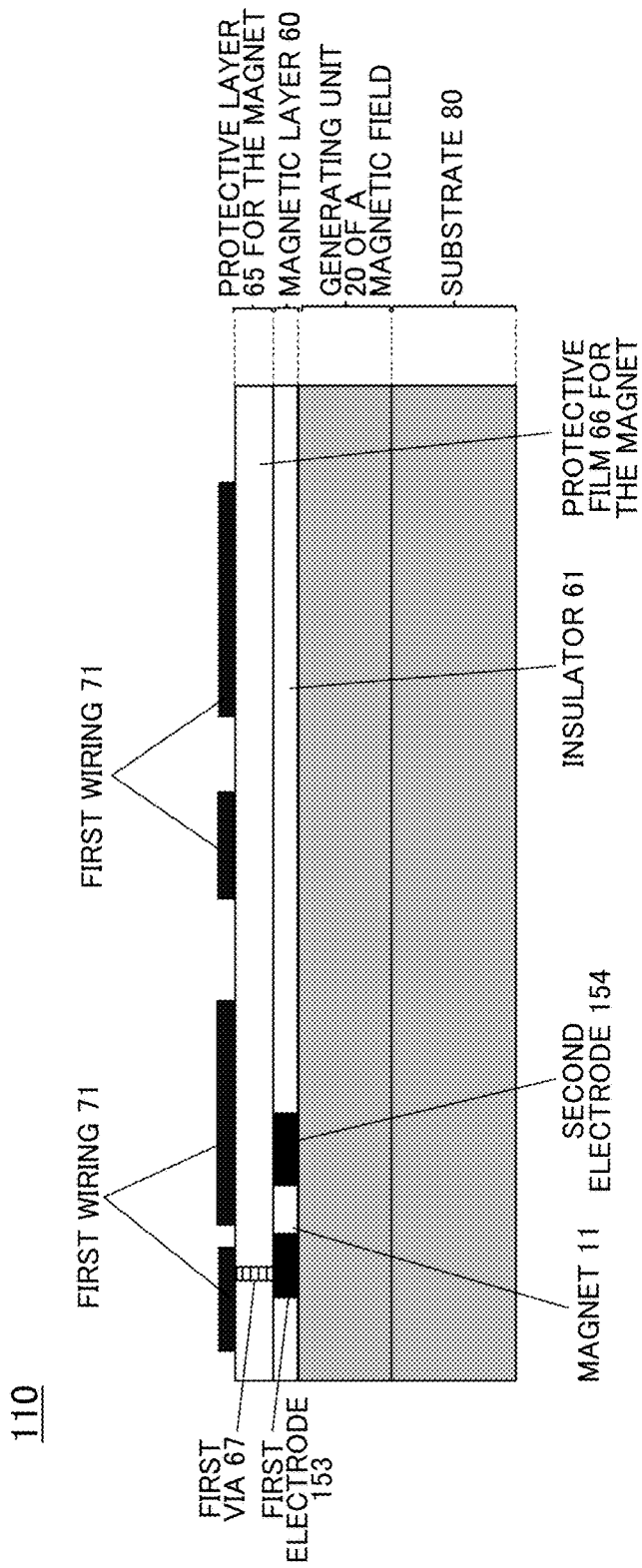
FIG. 45F shows a process of forming the protective layer 65 for the magnet and the first wiring 71.

FIG. 45F shows a process of forming the protective layer 65 for the magnet and the first wiring 71. A protective film 66 for the magnet is formed on the insulation layer 60. The first via 67 is formed by depositing metal for wiring in the opening formed in the protective film 66 for the magnet. In other words, the protective film 66 for the magnet and the first via 67 are formed by the same process as the process of general semiconductor manufacturing.

The first wiring 71 is formed on the protective layer 65 for the magnet. The first wiring 71 is used as the current path for generating the magnetic fields for skyrmion generation and erasing and as the current path for skyrmion sensing. The first wiring 71 is patterned using a general lithography process and etching process. The first wiring 71 may be formed by a method that is either an etching process or a lift-off process.

Figure 45G:
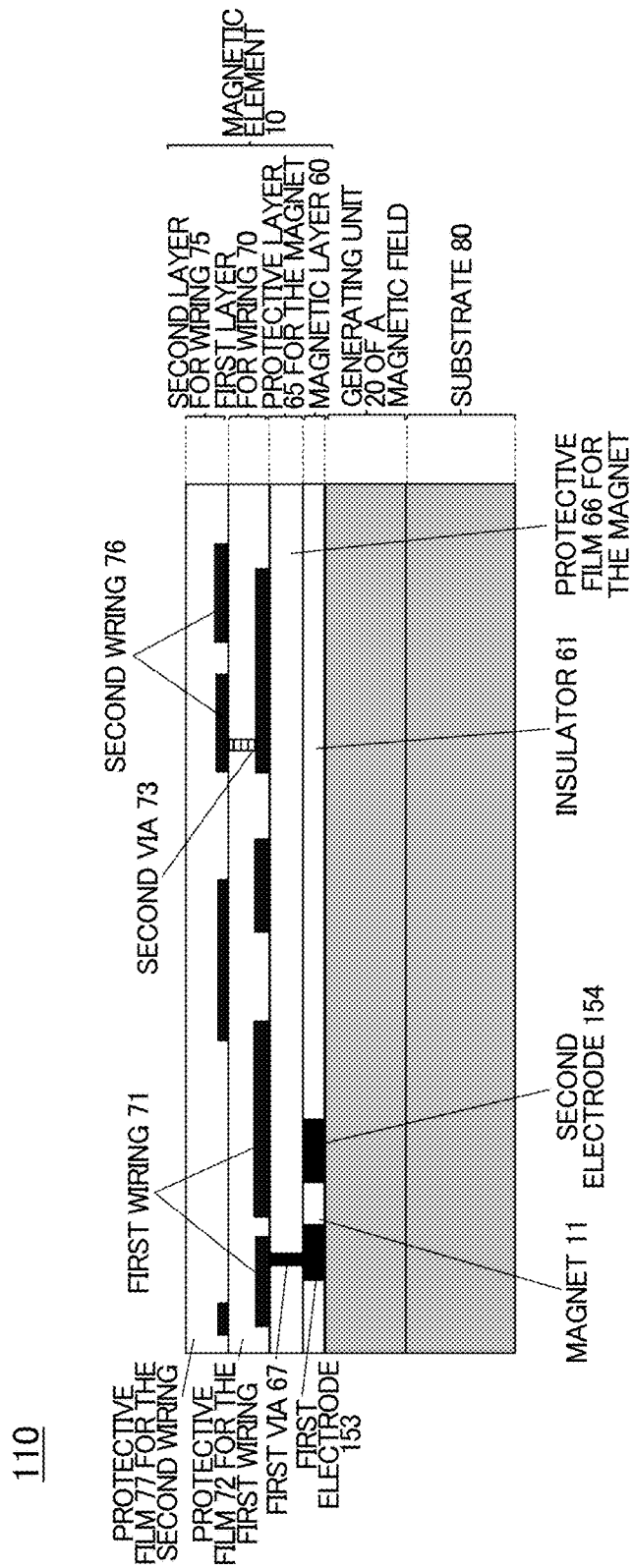
FIG. 45G shows a process of forming the first layer for wiring 70 and the second layer for wiring 75.

FIG. 45G shows the process of forming the first layer for wiring 70 and the second layer for wiring 75. A protective film 72 for the first wiring is formed on the protective layer 65 for the magnet and the first wiring 71. The second via 73 is formed by depositing metal for wiring in the opening formed in the protective film 72 for the first wiring.

The second wiring 76 is formed on the first layer for wiring 70. The second wiring 76 is patterned using a general lithography process and etching process. The second wiring 76 may be formed by a method that is either an etching process or a lift-off process. A protective film 77 for the second wiring is formed on the first layer for wiring 70 and the second wiring 76. The second wiring 76 and the protective film 77 for the second wiring are formed by the same process as the process of general semiconductor manufacturing.

The above shows a manufacturing process for forming the magnetic element 10 on the generating unit 20 of the magnetic fields that generates the magnetic field. The total number of photomasks needed to manufacture the skyrmion memory-device 110 is seven. Specifically, one photomask is used for the generating unit 20 of the magnetic fields. Two photomasks are used for the NMN structure (the magnet 11, the first electrode 153, and the second electrode 154), one photomask is used to form the first via 67, one photomask is used to form the first wiring 71, one photomask is used to form the second via 73, and one photomask is used to form the second wiring 76. The magnetic element can be manufactured using 1/3 or less of the number of photo processes used for a normal CMOS with two layers of wiring. Furthermore, the present manufacturing process uses existing LSI manufacturing processes, and therefore the cost of developing a process and the cost of manufacturing are low. A CMOS-FET structure for sensor amplification and switches for controlling the skyrmion memory 100 must be mounted on the same chip. The photo processes used in the CMOS-FET manufacturing process can also serve as the photo processes for manufacturing the skyrmion memory, and therefore the number of photomasks is only increased by one, which is the photomask used for the generating unit of the magnetic field. The increase of the manufacturing cost can be significantly reduced.

Figure 45H:
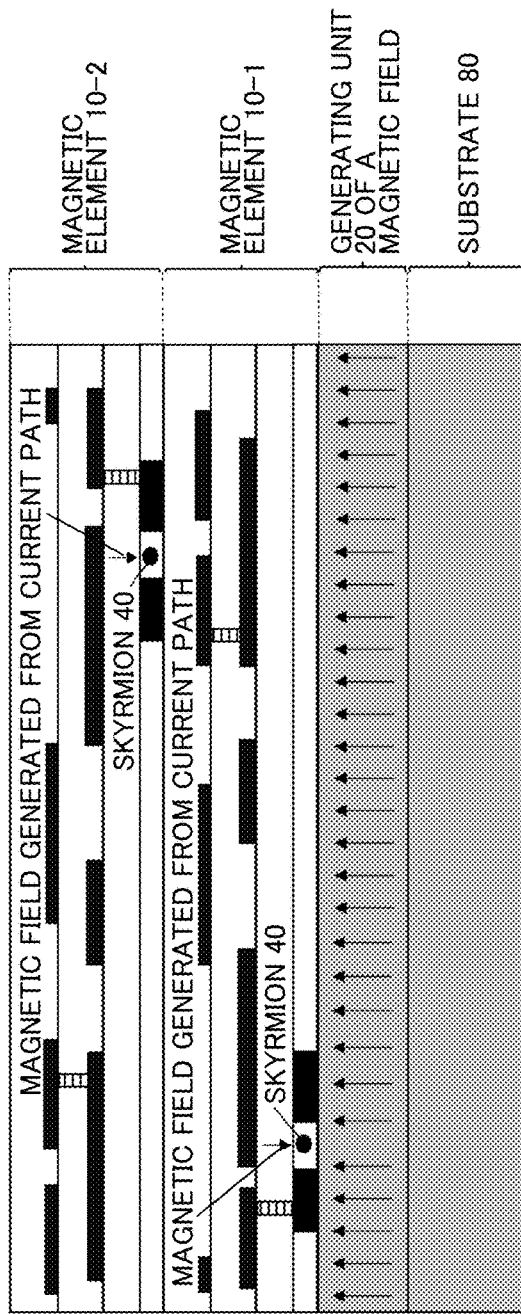
FIG. 45H shows a skyrmion memory-device 110 with the magnetic elements 10 layered therein.

FIG. 45H shows a skyrmion memory-device 110 on which magnetic elements 10 are layered. The skyrmion memory-device 110 in the present example includes a magnetic element 10-1 and a magnetic element 10-2. The skyrmion memory-device 110 is manufactured by repeating the manufacturing process shown in FIGS. 45A to 45G. The skyrmion memory-device 110 can achieve a greater degree of integration by layering the magnetic elements 10. The skyrmion memory-device 110 in the present example can realize twice the degree of integration of the skyrmion memory-device 110 shown in FIG. 45G.

Figure 46:
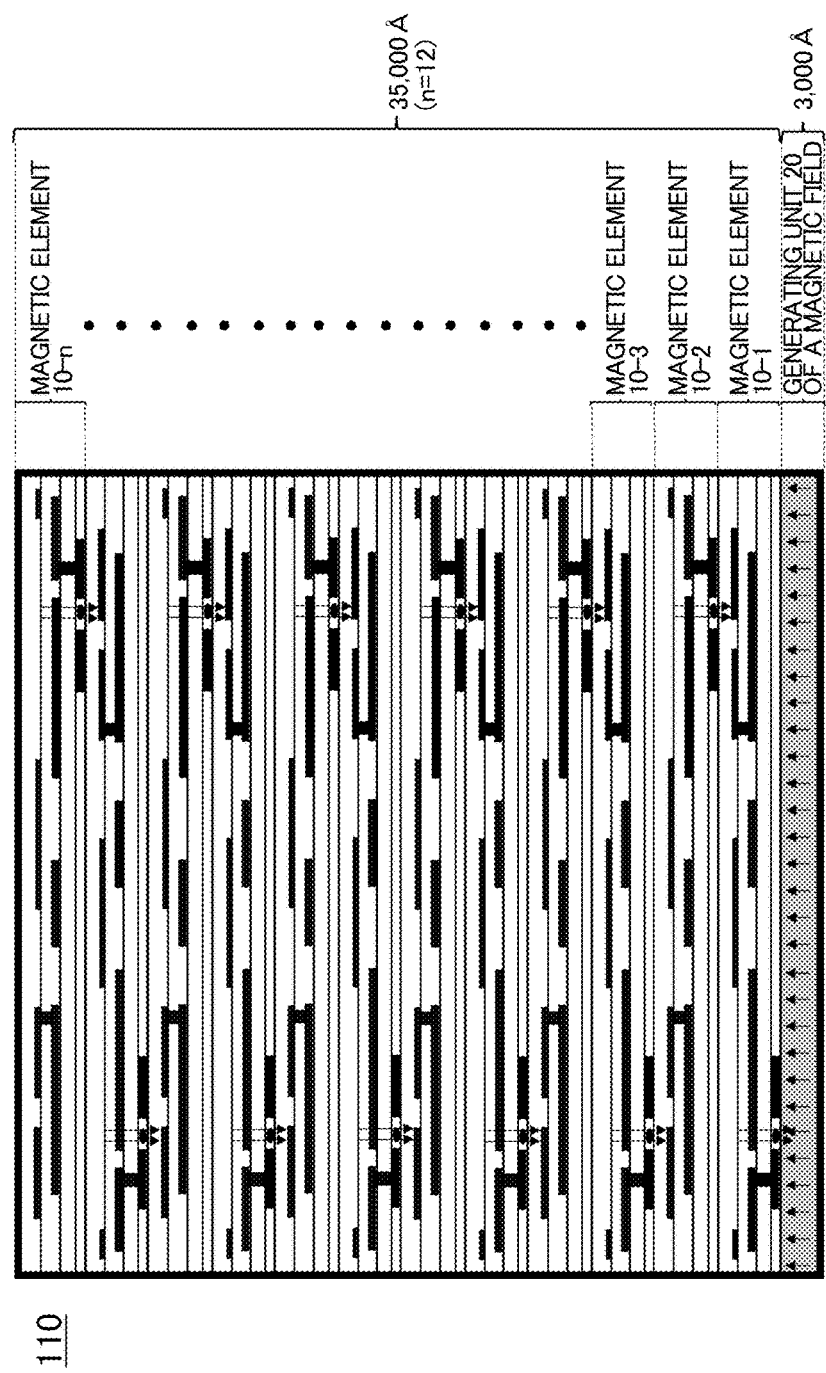
FIG. 46 shows a skyrmion memory-device 110 with n layers of magnetic elements 10 layered therein.

FIG. 46 shows a skyrmion memory-device 110 on which n layers of the magnetic element 10 are layered. The skyrmion memory-device 110 in the present example is a case in which n=12. The generating unit 20 of the magnetic fields has a film thickness of 3000 Å. The magnetic elements 10 have a structure in which a magnetic element 10-1 to a magnetic element 10-n are layered. The magnetic elements 10 in the present example have a total film thickness of 35000 Å.

Figure 47:
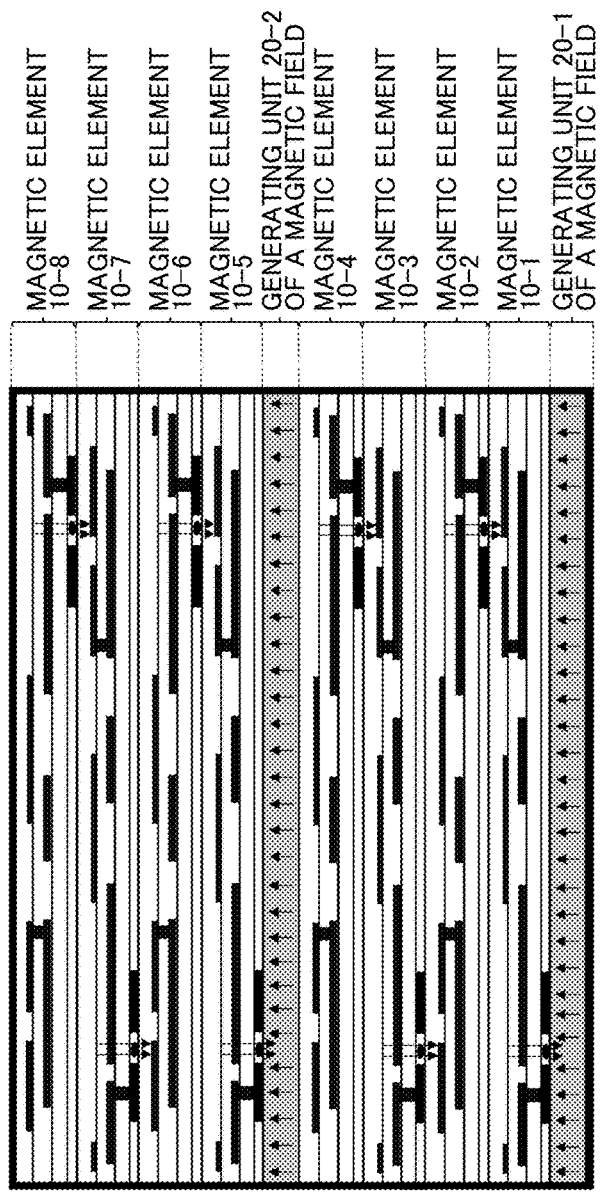
FIG. 47 shows a skyrmion memory-device 110 having a plurality of the generating units 20 of the magnetic fields.

FIG. 47 shows a skyrmion memory-device 110 including a plurality of generating units 20 of the magnetic fields. The skyrmion memory-device 110 in the present example includes a total of eight layers of magnetic elements 10, from a magnetic element 10-1 to a magnetic element 10-8. The skyrmion memory-device 110 includes four layers of magnetic elements 10 formed on a generating unit 20 of the magnetic fields-1. The skyrmion memory-device 110 further includes a generating unit 20 of the magnetic fields-2 between the magnetic element 10-4 and the magnetic element 10-5. In this way, the magnetic element 10 can keep the magnetic field strength received from the generating units 20 of the magnetic fields constant. The generating units 20 of the magnetic fields may be arranged at suitable intervals according to the material and the like of the magnetic elements 10.

Figure 48:
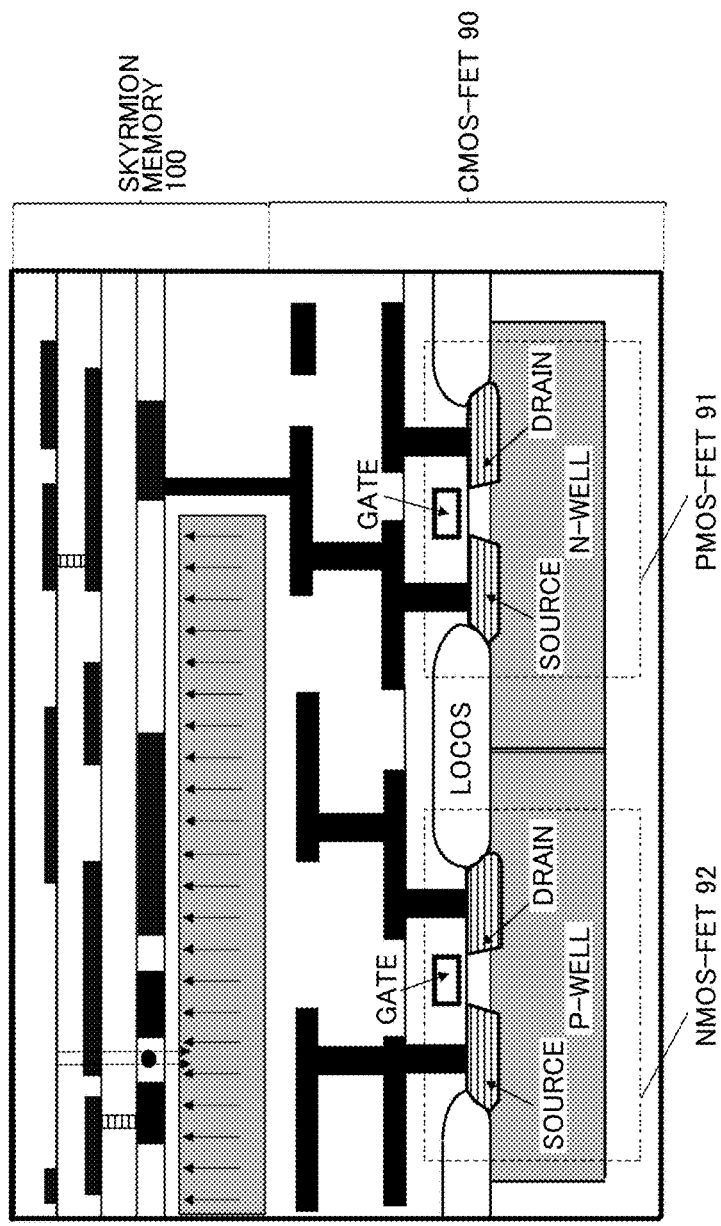
FIG. 48 shows an exemplary configuration of the skyrmion memory-device 110.

FIG. 48 shows an exemplary configuration of the skyrmion memory-device 110. The skyrmion memory-device 110 includes the skyrmion memory 100 and a CMOS-FET 90 establishing a CPU function. The skyrmion memory 100 is formed on the CMOS-FET 90. The CMOS-FET 90 in the present example includes a PMOS-FET 91 and an NMOS-FET 92.

The skyrmion memory 100 can include the CMOS-FET 90 establishing a CPU function and a skyrmion memory-device 110 that is a layered large-scale nonvolatile memory, in the same chip. As a result, the CPU processing time can be shortened, the processing speed can be increased, and the power consumption of the CPU can be significantly reduced. In other words, it is possible to significantly reduce the processing time for calling up the basic OS or the like from the HD when a PC starts up, writing to and reading from an external SRAM or DRAM, and the like, and this contributes to a reduction in CPU time (significant increase in speed). As a result, it is possible to realize a CPU that has significantly lower power consumption. Furthermore, the skyrmion memory 100 that is a large-scale nonvolatile memory has zero power consumption for memory holding. The orientation of the magnetic moment of the skyrmion does not require any power supply from the outside to have topological stability. A DRAM memory requires a data refresh, and an SRAM requires constant power input since an SRAM is volatile. A flash memory has a long data access time, and therefore cannot directly exchange data with the CPU.

Figure 49:
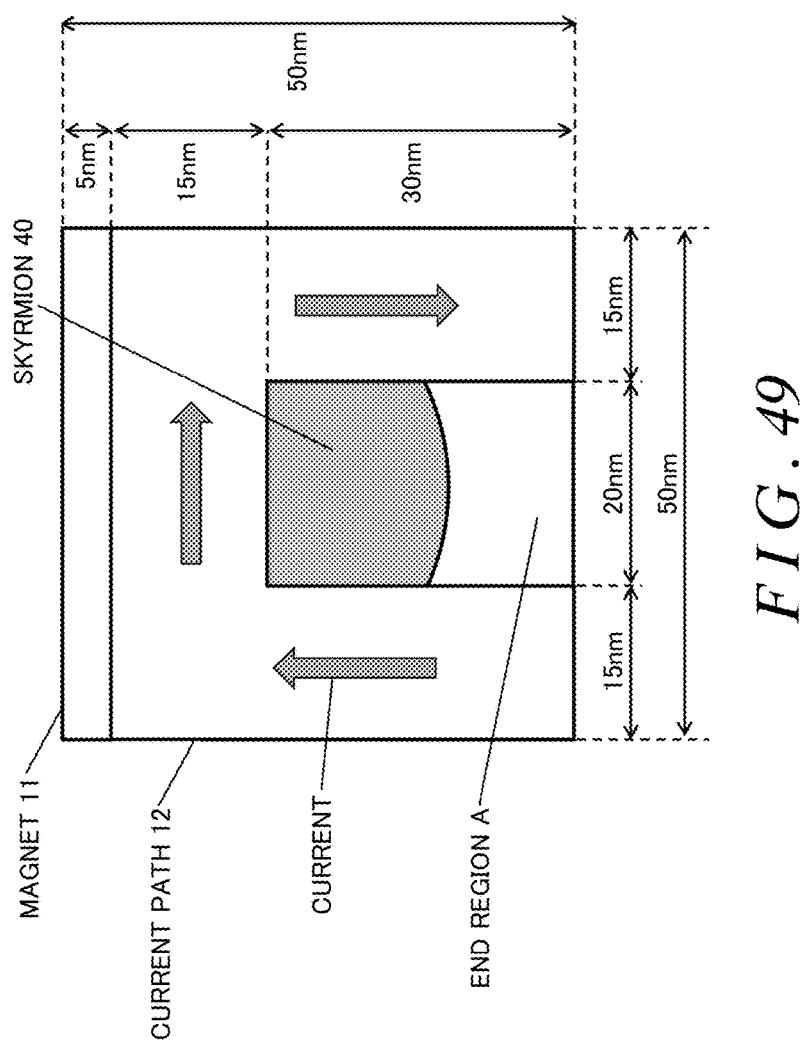
FIG. 49 shows an exemplary design of the skyrmion memory.

FIG. 49 shows the design size of a skyrmion memory 100 when the smallest machining dimension for LSI, which is the currently reached mass production technology, is 15 nm. FIG. 49 shows the size of the magnet 11 and the current path 12 as seen from the front surface. Since the smallest machining dimension for LSI is 15 nm, the line width of the current path 12 is 15 nm. The width of the end region A can be machined to 15 nm, but is given a margin to be 20 nm. As a result, the height of the end region A is 30 nm. The width Wm of the magnet 11 is 50 nm. The height hm of the magnet is the same as Wm. The diameter λ of the skyrmion 40 in a case where such a magnet size is selected is determined by the design rules shown below. With Wm being the width and hm being the height, the magnet size, with the skyrmion 40 of a diameter λ being generated, is as shown below.

$$2\lambda > Wm > \lambda/2$$

$$2\lambda > hm > \lambda/2$$

From the first expression, 2Wm>λ>Wm/2, and from the second expression, 2hm>λ>hm/2. Now, since Wm=hm=50 nm, the diameter of the skyrmion can be selected in a range of 100 nm>λ>25 nm. As shown in Non-Patent Document 1, the skyrmion diameter λ is 70 nm for FeGe and 18 nm for MnSi, for example. Accordingly, in a case where the smallest machining dimension for LSI, which is the currently reached mass production technology, is 15 nm, it is only necessary to select FeGe with a skyrmion diameter of 70 nm. If future LSI can realize a smallest machining dimension of 10 nm, then it will be possible to select a skyrmion diameter λ in a range of 67 nm>λ>17 nm. Here, it is only necessary to select MnSi with a skyrmion diameter λ of 18 nm. Accordingly, a magnet 11 having a suitable skyrmion diameter λ already exists for the current mass production technology and future mass production technology.

Figure 50:
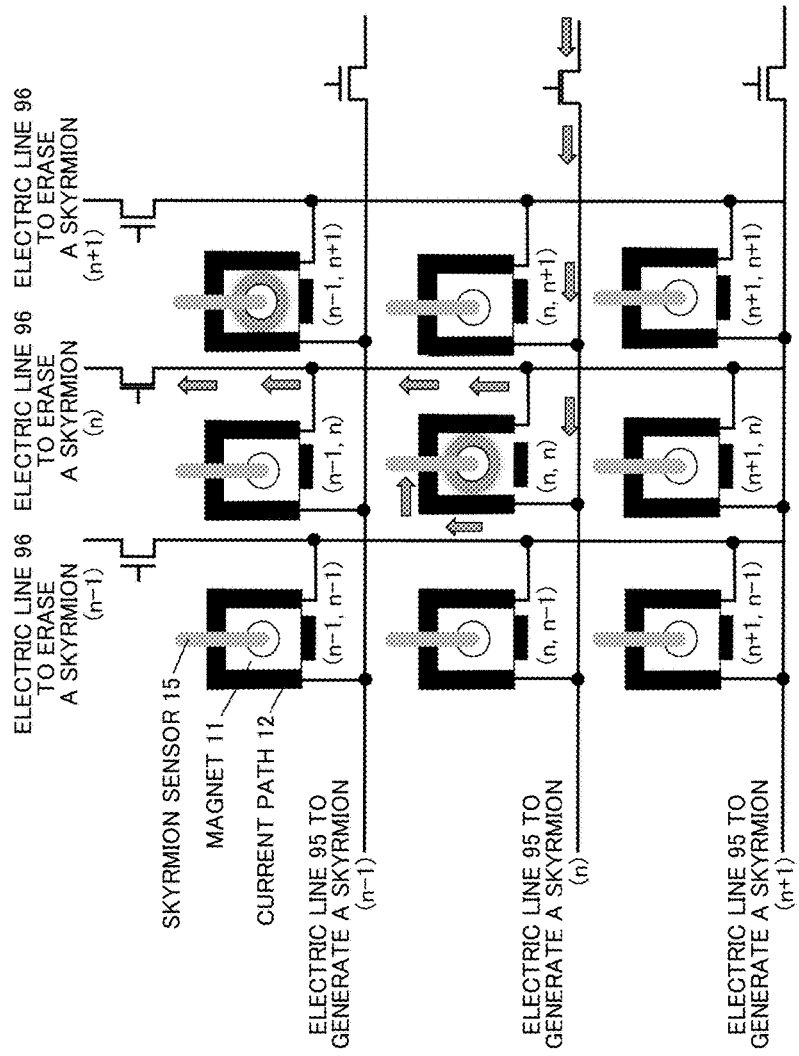
FIG. 50 shows an exemplary write circuit of the skyrmion memory-device 110.

FIG. 50 shows an exemplary write circuit of the skyrmion memory-device 110. Writing data to the skyrmion memory 100 refers to generating skyrmions 40 in the skyrmion memory 100. The skyrmion sensor 15 in the present example corresponds to the example of FIG. 3, and includes TMR elements. The circuit configuration of the skyrmion memory-device 110 is basically the same in a case where the configuration shown in FIG. 41 or FIG. 42 is used as the skyrmion sensor 15.

A plurality of the skyrmion memories 100 are connected to an electric line 95 to generate a skyrmion and an electric line 96 to erase a skyrmion. For example, each electric line 95 to generate a skyrmion(n) is connected to the skyrmion memory 100 of an n-th row and each electric line 96 to erase a skyrmion (n) is connected to the skyrmion memory 100 of an n-th column. Each line connected to a skyrmion memory 100 has a FET connected thereto. The FETs act as electrical switches to select each skyrmion memory 100 individually, by having a voltage applied to the gates thereof.

As an example, when generating a skyrmion 40 in a skyrmion memory 100(n, n), the FETs connected to the electric line 95 to generate a skyrmion(n) and the electric line 96 to erase a skyrmion(n) are turned ON. After this, when current flows from the electric line 95 to generate a skyrmion(n) toward the electric line 96 to erase a skyrmion (n), the skyrmion 40 is generated in the skyrmion memory 100(n, n). Furthermore, when generating a skyrmion 40 in the skyrmion memory 100(n−1, n+1), the FETs connected to the electric line 95 to generate a skyrmion(n−1) and the electric line 96 to erase a skyrmion(n+1) are turned ON. After this, when current flows from the electric line 95 to generate a skyrmion(n−1) toward the electric line 96 to erase a skyrmion(n+1), the skyrmion 40 is generated in the skyrmion memory 100(n−1, n+1).

Figure 51:
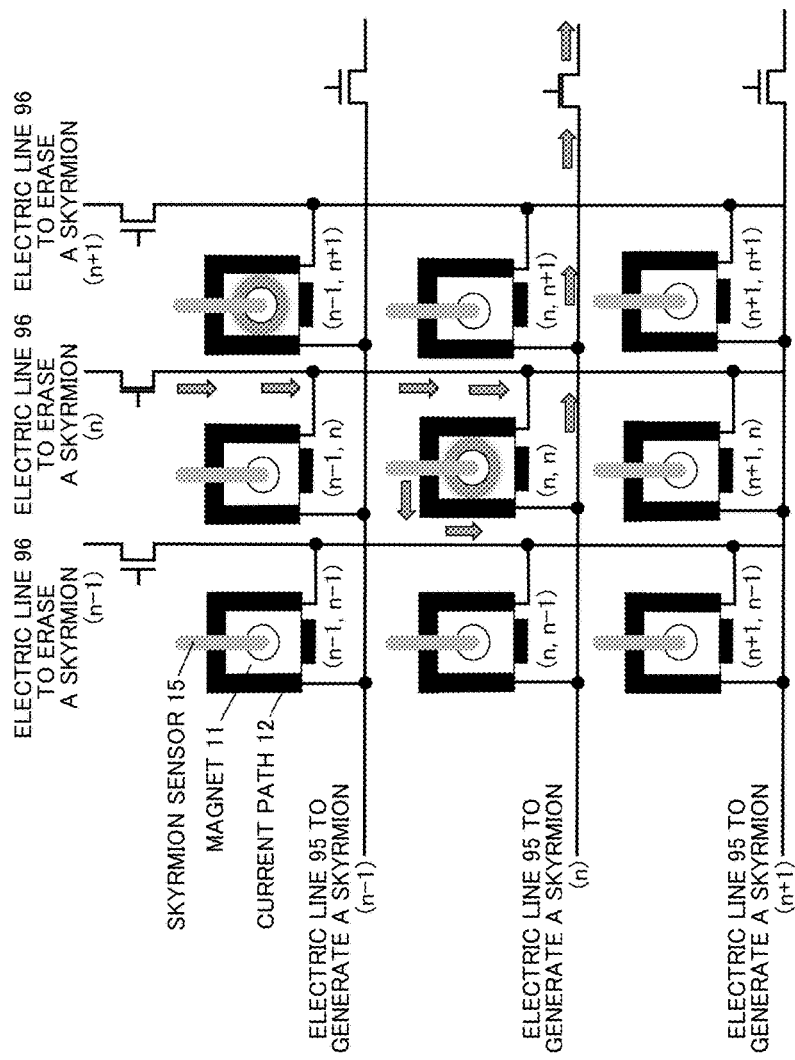
FIG. 51 shows an exemplary erasing circuit of the skyrmion memory-device 110.

FIG. 51 shows an exemplary erasing circuit of a skyrmion memory-device 110. Erasing data in a skyrmion memory 100 refers to erasing skyrmions 40 in the skyrmion memory 100. In the present example, the electric lines 95 to generate skyrmions and the electric lines 96 to erase skyrmions are connected to the skyrmion memories 100 with the same wiring as in the example of FIG. 50. In the same manner as when generating a skyrmion 40, a skyrmion memory 100 is selected by switching the FETs. By causing current to flow from an electric line 96 to erase a skyrmion toward an electric line 95 to generate a skyrmion, a skyrmion 40 is erased.

As an example, when erasing the skyrmion 40 in a skyrmion memory 100(*n, n*), the FETs connected to the electric line 95 to generate a skyrmion(n) and the electric line 96 to erase a skyrmion(n) are turned ON. After this, when current flows from the electric line 96 to erase a skyrmion(n) toward the electric line 95 to generate a skyrmion(n), the skyrmion 40 of the skyrmion memory 100(*n, n*) is erased. Furthermore, when erasing the skyrmion 40 in a skyrmion memory 100(*n*−1, n+1), the FETs connected to the electric line 95 to generate a skyrmion(n−1) and the electric line 96 to erase a skyrmion(n+1) are turned ON. After this, when current flows from the electric line 96 to erase a skyrmion(n+1) toward the electric line 95 to generate a skyrmion(n−1), the skyrmion 40 of the skyrmion memory 100(*n*−1, n+1) is erased.

Figure 52:
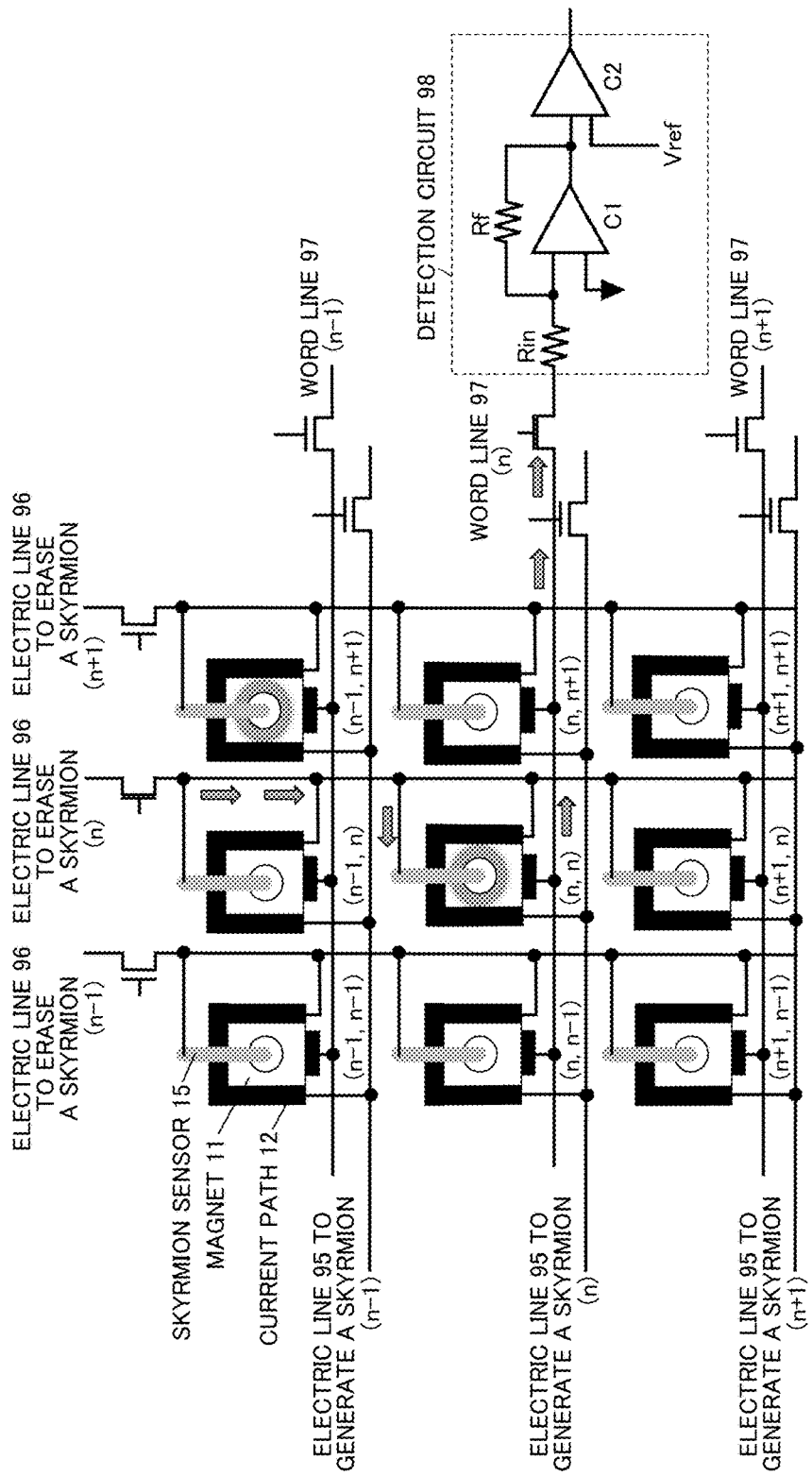
FIG. 52 shows an exemplary read circuit of the skyrmion memory-device 110.

FIG. 52 shows an exemplary read circuit of a skyrmion memory-device 110.

Reading data of a skyrmion memory 100 refers to detecting a skyrmion 40 of the skyrmion memory 100. When detecting a skyrmion 40, word lines 97 are used in addition to the electric lines 95 to generate skyrmions and the electric lines 96 to erase skyrmions.

The electric lines 96 to erase skyrmions are connected to the skyrmion sensor 15. The electric lines 96 to erase skyrmions cause current for detecting skyrmions to flow through the skyrmion sensor 15.

The word lines 97 are connected to an end portion of the magnet 11. The word lines 97 are connected to the electric lines 96 to erase skyrmions via the skyrmion sensor 15 and the magnet 11. The skyrmions 40 are detected by causing current to flow from the electric lines 96 to erase skyrmions to the word lines 97. The word lines 97 are connected to the plurality of skyrmion memories 100. For example, each word line 97(*n*) is connected to the skyrmion memory 100 in the n-th row. The word lines 97 are connected to detection circuits 98. By switching the FETs connected to the electric lines 96 to erase skyrmions and the word lines 97, the skyrmion memories 100 are selected. When detecting the skyrmions 40, the FETs connected to the electric line 95 to generate a skyrmion are turned OFF.

The detection circuits 98 amplify the voltage or current flowing through the word lines 97, and detect the presence or lack of skyrmions 40. Each detection circuit 98 includes an input resistor Rin, a feedback resistor Rf, an amplification circuit C1, and a voltage comparison circuit C2. The current input to the detection circuit 98 from the word line 97 is input to the amplification circuit C1 via the input resistor Rin. The feedback resistor Rf is provided in parallel with the amplification circuit C1. The amplification circuit C1 converts the current from the word line 97 into voltage and amplifies this voltage. The output voltage of the amplification circuit C1 and a reference voltage Vref are input to the voltage comparison circuit C2. The voltage comparison circuit C2 outputs "1" if the output voltage of the amplification circuit C1 is greater than the reference voltage Vref. On the other hand, the voltage comparison circuit C2 outputs "0" if the output voltage of the amplification circuit C1 is less than the reference voltage Vref.

As an example, when detecting the presence or lack of a skyrmion 40 in the skyrmion memory 100(*n, n*), the FETs connected to the electric line 96 to erase a skyrmion(n) and the word line 97(*n*) are turned ON. After this, when current flows to the electric line 96 to erase a skyrmion(n), the voltage value is changed due to the resistance corresponding to the presence or lack of a skyrmion 40. Furthermore, when detecting the presence or lack of a skyrmion 40 in the skyrmion memory 100(*n*−1, n+1), the FETs connected to the electric line 96 to erase a skyrmion(n+1) and the word line 97(*n*−1) are turned ON. After this, when current flows to the electric line 96 to erase a skyrmion(n+1), a current for detection flows in the skyrmion memory 100(*n*−1, n+1). This current is detected in the detection circuit 98 connected to the word line 97(*n*−1). In this way, it is possible to obtain data of "1" or "0" according to the presence of a skyrmion 40. In other words, the skyrmion memory 100 can read data according to the presence or lack of skyrmions 40.

In the above, as shown in FIGS. 50 to 52, the skyrmion memory-device 110 can select an arbitrary skyrmion memory 100 and generate, erase, and read a skyrmion 40. The FETs arranged around the skyrmion memories 100 and the amplification circuits C1 and voltage comparison circuits C2 of the detection circuits 98 are formed by CMOS devices. The plurality of skyrmion memories 100 are arranged in a planar shape. Furthermore, skyrmion memories 100 arranged in a planar shape may be layered. The plurality of skyrmion memories 100 can be layered using a manufacturing process with a small number of photomasks, as shown in FIGS. 45A to 45H. The skyrmion memories 100 can significantly increase the degree of integration by enabling layering.

Figure 53:
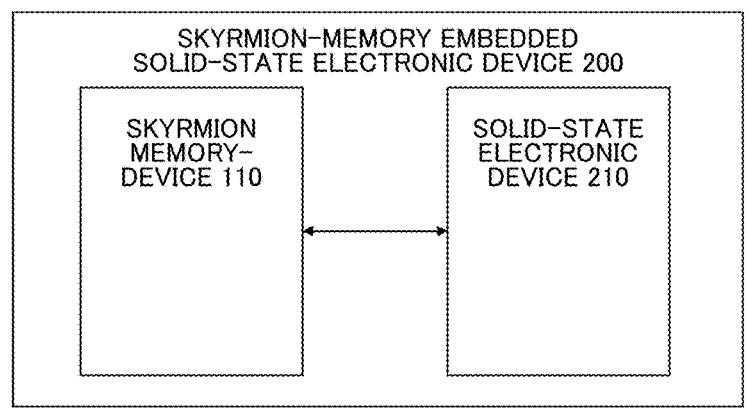
FIG. 53 shows an exemplary configuration of the skyrmion-memory embedded solid-state electronic device 200.

FIG. 53 is a schematic view of an exemplary configuration of a skyrmion-memory embedded solid-state electronic device 200. The skyrmion-memory embedded solid-state electronic device 200 includes the skyrmion memory-device 110 and a solid-state electronic device 210. The skyrmion memory-device 110 is the skyrmion memory-device 110 described in FIGS. 43 to 48. The solid-state electronic device 210 is a CMOS-LSI device, for example. The solid-state electronic device 210 has a function of at least one of writing data to the skyrmion memory-device 110 and reading data from the skyrmion memory-device 110.

Figure 54:
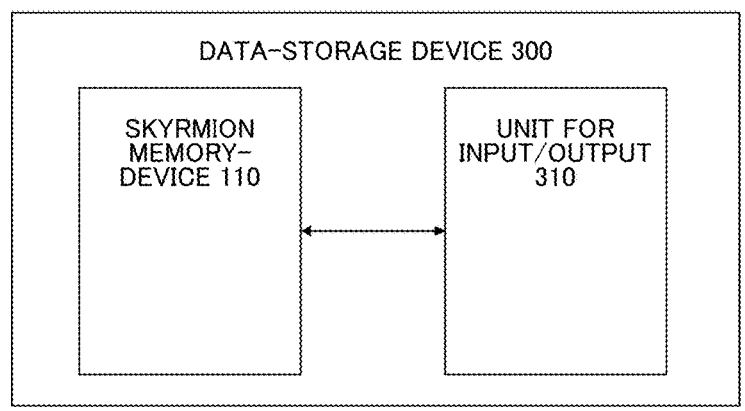
FIG. 54 shows an exemplary configuration of the data-storage device 300.

FIG. 54 is a schematic view of an exemplary configuration of a data-storage device 300. The data-storage device 300 includes the skyrmion memory-device 110 and a unit for input/output 310. The data-storage device 300 is a memory device such as a hard disk or a USB memory, for example. The skyrmion memory-device 110 is the skyrmion memory-device 110 described in FIGS. 43 to 48. The unit for input/output 310 has a function of at least one of writing data from the outside to the skyrmion memory-device 110 and outputting data to the outside by reading the data from the skyrmion memory-device 110.

Figure 55:
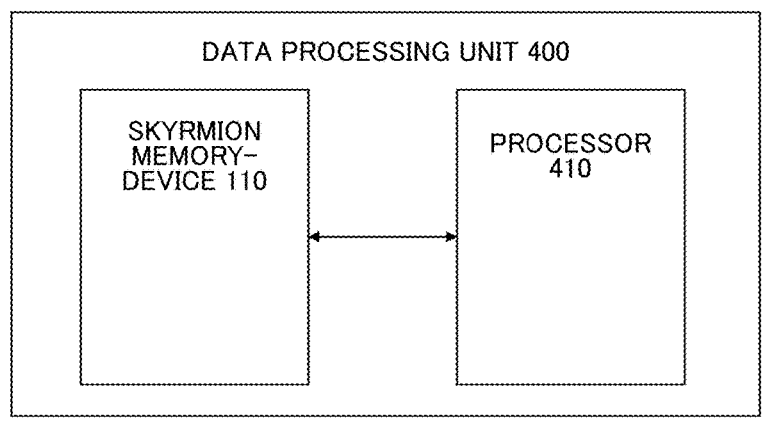
FIG. 55 shows an exemplary configuration of the data processing device 400.
Figure 57:
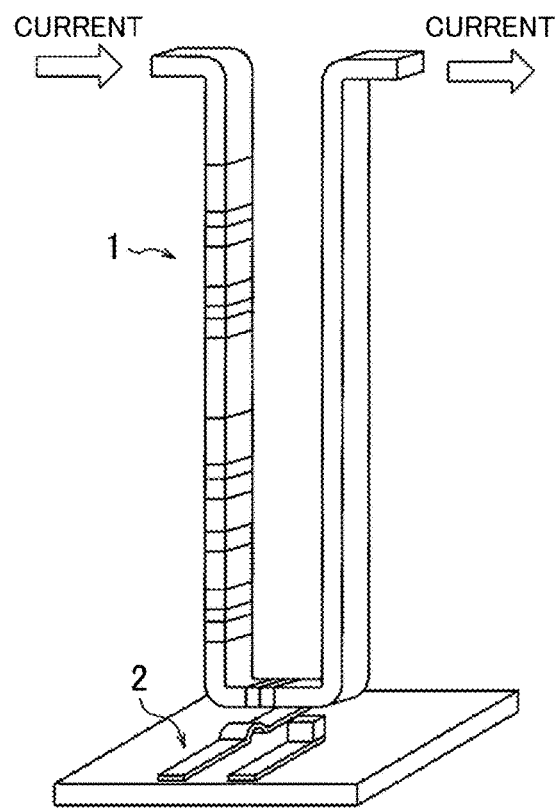
FIG. 57 is a schematic view of the principles for magnetic domain driving using current.

FIG. 55 is a schematic view of an exemplary configuration of a data processing device 400. The data processing device 400 includes the skyrmion memory-device 110 and a processor 410. The skyrmion memory-device 110 is the skyrmion memory-device 110 described in FIGS. 43 to 48. The processor 410 includes a digital circuit that processes a digital signal, for example. The processor 410 has a function of at least one of writing data to the skyrmion memory-device 110 and reading the data from the skyrmion memory-device 110.

FIG. 56 is a schematic view of an exemplary configuration of a communication device 500. The communication device 500 refers to a general device that has a function for communication with the outside, such as a mobile telephone, a smartphone, or a tablet terminal, for example. The communication device 500 may be portable, or may be non-portable. The communication device 500 includes the skyrmion memory-device 110 and a communicating unit 510.

The skyrmion memory-device 110 is the skyrmion memory-device 110 described in FIGS. 43 to 48. The communicating unit 510 has a function for communication with the outside of the communication device 500. The communicating unit 510 may have a wireless communication function, a wired communication function, or a function for both wireless and wired communication. The communicating unit 510 has at least one of a function for writing data received from the outside to the skyrmion memory-device 110, a function for transmitting data read from the skyrmion memory-device 110 to the outside, and a function for operating based on control information stored by the skyrmion memory-device 110.

As described above, it is possible to provide a magnetic element capable to generating, erasing, and detecting skyrmions 40 at high speed and with low power consumption, as well as a nonvolatile skyrmion memory 100, a skyrmion-memory embedded solid-state electronic device 200, a data-storage device 300, a data processing device 400, and a communication device that adopt this magnetic element.

LIST OF REFERENCE NUMERALS

1: magnetic register, 2: magnetic sensor, 10: magnetic element, 11: magnet, 12: current path, 13: position with a notch structure, 15: skyrmion sensor, 20: generating unit of the magnetic field, 30: unit for measuring, 31: power supply for measurement, 32: ammeter, 33: voltmeter, 40: skyrmion, 50: power supply for coil current, 60: insulation layer, 61: insulator, 65: protective layer 65 for the magnet, 66: protective film 66 for the magnet, 67: first via, 70: first layer for wiring, 71: first wiring, 72: protective film 72 for the first wiring, 73: second via, 75: second layer for wiring, 76: second wiring, 77: protective film 77 for the second wiring, 80: substrate, 85: resist, 90: CMOS-FET, 91: PMOS-FET, 92: NMOS-FET, 95: electric line to generate a skyrmion, 96: electric line to erase a skyrmion, 97: word line, 98: detection circuit, 99: FET, 100: skyrmion memory, 151: nonmagnetic thin film, 152: magnetic thin film, 153: first electrode, 154: second electrode, 155: third electrode, 156: fourth electrode, 200: skyrmion-memory embedded solid-state electronic device, 210: solid-state electronic device, 300: data-storage device, 310: unit for input/output, 400: data processing device, 410: processor, 500: communication device, 510: communicating unit

What is claimed is:

1. A magnetic element capable of generating and erasing a skyrmion, comprising:
    a magnet shaped as a thin layer and including a structure surrounded by a nonmagnetic material;
    a current path provided at least partially enclosing an end region including an end portion of the magnet, the current path being provided on one surface of the magnet; and
    a skyrmion sensor that detects the generation and erasing of the skyrmion, wherein
    with Wm being a width of the magnet and hm being a height of the magnet, a size of the magnet, with the skyrmion of a diameter $\lambda$ being generated, is such that $2\lambda > Wm > \lambda/2$ and $2\lambda > hm > \lambda/2$.

2. The magnetic element according to claim 1, wherein
    with W being a width of the end region in a direction parallel to the end portion of the magnet and h being a height of the end region in a direction perpendicular to the end portion of the magnet, the end region is such that $\lambda \geq W > \lambda/4$ and $2\lambda > h > \lambda/2$.

3. The magnetic element according to claim 2, wherein
    with W being the width of the end region in the direction parallel to the end portion of the magnet, h being the height of the end region in the direction perpendicular to the end portion of the magnet, and d being a minimum width of a space in the direction parallel to the end portion of the magnet between the current path and another end portion of the magnet, the end region is such that $\lambda \geq W > \lambda/4$ and $2\lambda > h > \lambda/2$, and d is such that $0.4\lambda > d \geq 0.2\lambda$.

4. The magnetic element according to claim 1 capable of generating and erasing the skyrmion, comprising:
    the magnet shaped as a thin layer and including the structure surrounded by the nonmagnetic material;
    a first current path provided at least partially enclosing a first end region including the end portion of the magnet, the first current path being provided on the one surface of the magnet;
    a second current path provided at least partially enclosing a second end region that is within the first end region and includes the end portion of the magnet, the second current path being provided on the one surface of the magnet; and
    a skyrmion sensor that detects the generation and erasing of the skyrmion, wherein
    with Wm being a width of the magnet and hm being a height of the magnet, a size of the magnet, with the skyrmion of a diameter $\lambda$ being generated, is such that $2\lambda > Wm > \lambda/2$ and $2\lambda > hm > \lambda/2$,
    with W1 being a width of the first end region in a direction parallel to the end portion of the magnet and h1 being a height of the first end region in a direction perpendicular to the end portion of the magnet, the first end region is such that $\lambda \geq W1 > \lambda/4$ and $2\lambda > h1 > \lambda/26$, and
    with W2 being a width of the second end region in a direction parallel to the end portion of the magnet and h2 being a height of the second end region in a direction perpendicular to the end portion of the magnet, the second end region is such that W2=W1 and h2=W1.

5. The magnetic element according to claim 1, wherein the magnetic element has a multilayered structure layered in a thickness direction.

6. The magnetic element according to claim 1, wherein the magnet exhibits at least a skyrmion crystal phase generating the skyrmion and a ferromagnetic phase, according to a magnetic field applied thereto.

7. The magnetic element according to claim 1, wherein the magnet is made from one of a chiral magnet, a dipole magnet, a frustrated magnet, and a layered structure of a magnetic material and a nonmagnetic material.

8. The magnetic element according to claim 1, wherein the skyrmion sensor includes, on the one surface of the magnet, a layered structure of a nonmagnetic insulating thin film contacting a front surface of the magnet and a magnetic metal film provided on the nonmagnetic insulating thin film, and
    the layered structure has a resistance value that changes according to a presence or lack of the skyrmion.

9. A skyrmion memory comprising:
    the magnetic element according to claim 1;
    a generating unit of a magnetic field that is provided facing the one surface of the magnet and applies a first magnetic field to the magnet from a first direction;

the current path that is provided at least partially enclosing the end region of the magnet including the end portion; and a unit for measuring that is connected to the skyrmion sensor and detects a presence or lack of the skyrmion based on a detection result of the skyrmion sensor.

10. The skyrmion memory according to claim 9, wherein the current path is capable of applying a pulse to generate a skyrmion and a pulse to erase a skyrmion at the end region of the magnet.

11. The skyrmion memory according to claim 10, wherein a direction of the pulse to generate a skyrmion differs from a direction of the pulse to erase a skyrmion.

12. The skyrmion memory according to claim 10 or 11, wherein with J being a magnitude of exchange interaction energy of the magnet, a magnetic field strength of the end region becomes less than 0.015 J due to the pulse to generate a skyrmion and becomes greater than 0.04 J due to the pulse to erase a skyrmion.

13. A skyrmion memory-device comprising:

a plurality of the skyrmion memories according to claim 10 configured as a single storage unit memory;

an electric line to generate a skyrmion connected to the plurality of skyrmion memories to generate skyrmions of the plurality of skyrmion memories;

an electric line to erase a skyrmion connected to the plurality of skyrmion memories to erase skyrmions of the plurality of skyrmion memories;

a word line that detects the presence or lack of skyrmions;

a field effect transistor that selects a skyrmion memory for the electric line to generate a skyrmion, the electric line to erase a skyrmion, and the word line; and a detection circuit that amplifies a voltage or the current flowing through the word line and detects the presence or lack of skyrmions.

14. A data processing device having the skyrmion memory-device according to claim 13 mounted thereon.

15. A skyrmion-memory embedded solid-state electronic device having the skyrmion memory-device according to claim 13 and the solid-state electronic device formed in the same chip.

16. A data-storage device having the skyrmion memory-device according to claim 13 mounted thereon.

17. A data communication device having the skyrmion memory-device according to claim 13 mounted thereon.

18. The magnetic element according to claim 1, wherein the current path is provided at least partially enclosing at least three sides of the end region.

19. A magnetic element capable of generating and erasing a skyrmion, comprising:

a magnet shaped as a thin layer and including a structure surrounded by a nonmagnetic material;

a current path provided partially enclosing an end region including an end portion of the magnet, the current path being provided on one surface of the magnet; and a skyrmion sensor that detects the generation and erasing of the skyrmion in the end region, wherein a conductive line of material provides the current path, and forms substantially a U shape or substantially a V shape that partially encloses the end region, wherein the U shape or the V shape is entirely on only one side of the magnet and parallel to a plane in which the thin layer extends.

* * * * *